United States Patent
Ware et al.

(10) Patent No.: US 8,278,964 B2
(45) Date of Patent: **\*Oct. 2, 2012**

(54) METHOD AND APPARATUS FOR TEST AND CHARACTERIZATION OF SEMICONDUCTOR COMPONENTS

(75) Inventors: Frederick Ware, Los Altos Hills, CA (US); Scott Best, Palo Alto, CA (US); Timothy Chang, Saratoga, CA (US); Richard Perego, San Jose, CA (US); Ely Tsern, Los Altos, CA (US); Jeff Mitchell, Santa Clara, CA (US)

(73) Assignee: Rambus Inc., Sunnyvale, CA (US)

( * ) Notice: Subject to any disclaimer, the term of this patent is extended or adjusted under 35 U.S.C. 154(b) by 27 days.

This patent is subject to a terminal disclaimer.

(21) Appl. No.: 12/554,840

(22) Filed: Sep. 4, 2009

(65) Prior Publication Data

US 2009/0322370 A1   Dec. 31, 2009

Related U.S. Application Data

(62) Division of application No. 10/768,443, filed on Jan. 30, 2004, now Pat. No. 7,592,824.

(60) Provisional application No. 60/450,007, filed on Feb. 26, 2003.

(51) Int. Cl.
*G01R 31/28* (2006.01)

(52) U.S. Cl. .............. 324/763.01; 324/500; 324/750.3

(58) Field of Classification Search .......... 324/750–763, 324/158.1; 340/572.1
See application file for complete search history.

(56) References Cited

U.S. PATENT DOCUMENTS

| | | | |
|---|---|---|---|
| 6,477,674 B1 | 11/2002 | Bates et al. | 714/738 |
| 6,631,486 B1 | 10/2003 | Komatsu | 714/724 |
| 6,720,194 B1 | 4/2004 | Miller et al. | 438/14 |
| 6,724,030 B2 | 4/2004 | Hummler et al. | 257/301 |
| 7,592,824 B2* | 9/2009 | Ware et al. | 324/750.3 |
| 2002/0174153 A1* | 11/2002 | O'Toole et al. | 708/252 |
| 2003/0068989 A1 | 4/2003 | Harris et al. | 455/115 |
| 2003/0145259 A1 | 7/2003 | Kashiwakura | 714/712 |
| 2008/0049819 A1* | 2/2008 | Garlett et al. | 375/226 |

* cited by examiner

*Primary Examiner* — Jermele M Hollington
*Assistant Examiner* — Trung Nguyen

(57) ABSTRACT

A method and apparatus for testing and characterizing circuits is provided. In one embodiment, a high-speed interface of a semiconductor component includes high-speed test circuitry. The high-speed test circuitry obviates the need for an external high-speed testing system for testing and characterization. In one embodiment, the high-speed test circuitry includes a test pattern generation circuit, and various differential comparators to compare low bandwidth reference signals with interface signals during testing and characterization. In one embodiment, an interface that includes the test circuitry can test itself or another interface. In one embodiment, a timing reference signal decouples the individual parameters of two interfaces testing each other to avoid any errors introduced by the combination of individual interface circuit parameters, such as receiver parameters and transmitter parameters. The testing can be performed at the wafer stage, at the component stage, and in a system.

20 Claims, 50 Drawing Sheets

$I_{OL}$ current calibration to reference value $I_{OL}$ current calibration to reference value with analog control voltage $V_{OL}$ voltage calibration to reference value Termination calibration to reference value $I_{OL}$ current calibration to reference value with predriver segments "X" = "R" or "T"
"xxxx" = "receive" or "transmit"

Receive or transmit clock alignment using PLL (phase-locked-loop)

"X" = "R" or "T"
"xxxx" = "receive" or "transmit"

Transmitter clock aligner with output register/predriver/driver loop compensation Receive or transmit clock alignment using PLL and adjustable DLL Adjustable termination with calibration to reference value Adjustable $I_{OL}$ current with calibration to reference value $t_S + t_Q = k1$  $t_V - t_H = k2$  transmitter => receiver $t_S + t_Q = k1$  $t_V - t_H = k2$  transmitter => receiver
$t_{S1} + t_Q = k3$  $t_V - t_{H1} = k4$  transmitter => sampler 1
$t_S + t_{Q1} = k7$  $t_{V1} - t_H = k8$  sampler 1 => receiver

US 8,278,964 B2

METHOD AND APPARATUS FOR TEST AND CHARACTERIZATION OF SEMICONDUCTOR COMPONENTS

PRIORITY CLAIM

The present application is a divisional of U.S. patent application Ser. No. 10/768,443, entitled, "METHOD AND APPARATUS FOR TEST AND CHARACTERIZATION OF SEMICONDUCTOR COMPONENTS," which application was filed on Jan. 30, 2004 (now U.S. Pat. No. 7,592,824), which claims priority to U.S. Provisional Patent Application Ser. No. 60/450,007, entitled, "METHOD AND APPARATUS FOR TEST AND CHARACTERIZATION OF SEMICONDUCTOR COMPONENTS," which application was filed on Feb. 26, 2003.

FIELD OF THE INVENTION

The present invention relates to testing and characterization of electronic circuits implemented in semiconductor components.

BACKGROUND OF INVENTION

Modern semiconductor circuit components are manufactured by first placing electronic circuit components on semiconductor wafers and then packaging different circuits into circuit component packages. Packages include semiconductor "chips" that are placed in systems with many other chips to create a product such as a personal computer or a network router. At various stages in the manufacturing process, it is important to verify that the components function properly and meet specifications. Testing a component includes, for example, sending a pattern of bits to a component and verifying that the component receives and interprets the pattern correctly. Testing can also include component characterization, which establishes or verifies a set of operating parameters for the component. For example, for a component that performs a binary signaling protocol, it is necessary to guarantee that the component will interpret voltages in certain ranges as ones or zeroes. Typically, components are tested with a specialized piece of equipment called a test system or tester.

Recent improvements in the ability of components to produce a greater range of signaling bandwidths and to operate at higher frequencies have increased the cost and difficulty of testing and characterizing components. In order to test and characterize components, a test system must operate at a frequency at least as high as the operating frequency of the component under test. The test system requires some tester guard band, which is a margin around the tested values required to guarantee the tested values. In the past, it was relatively easy to produce test systems that were faster than the tested components. That is not the case now, as even mass-produced metal oxide semiconductor ("MOS") components achieve ever greater speeds. High-speed test systems that are capable of exceeding the speeds of the fastest components today are very expensive. As component designers produce faster and faster component designs, it becomes more problematic for potential manufacturers to produce the designs because of the required investment in faster test systems.

FIG. 1 is a block diagram of a prior art high-speed interface 100 of a component A. The high-speed interface 100 is coupled to an interconnect 108, which is an electrical conductor or conductors. The high-speed interface 100 includes a receiver block 104, a transmitter block 102, and a termination block 106. The receiver 104 includes a voltage discriminator element 132, a register element 130, and a receive clock aligner element 128. The voltage discriminator element 132 is a differential comparator that compares the $V_P$ (high logic value) and $V_N$ (low logic value) voltages values on interconnect 108 to determine what symbol is present (e.g., a "1" or a "0"). The register element 130 is a time discriminator that samples the output of the voltage discriminator element 132 on the rising edge of the CLKRA signal (the receive clock signal of component A), stores it, and drives it as the $R_A$ signal (receive signal of component A), to be used by other circuits on the component A. The receive clock aligner element 128 creates the CLKRA signal from the $CLK_{RREF}$ (receive clock reference) reference signal. The receive clock aligner element 128 is typically a phase locked loop ("PLL") or a delay locked loop ("DLL") circuit.

The termination block 106 includes two load devices 134a and 134b, coupled to interconnect 108 with one terminal and to the $V_T$ supply with the other terminal. A terminal of load device 134a is coupled to a first signal line, in interconnect 108, that provides a $V_P$ voltage value and a terminal of load device 134b is coupled to a second signal line, in interconnect 108, that provides a $V_N$ voltage value. The termination block 106 further includes a control element 136, which adjusts the resistive value RT of the load devices 134 to match an external reference resistance, RREF.

The transmitter block 102 includes a predriver element 118, two differential driver elements 120 and 122, two current source elements 124 and 126, a current control element 114, a register element 116, and a transmit clock aligner element 112. The register element 116 is a time drive element that samples the TA signal (transmit signal from other circuits on component A) and drives it on the rising edge of the CLKTA signal. The transmit clock aligner element 112 creates the CLKTA signal from the $CLK_{TREF}$ reference signal. The transmit clock aligner element 112 is typically a phase locked loop ("PLL") or a delay locked loop ("DLL") circuit. The output of the register element 116 connects to the predriver element 118, which connects to the differential driver elements 120 and 122. Each driver element 120 and 122 is an open drain transistor, and is connected in series with one of the current source elements 124 and 126, respectively. The current control element 114 maintains a sink current of $I_{OL}$ (output low current) in the current source elements using an external reference value IREF. When the transmitter 102 drives a bit, one of the two driver elements 120 and 122 is on, and the other is off.

In an alternate embodiment, the two current source elements 124 and 126 could be merged into a single current source element, with one terminal connecting to the low supply voltage (ground) and the other terminal connecting to the source terminals of the two driver elements 120 and 122. This will be equivalent to the circuit shown in transmitter block 102 since only one of the two driver elements 120 and 122 may be on at any time.

FIG. 2 shows a prior art test system 202 used to characterize and test the transmitter 102 and the receiver 104 of component A. Typically, component A will be mounted on a load board 222, which is a printed circuit board. The testing system 202 and the load board 222 approximately duplicate the environment seen by component A during normal operation. The load board 222 has an interconnect 212 that couples the interface 100 of the component A to the high-speed pin electronics 204 of test system 202. The interconnect 212 has a characteristic impedance ZO which may be the same as, or different from, that of the manufactured system interconnect 108. The interconnect 108 is terminated on one end by termination 214 in high-speed pin electronics 204, and on the other end by termination 106. The high-speed pin electronics 204 include timing circuitry 206 to adjust the drive point and the sample point of signals. The high-speed pin electronics 204 further include voltage/current force/sense circuitry 208 to force and sense voltage values and to force and sense current values. The high-speed pin electronics 204 also include pattern generation circuitry 210 for storing, generating, and comparing test patterns. Typically, the accuracy and resolution of circuitry 206, circuitry 208 and circuitry 210 are very high in order to minimize the uncertainty due to measurement error. As a result, the cost of pin electronic 204 is also very high. This is particularly true in the case in which the component A has high-speed signals, each requiring its own set of pin electronics. The test system 202 must simultaneously provide a high signaling rate, precise timing control, and precise voltage/current control for each signal to be tested.

The test system 202 further includes circuitry that generates reference signals 110 used by component A. The reference signals 110 include IREF, RREF, CLKRREF, and CLKTREF. These reference signals are typically shared across the entire component A. These reference signals 110 often do not need the simultaneous combination of high-speed, voltage/current accuracy and timing accuracy. Therefore, the circuitry necessary to produce the reference signals is relatively easier and cheaper to produce compared to the high-speed pin electronics 204. For example, the RREF signal will typically shift through a small set of discrete values during testing. The IREF signal will typically shift through some range of direct current ("DC") values during testing. The CLKRREF and CLKTREF signals provide a frequency and phase reference for the component A. The clock frequency will typically shift through a small set of discrete values during testing. The clock phase will typically shift through some range of values during testing. Typically, a component will utilize frequency multiplication, so that the required signaling rate of the CLKRREF and CLKTREF signals is much lower than the signaling rate of the high-speed signals.

Another disadvantage of prior art test systems, such as the high-speed test system 202, is that they cannot be used at every stage of the manufacturing process. The result is more defective components being passed to later stages of the manufacturing process. In a typical manufacturing process, there are at least three possible testing stages: 1) component wafer testing; 2) component package testing; and 3) in-system testing. Component wafer testing determines which components are acceptable to be packaged. Component package testing determines which components are acceptable to be used in a system. In-system testing determines which systems work properly. Usually, components are tested twice, once at the wafer level before packaging, and again after packaging. High-speed testing, however, is only performed after packaging when packages can be placed on a load board such as load board 222. All high-speed testing must be performed with a high-speed test system, such as high-speed test system 202. Typically a high-speed test system performs the most exhaustive testing during the component package test. It is usually not possible to perform component wafer testing at full speed. The final in-system test can be performed at full speed, but must use nominal parameter values because of the difficulty of probing high-speed interconnects within an operating system.

There is a need for a method and apparatus for testing and characterizing high-speed components that does not require an expensive high-speed test system. There is also a need for a method and apparatus for providing more uniform testing at each stage of the manufacturing process.

BRIEF DESCRIPTION OF THE DRAWING

The present invention is illustrated by way of example, and not by way of limitation, in the figures of the accompanying drawings in which.

DETAILED DESCRIPTION

A method and apparatus is described for testing and characterizing semiconductor circuit components. A substantial part of the testing and characterization is performed by one component on itself or on another component. For example, a test system is not required to generate high accuracy and high-resolution signals for the test and characterization process. In one embodiment, a high-speed component interface includes additional circuitry to perform testing of the high-speed component. For example, the additional circuitry includes pattern generation, pattern memory, and comparison circuitry. A Rambus® XIO interface cell includes pattern storage and comparison logic. Also, a Rambus® ASIC cell ("RRAC") interface includes pattern generation logic and pattern comparison logic. Various embodiments of component interface circuitry perform all normal testing and characterization on the interface itself, or on a similar interface, reducing the performance requirements of an external test system significantly. For example, an interface capable of very high data transfer rates, such as 3 GHz or greater normally requires a testing system with pin electronics capable of the same transfer rate. With the embodiments described, the external test system data transfer rates may be reduced by a factor of four or eight to 800 MHz or 400 MHz. This significantly reduces component testing costs. It also increases the number of test systems that are available for testing, since the highest speed testers have only limited availability. The embodiments also permit the same high-speed testing and characterization to be performed at each stage in the manufacturing process: at the wafer stage, at the package stage, and at the system stage. This further reduces manufacturing costs because components with out-of-specification interface parameters will be rejected at the earliest possible stage of manufacture.

The interface embodiment described may reside on one or multiple components. A component may test itself using test circuitry to be described below. Components may also test each other using test circuitry in their respective interfaces. Respective interfaces may be coupled through an interconnect for the specific purpose of testing one another. Alternatively, interfaces that are coupled to each other within a system for normal system operation, such as a memory component and a memory controller component, can test each other within the system through their usual system interconnect.

Figure 1:
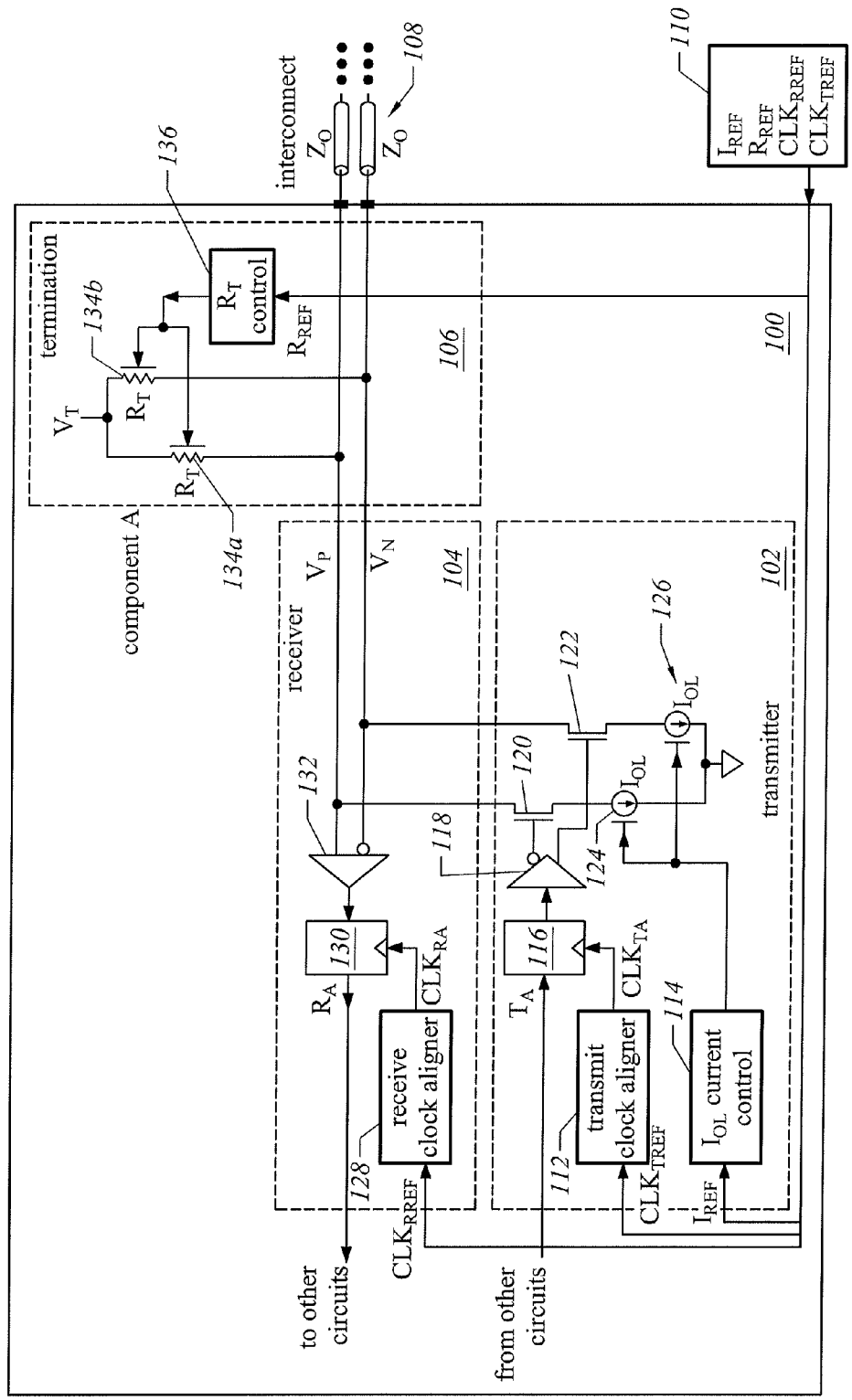
FIG. 1 is a block diagram of a prior art high-speed interface.
Figure 2:
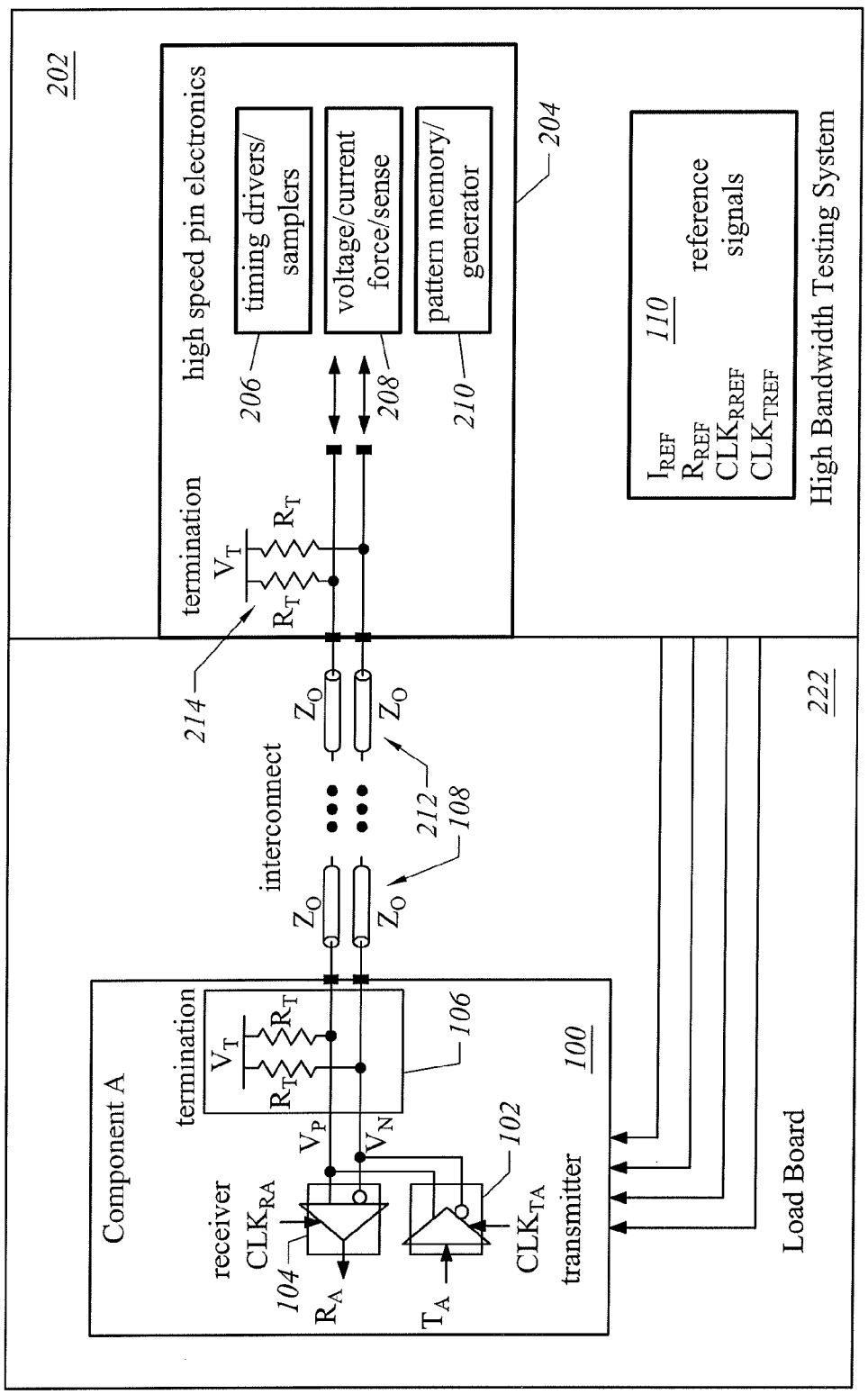
FIG. 2 is a block diagram of a prior art high-speed test system.
Figure 3:
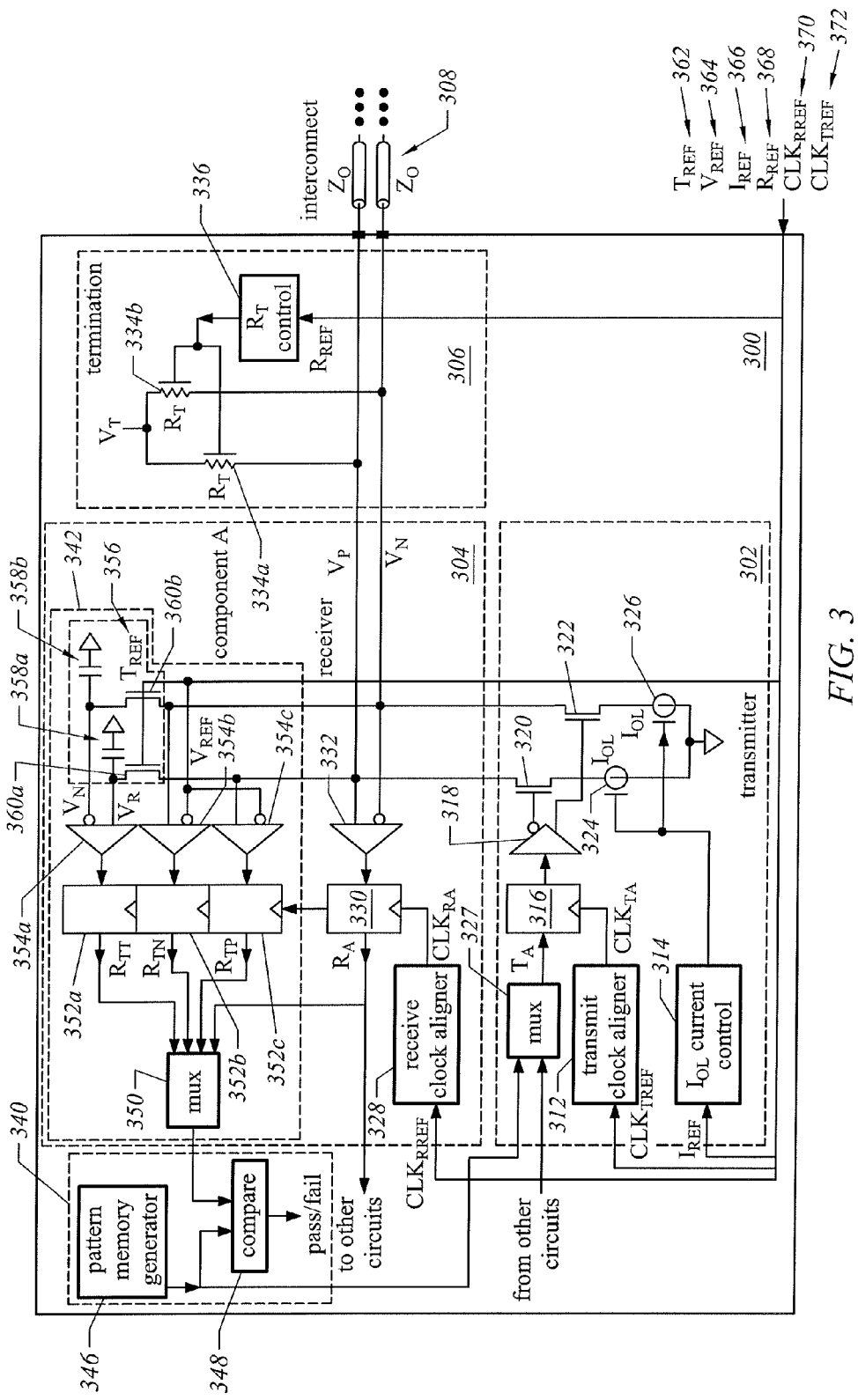
FIG. 3 is a block diagram of an embodiment of a high-speed component interface.

FIG. 3 is a block diagram of an embodiment of a high-speed component interface 300. The high-speed interface 300 is part of a component A and includes circuitry that facilitates communication with the "outside world" external to the component A via high-speed digital signaling. In one embodiment, a system including the component A is built with discrete integrated circuit components. In one embodiment, the digital signal travels between the interface 300 and another interface external to the interface 300 using the interconnect 308. In one embodiment, the digital signaling is differential signaling as known in the art, and the interconnect 308 is two conductive media. In other embodiments, other known signaling schemes, such as single-ended signaling, are used.

Information in the signal is carried as voltage values on the interconnect 308. The voltage values are restricted to two voltage ranges, because there are two possible symbols (bits with logic values of "1" or "0") in this example. A voltage value within a first voltage range on interconnect 308 represents a bit having a logical 1 value or high value; while, a different voltage value within a second voltage range represents a bit having a logical 0 value or low value. A bit is driven for a specific length of time called a bit interval. The characteristic impedance of each interconnect 308 is $Z_O$. In order to maximize the signaling rate of the system, a termination element, such as the termination elements 334a and 334b of termination block 306, are present at each end of interconnect 308. The resistive value $R_T$ of the termination elements 334a and 334b is approximately the same as the real part of the characteristic impedance $Z_O$ of the interconnect 308. One end of each termination element 334a and 334b connects to an interconnect 308, and the other connects to a power supply that sources a termination voltage of $V_T$ volts.

The interface 300 includes a transmitter 302 and a receiver 304. The high-speed signal is bidirectional. That is, information may travel from component A to another component B or from another component B to component A. In this example, the bit intervals of the component A transmitter may not overlap the bit intervals of the component B transmitter (including the effects of the propagation delay of signal wavefronts traveling on the interconnect 308). The transmitter 302 uses an internal timing signal, $CLK_{T4}$, to frame its bit interval. An event on the timing signal determines when a new bit is to be driven.

Alternate embodiments might permit the bit intervals of the component A transmitter to overlap the bit intervals of the component B transmitter. This is called simultaneous bidirectional signaling. The testing features that have been added to interface 300 could also be added to an interface that permitted simultaneous bidirectional signaling.

The transmitter 302 further includes a predriver element 318, two differential driver elements 320 and 322, two current source elements 324 and 326, a current control element 314, a register element 316, and a transmit clock aligner element 312. In one embodiment, the register element 316 is a register cell that samples the $T_A$ signal (transmit signal from other circuits on component A) and drives it on the rising edge of the $CLK_{T4}$ signal. The transmit clock aligner element 312 creates the $CLK_{T4}$ signal from the $CLK_{TREF}$ reference signal. In various embodiments, the transmit clock aligner element 312 is a phase lock loop ("PLL") or a delay lock loop ("DLL") circuit. The output of the register element 316 connects to the predriver element 318, which connects to the differential driver elements 320 and 322. Each driver element 320 and 322 is an open drain transistor, and is connected in series with one of the current source elements 324 and 326, respectively. The current control element 314 maintains a sink current of $I_{OL}$ (output low current) in the current source elements using an external reference value $I_{REF}$.

In an alternate embodiment, the two current source elements 324 and 326 could be merged into a single current source element, with one terminal connecting to the low supply voltage (ground) and the other terminal connecting to the source terminals of the two driver elements 320 and 322. This will be equivalent to the circuit shown in transmitter 302 since only one of the two driver elements 320 and 322 may be on at any time.

When the transmitter 302 drives a bit, one of the two driver elements 320 and 322 is on, and the other is off. The output voltage of the driver element that is off will remain high at the termination value, and the output voltage of the driver element that is on will assume a lower voltage. As a result, high output voltage $V_{OH}$ (high logic value) and low output voltage $V_{OL}$ (low logic value) on interconnect 308 are:

$$V_{OH} = V_T \quad \text{Equation 1}$$

$$V_{OL} = V_T - I_{OL} * R_T/2 \quad \text{Equation 2}$$

There is a "$R_T/2$" factor in Equation 2 reflects the fact that the interconnect 308 is terminated at both ends in a termination load of $R_T$ which is presumed to match $Z_O$, the characteristic impedance of interconnect 308. The specification for the transmitter circuit requires that the $V_P$ and $V_N$ voltage values remain above $V_{OL,MAX}$ or below $V_{OH,MIN}$ for a time $t_{Q,MAX}$ after the rising edge of $CLK_{TREF}$ until a time $t_{V,MIN}$ after the next rising edge of CLKTREF. The width of the $(t_{Q,MAX} - t_{V,MIN})$ window depends upon three factors in this example. The first factor is the width of the $(t_{Q-T,MAX} - t_{V-T,MIN})$ window of the $T_A$ register relative to the $CLK_{T4}$ rising edge. The second factor is the range of propagation delay $(t_{PROP-T,MAX} - t_{PROP-T,MIN})$ through the predriver element 318 and driver elements 320 and 322. The third factor is the range of timing skew $(t_{SKEW-T,MAX} - t_{SKEW-T,MIN})$ between the $CLK_{TREF}$ and $CLK_{T4}$ signals from the transmit clock aligner element 312. The following equation can be written:

$$(t_{Q,MAX} - t_{V,MIN}) = (t_{Q-T,MAX} - t_{V-T,MIN}) + (t_{PROP-T,MAX} - t_{PROP-T,MIN}) + (t_{SKEW-T,MAX} - t_{SKEW-T,MIN}) \quad \text{Equation 3}$$

Of the three factors, the width of the $(t_{Q-T,MAX} - t_{V-T,MIN})$ window of the $T_A$ register relative to the $CLK_{T4}$ rising edge will usually be the smallest, and the range of timing skew $(t_{SKEW-T,MAX} - t_{SKEW-T,MIN})$ between the $CLK_{TREF}$ and $CLK_{T4}$ signals will usually be the largest. The three factors have a timing range because of variations of manufacturing process (between different components) and variations in temperature and supply voltages during system operation.

The transmitter 302 elements described so far are similar to known transmitter elements. The transmitter 302 further includes a multiplexer 327. The multiplexer 327 selects data from one of two sources to be transmitted via the $T_A$ signal. Specifically, multiplexer 327 selects data from other circuits to be transmitted in normal operation. Alternatively, the multiplexer 327 selects a test pattern set from a test circuit 340, as described in more detail below.

The receiver 304 includes a voltage discriminator element 332, a register element 330, and a receive clock aligner element 328. In one embodiment, the voltage discriminator element 332 is a differential comparator that compares the voltage values on the $V_P$ (positive voltage) and $V_N$ (negative voltage) interconnects to determine what symbol is present (e.g., a "1" or a "0"). The register element 330 is a time discriminator element that samples the output of the voltage discriminator element 332 on the rising edge of the $CLK_{RA}$ signal (the receive clock signal of component A), stores it, and drives it as the $R_A$ signal (receive signal of component A), to be used by other circuits on the component A. The receive clock aligner element 328 creates the $CLK_{RA}$ signal from the $CLK_{RREF}$ (receive clock reference) reference signal. In various embodiments, the receive clock aligner element 328 is a phase lock loop ("PLL") or a delay lock loop ("DLL") circuit.

Typical specification for the receiver 304 requires that the $V_P$ and $V_N$ voltage values remain above $V_{IL,MAX}$ or below $V_{IH,MIN}$ for a time $t_{S,MIN}$ (minimum setup time) before and a time $t_{H,MIN}$ (minimum hold time) after the rising edge of $CLK_{RREF}$. The width of the $(t_{S,MIN} + t_{H,MIN})$ window depends upon three factors in this example. The first factor is the width of the $(t_{S-R,MIN} + t_{H-R,MIN})$ window of the $R_A$ signal from register element 330 relative to the $CLK_{RA}$ rising edge. The second factor is the range of propagation delay $(t_{PROP-R,MAX} - t_{PROP-R,MIN})$ through the voltage discriminator 332. The third factor is the range of timing skew $(t_{SKEW-R,MAX} - t_{SKEW-R,MIN})$ between the $CLK_{RREF}$ and CLKRA signals from the receive clock aligner element 328. The following equation can be written:

$$(t_{S,MIN} + t_{H,MIN}) = (t_{S-R,MIN} + t_{H-R,MIN}) + (t_{PROP-R,MAX} - t_{PROP-R,MIN}) + (t_{SKEW-R,MAX} - t_{SKEW-R,MIN}) \quad \text{Equation 4}$$

Of the three factors, the width of the $(t_{S-R,MIN} + t_{H-R,MIN})$ window of the $R_A$ register relative to the CLKRA rising edge will usually be the smallest, and the range of timing skew ($t_{SKEW-R,MAX}$–$t_{SKEW-R,MIN}$) between the $CLK_{RREF}$ and $CLK_{RA}$ signals will usually be the largest. The three factors have a timing range because of variations of manufacturing process (between different components) and variations in temperature and supply voltages (during system operation). The receiver 304 uses an internal timing signal, $CLK_{RA}$, to sample a bit during its bit interval. An event on the timing signal determines when a new bit is to be sampled and held.

The receiver 304 further includes a test circuit 340 and a test circuit 342. In one embodiment, the test circuit 340 consists of pattern memory and pattern generation circuitry 346 that creates a stream of bits, or pattern set, that may be steered to the transmitter 302 and driven onto the interconnect 308. Alternatively, the stream of bits may be compared in the compare circuit 348 to a second stream of bits which the receiver 304 has sampled from the interconnect 308, and the compare results (pass or fail) indicated. The test circuit 340 is controlled by other circuitry (not shown), or by other signals received by component A (not shown), or both. Typically, these other signals will utilize a low bandwidth interface, which will not present the testing and characterization issues that exist in prior testing systems. This other circuitry or other signals control the operation of the test circuit 340. For example, the other circuitry or signals dictates when the pattern set starts and ends, which pattern set is to be used, whether the transmitter 302 or receiver 304 is being used, and whether some of the pattern comparisons are to be ignored, or masked.

Alternatively, the compare circuit 348 could include delay circuitry that permits the stream of bits from the pattern memory and pattern generation circuitry 346 to be aligned to the bit stream from receiver 304. This would permit a single bit stream from the pattern memory and pattern generation circuitry 346 to be steered to the transmitter 302, driven to the receiver 304 in the same interface 300, and compared to the delayed version of the original bit stream.

The receiver 304 further includes a test circuit 342. The test circuit 342 includes an analog sampling circuit 356, a series of differential comparator elements 354, a series of register elements 352, and a multiplexer 350. The analog sampling circuit 356 includes two NMOS transistors 360a and 360b, and two capacitors 358a and 358b. As will be described in more detail below, the analog sampling circuit 356 samples by utilizing a $T_{REF}$ 362 signal that is used in embodiments for facilitating testing and characterization of one component by another and of one component by itself by decoupling respective transmitter and receiver parameters.

The differential comparator element 354a receives the outputs of analog sampling circuit 356. The analog sampling circuit 356 includes NMOS transistors 360a and 360b and capacitors 358a and 358b to sample voltage values $V_P$ and $V_N$. The analog sampling circuit 356 and its function will be described in more detail below. The differential comparator element 354b receives $V_N$ and $V_{REF}$. The differential comparator element 354c receives $V_P$ and $V_{REF}$. The register element 352a receives the output of the differential comparator element 354a. The output of the register element 352a is the signal $R_{TT}$, or receiver time test signal which has the same digital value as the received $R_A$ signal but is time-sampled by the analog sampling circuit 356 instead of being time-sampled by register element 330. The register element 352b receives the output of the differential comparator element 354b. The differential comparator elements 354b and 354c compare the respective $V_P$ and $V_N$ voltage values to a reference voltage signal $V_{REF}$. The results of the two comparisons are received by the respective register elements 352b and 352c on the rising edge of CLKRA to produce the $R_{TN}$ (receiver test negative signal) and $R_{TP}$ (receiver test positive signal) signals. Note that the $R_{TN}$ signal is inverted relative to the $R_{TP}$ signal because the $V_P$ and $V_N$ voltage values are complementary.

Multiplexer 350 receive the outputs of all of the register elements 352. The multiplexer 350 selects one of the outputs of the register elements 352 or the received signal $R_A$ to transmit to the compare circuit 348 of the test circuit 340 for comparison with a test pattern. Signal $R_A$ is also continually sent to other circuits as in normal operation.

The component A receives a set of low bandwidth reference signals. The set of reference signals includes $V_{REF}$ 364, $I_{REF}$ 366, $R_{REF}$ 368, $CLK_{RREF}$ 370, $CLK_{TREF}$ 372, and $T_{REF}$ 362. The $I_{REF}$ 366 signal controls one of the voltage levels used by the transmitter. The $R_{REF}$ 368 signal controls the value $R_T$ of the termination elements 334a and 334b. The $CLK_{RREF}$ 370 and $CLK_{TREF}$ 372 signals provide timing references used to generate the internal timing signals $CLK_{RA}$ and $CLK_{TA}$. In one embodiment, $V_{REF}$ 364, $I_{REF}$ 366, $R_{REF}$ 368, $CLK_{RREF}$ 370, $CLK_{TREF}$ 372 are reference signals normally supplied by a system to the components in the system to permit normal system operation, but they are also used to perform component testing and characterization. The $T_{REF}$ 362 signal is used in embodiments for facilitating testing and characterization of one component by another and of one component by itself by decoupling respective transmitter and receiver parameters.

Component-to-Component Test Example: Transmitter Test

Figure 4A:
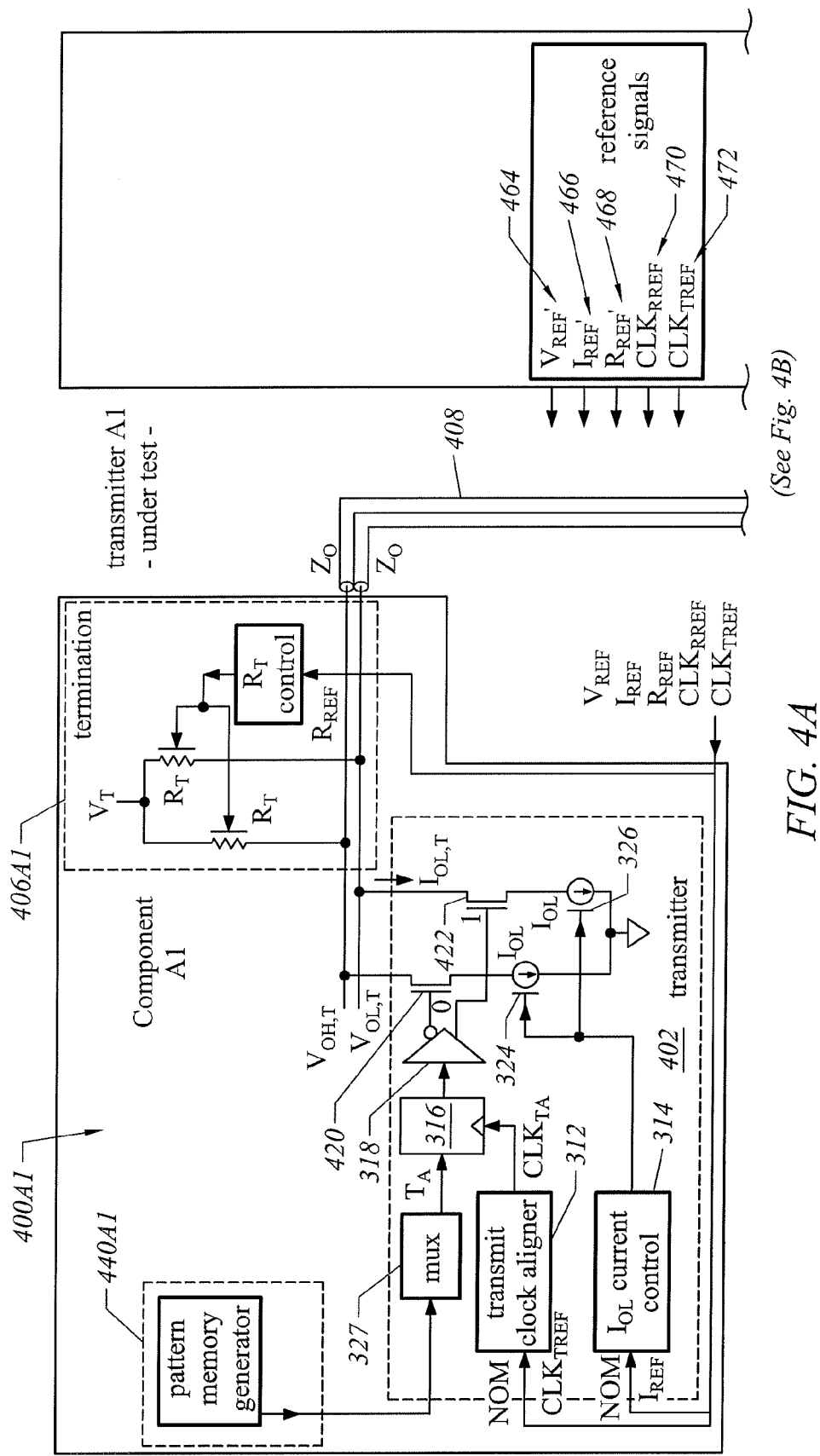
FIGS. 4A-B are block diagrams of portions of two components configured to test each other according to one embodiment.
Figure 4B:
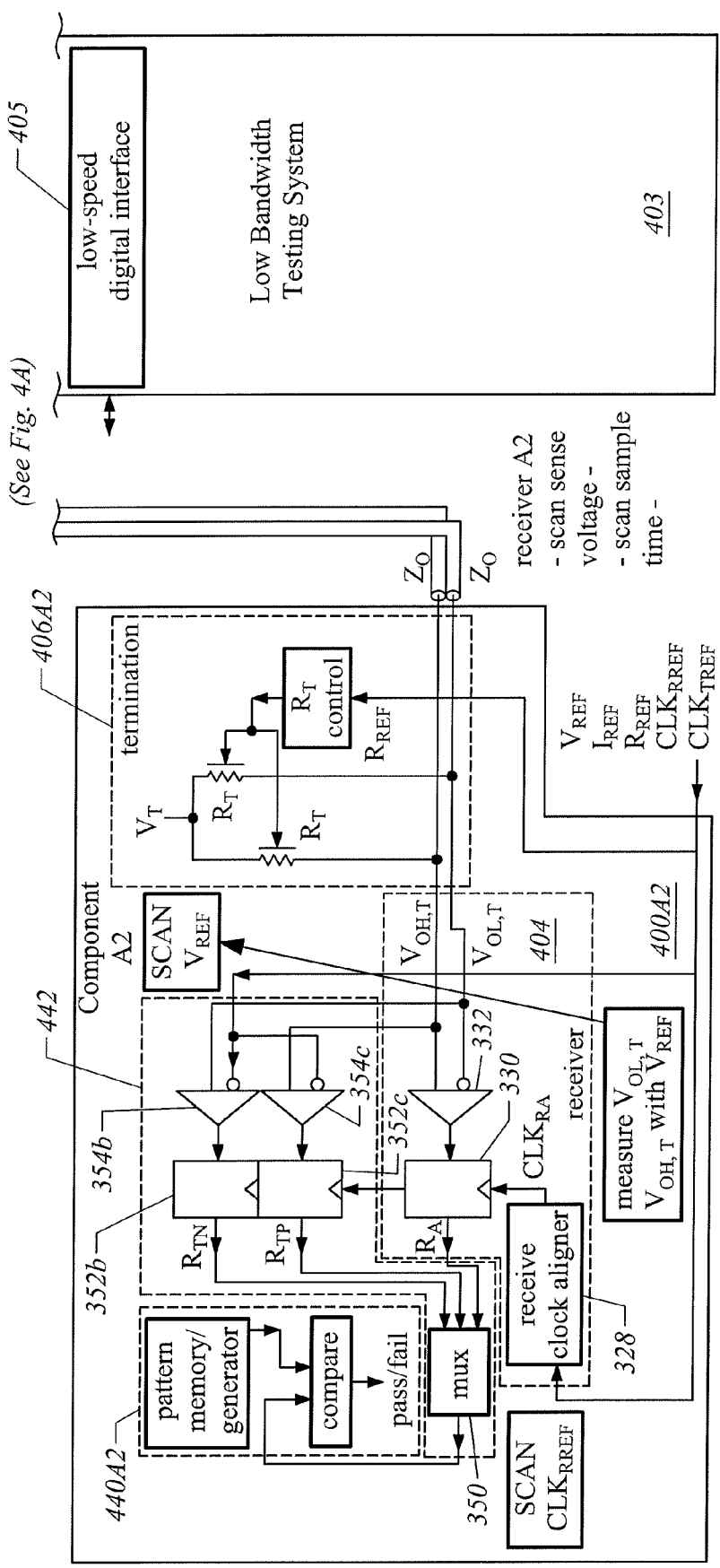

FIGS. 4A-B are block diagrams showing relevant portions of two interfaces 400A1 and 400A2 on one component configured to test each other using the test circuits described with reference to FIG. 3, and a low bandwidth testing system. Alternatively, the two interfaces 400A1 and 400A2 could reside on two different components. Relevant portions of the interfaces 400A1 and 400A2 are shown. For interface 400A1, a transmitter 402, a termination block 406A1, and a test circuit 440A1 are shown. Elements in FIGS. 4A-B function similarly to their similarly numbered counterparts in FIG. 3. Where there are instances of a similar element or sub-element in both component A1 and component A2 are shown in one figure, the elements are numbered with a suffix "A1" or "A2" as appropriate. In some instances, individual sub-elements are not numbered or discussed as to simplify FIGS. 4A-B. For example, sub-elements of the termination blocks 406A1 and 406A2 are not numbered. For interface 400A2 a receiver 404, a test circuit 440A2, a test circuit 442, and a termination block 406A2 are shown.

Interfaces 400A1 and 400A2 communicate with each other via the interconnect 408. Interfaces 400A1 and 400A2 further receive low bandwidth, or low speed, reference signals from low bandwidth testing system 403. The low bandwidth testing system 403 includes a low-speed digital interface 405. The low bandwidth testing system 403 drives four reference signals previously discussed: $I_{REF}$ 466, $R_{REF}$ 468, $CLK_{RREF}$ 470, and $CLK_{TREF}$ 472. The low bandwidth testing system 403 also drives the $V_{REF}$ 464 signal, which is used by the test circuit 442. A low-speed digital interface 405 produces signals that control the test circuits 440A1, 440A2, and 442 in the two interfaces 400A1 and 400A2. FIGS. 4A-B will be used to illustrate an embodiment in which two sets of interface logic can be configured to test each other using the additional test circuitry previously described. For example, the transmitter of one interface tests the receiver of the other interface, and vice-versa. The two sets of interface logic can reside on the same component when component testing and characterization is being performed at either the wafer level or the package level. When testing and characterization is being performed within an actual system (typically when normal operation has been suspended), the two sets of interface logic will usually reside on different components. In other words, interfaces 400A1 and 400A2 in FIGS. 4A-B may or may not reside on the same component.

For component testing it is also possible that interface logic for a single signal could be configured to test itself; that is, the transmitter for interface 400A1 could test the receiver for interface 400A1 and the receiver for interface 400A1 could test the transmitter for interface 400A1. Embodiments with this capability are described in a later section.

In the configuration of FIGS. 4A-B, the transmitter 402 of the interface 400A1 is being tested. The receiver 404 of the interface 400A2 is used to scan a sense voltage and to scan a sample time. In embodiments of the present invention, scanning is defined as varying a timing of a transition of a signal in a time range and/or varying a voltage value of a signal in a voltage range. In an embodiment of the present invention, scanning is done to determine a pass/fail transition boundary. When the transmitter 402 drives a bit, one of the two driver elements 420 and 422 is on and the other is off. The output voltage of the one that is off will remain high at the termination voltage, $V_T$, and the output voltage of the one that is on will assume a lower voltage. The following equations apply.

$$V_{OH,T} = V_T \qquad \text{Equation 5}$$

$$V_{OL,T} = V_T - I_{OL,T} * R_T/2 \qquad \text{Equation 6}$$

There is an "$R_T/2$" factor reflects the fact that the interconnect 408 is terminated at both ends in a termination load of $R_T$ which is presumed to match $Z_O$, the characteristic impedance of interconnect 408. The $I_{REF}$ 466 and $CLK_{TREF}$ 472 reference signals to interface 400A1 are adjusted to nominal values. The test circuit 440A1 produces a pattern set from the pattern memory and pattern generator circuitry. This pattern set is transmitted on the interconnect 408 to the interface 400A2. Test circuit 442 receives the pattern set. The $V_{REF}$ 464 reference voltage is scanned across voltage ranges, and the $CLK_{RREF}$ 470 reference signal is scanned across timing intervals to test and characterize the transmitter 402.

Figure 5:
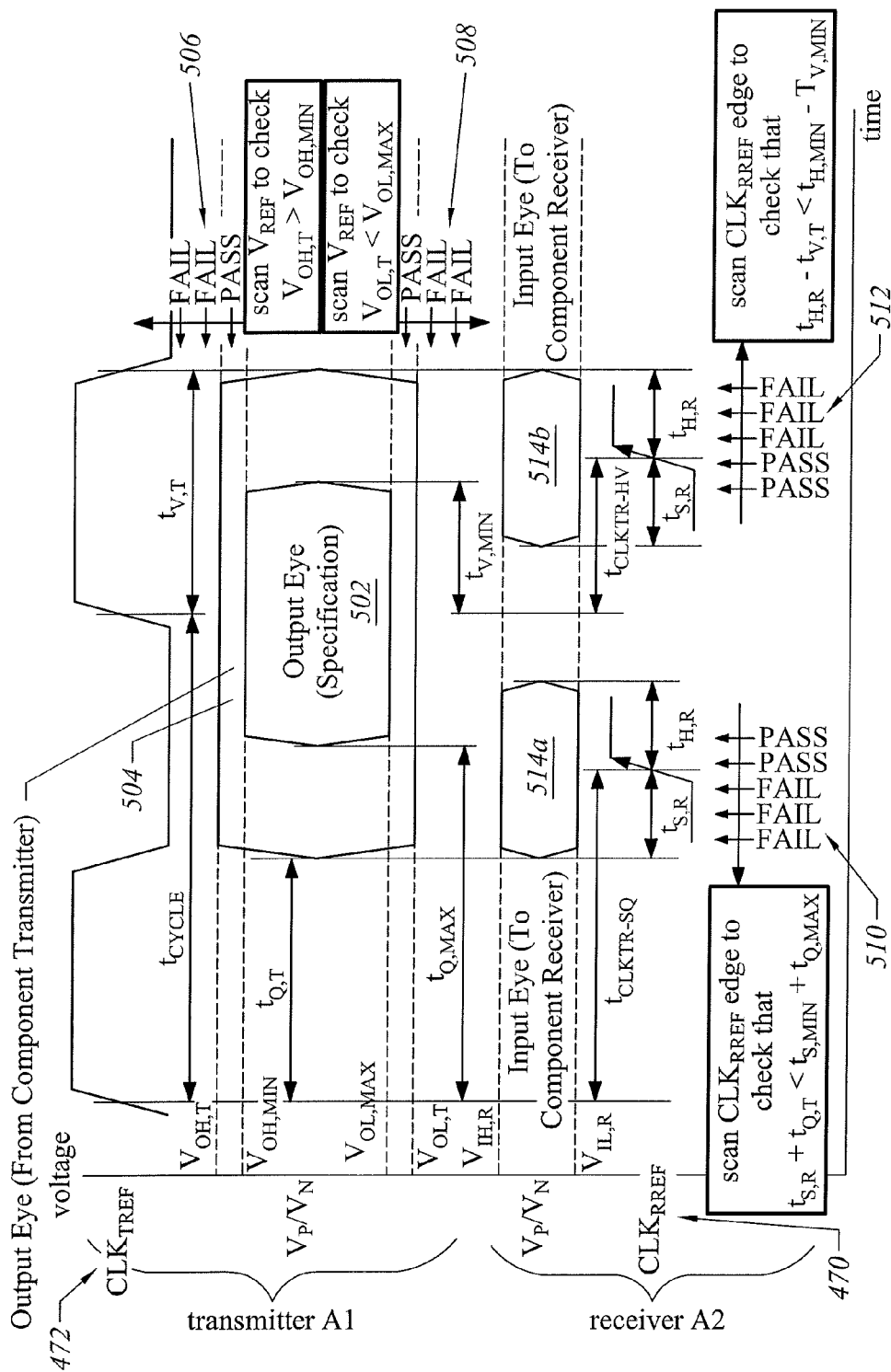
FIG. 5 is a timing diagram illustrating a transmitter testing operation using the embodiment of FIGS. 4A-B.

FIG. 5 is timing diagram showing the voltage value for the signals on a number of interconnects as a function of time during the scanning operations to evaluate the transmitter 402. Signals from the transmitter 402 of interface 400A1 are shown on approximately the top half of the diagram and signals from the receiver 404 of component A2 are shown on approximately the bottom half of the diagram. Consider that the specification for the transmitter 402 requires that the timing and voltage parameters for the $V_P/V_N$ signal fall within the specification-output-eye ("Output Eye (From Component Transmitter)") region 502. That is, the signal must be valid no later than $t_{Q,MAX}$ after a rising edge of $CLK_{TREF}$ 472, and must remain valid until at least a time $t_{V,MIN}$ after the next rising edge of $CLK_{TREF}$ 472. During this valid interval, the voltage level must be above $V_{OH,MIN}$ or must be below $V_{OL,MAX}$. The actual transmitter 402 has the following parameter values: $t_{Q,T}$, $t_{V,T}$, $V_{OH,T}$ and $V_{OL,T}$. $t_{Q,T}$ is the time from the active (rising, in this case) clock edge to valid data. $t_{V,T}$ is the time from the next rising clock edge to non-valid data. $V_{OH,T}$ is the high output voltage (high logic value), and $V_{OL,T}$ is the low output voltage (low logic value). These parameter values define an output-eye-from-transmitter ("Output Eye (from Component Transmitter)") region 504, which lies outside the specification-output-eye region 502. These parameter values are a function of several factors, including the manufacturing process that produced the component under test, the reference values applied, the operating temperature and supply voltages of the component under test, and the test patterns used when characterizing the component under test. The test circuits 440 and 442 on the components measure the actual output-eye-from-transmitter region 504 of the transmitter 402 to confirm that it is larger than the specification-output-eye region 502. This is done by scanning the sample time and the sense voltage used by the receiver 404.

The actual receiver 404 has the following characteristics: $t_{S,R}$, $t_{H,R}$, $V_{IH,R}$ and $V_{IL,R}$. $t_{S,R}$ is the receiver setup time, $t_{H,R}$ is the receiver hold time, $V_{IH,R}$ is the receiver high input voltage, and $V_{IL,R}$ is the receiver low input voltage. These parameter values define an input-eye-to-component-receiver ("Input Eye (To Component Receiver)") region 514. The receiver 404 parameters and the input-eye-to-component-receiver region 514 will be discussed in more detail below with reference to receiver testing.

To characterize the margin in the $V_{OH}$ parameter, the $V_{REF}$ 464 voltage supplied by the low bandwidth testing system 403 scans from the $V_{OH,MIN}$ value to the $V_{OH,T}$ value. The sampled patterns will match the expected patterns (pass) at each parameter value until a fail point 506 just past (above) $V_{OH,T}$. If a simple pass/fail test is desired, the voltage $V_{REF}$ 464 is set to the $V_{OH,MIN}$ parameter value. When the $V_P$ node is checked, the $R_{TP}$ multiplexer input is selected in test circuit 442. When the $V_N$ node is checked, the $R_{TN}$ multiplexer input is selected in test circuit 442.

To characterize the margin in the $V_{OL}$ parameter, the $V_{REF}$ 464 voltage supplied by the low bandwidth testing system 403 scans from the $V_{OL,MAX}$ value to the $V_{OL,T}$ value. The sampled patterns will match the expected patterns (pass) at each parameter value until a fail point 508 just past (below) $V_{OL,T}$. If a simple pass/fail test is desired, the voltage $V_{REF}$ 464 is set to the $V_{OL,MAX}$ parameter value. Note that when the $V_P$ node is checked, the $R_{TP}$ multiplexer input must be selected in test circuit 442. When the $V_N$ node is checked, the $R_{TN}$ multiplexer input must be selected in test circuit 442.

To characterize the margin in the $t_Q$ parameter, the position of the $CLK_{RREF}$ 470 edge in the receiver 404 relative to the $CLK_{TREF}$ 472 edge in the transmitter 402 ($t_{CLKTR-SQ}$) is scanned. The following equation will be true during the scanning process:

$$t_{CLKTR-SQ} - t_s = t_Q \qquad \text{Equation 7}$$

or $$t_{CLKTR-SQ} = t_s + t_Q \qquad \text{Equation 8}$$

Thus, the position of the $CLK_{RREF}$ 470 edge in the receiver 404 relative to the $CLK_{TREF}$ 472 edge ($t_{CLKTR-SQ}$) will begin scanning at a passing value of ($t_{S,MIN} + t_{Q,MAX}$), and will decrease in value until it fails somewhere around point 510 as it reaches the value ($t_{S,R} + t_{Q,T}$). This process will not yield the minimum value of ($t_{Q,T}$), but instead yields the minimum value of ($t_{S,R} + t_{Q,T}$). In other words, the transmitter parameter $t_{Q,T}$ is coupled to the receiver parameter $t_{S,R}$. The consequences of this will be discussed shortly. To characterize the margin in the $t_V$ parameter, the position of the $CLK_{RREF}$ 470 edge in the receiver 404 relative to the $CLK_{TREF}$ 472 edge in the transmitter 402 ($t_{CLKTR-HV}$) is scanned. The following equation will be true during the scanning process:

$$t_{CLKTR-HV} + t_H = t_V \qquad \text{Equation 9}$$

or $$t_{CLKTR-HV} = t_V - t_H \qquad \text{Equation 10}$$

Thus, the position of the $CLK_{RREF}$ 470 edge in the receiver 404 relative to the $CLK_{TREF}$ 472 edge ($t_{CLKTR-HV}$) will begin scanning at a passing value of ($t_{V,MIN}-t_{H,MIN}$), and will increase in value until it fails somewhere around point 512 as it reaches the value of ($t_{V,T}-t_{H,R}$). This process will not yield the maximum value of ($t_{V,T}$), but instead yields the maximum value of ($t_{V,T}-t_{H,R}$). In other words, the transmitter parameter $t_{V,T}$ is coupled to the receiver parameter $t_{H,R}$. The consequences of this will be discussed shortly.

In one embodiment, the scanning process that is performed for each parameter includes the following steps.

1. Set $CLK_{RREF}$ 470 time or $V_{REF}$ 464 voltage to an initial passing value;
2. Transmitter 402 drives pattern set;
3. Receiver 404 compares sampled pattern set to expected pattern set;
4a. If pass (pattern sets match), change $CLK_{RREF}$ 470 time or $V_{REF}$ 464 voltage to the next (more difficult) value, and go to step [2]; or
4b. If fail, exit test with last passing value.

Alternative processes are possible.

As each parameter is characterized or tested, the other parameters are usually left at nominal values to ensure that they are not affecting the test and characterization results. In some cases one or more other parameters are given a more constrained value.

Component-to-Component Test Example: Receiver Test

Figure 6A:
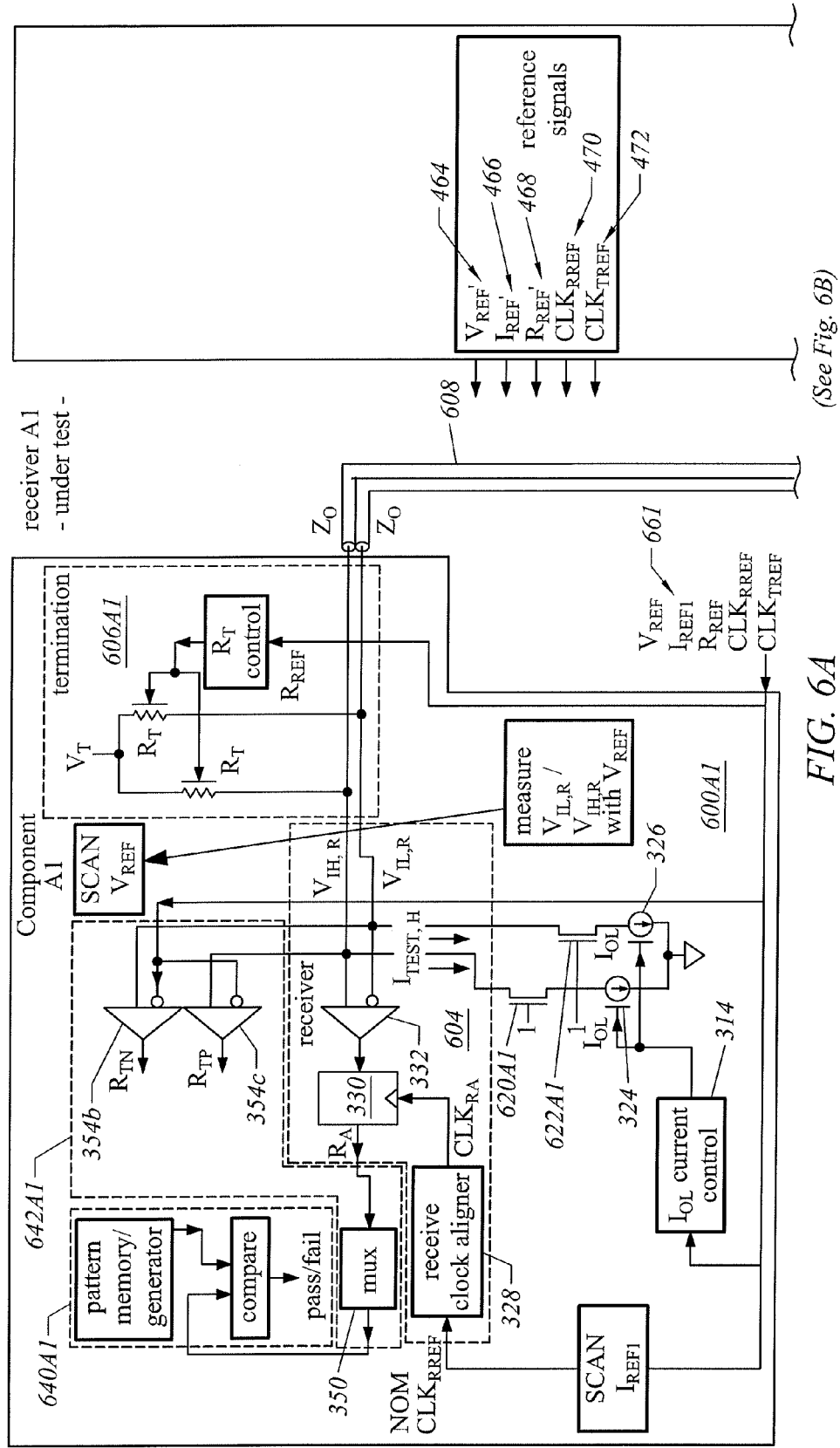
FIGS. 6A-B are block diagrams of portions of two components configured to test each other according to one embodiment.
Figure 6B:
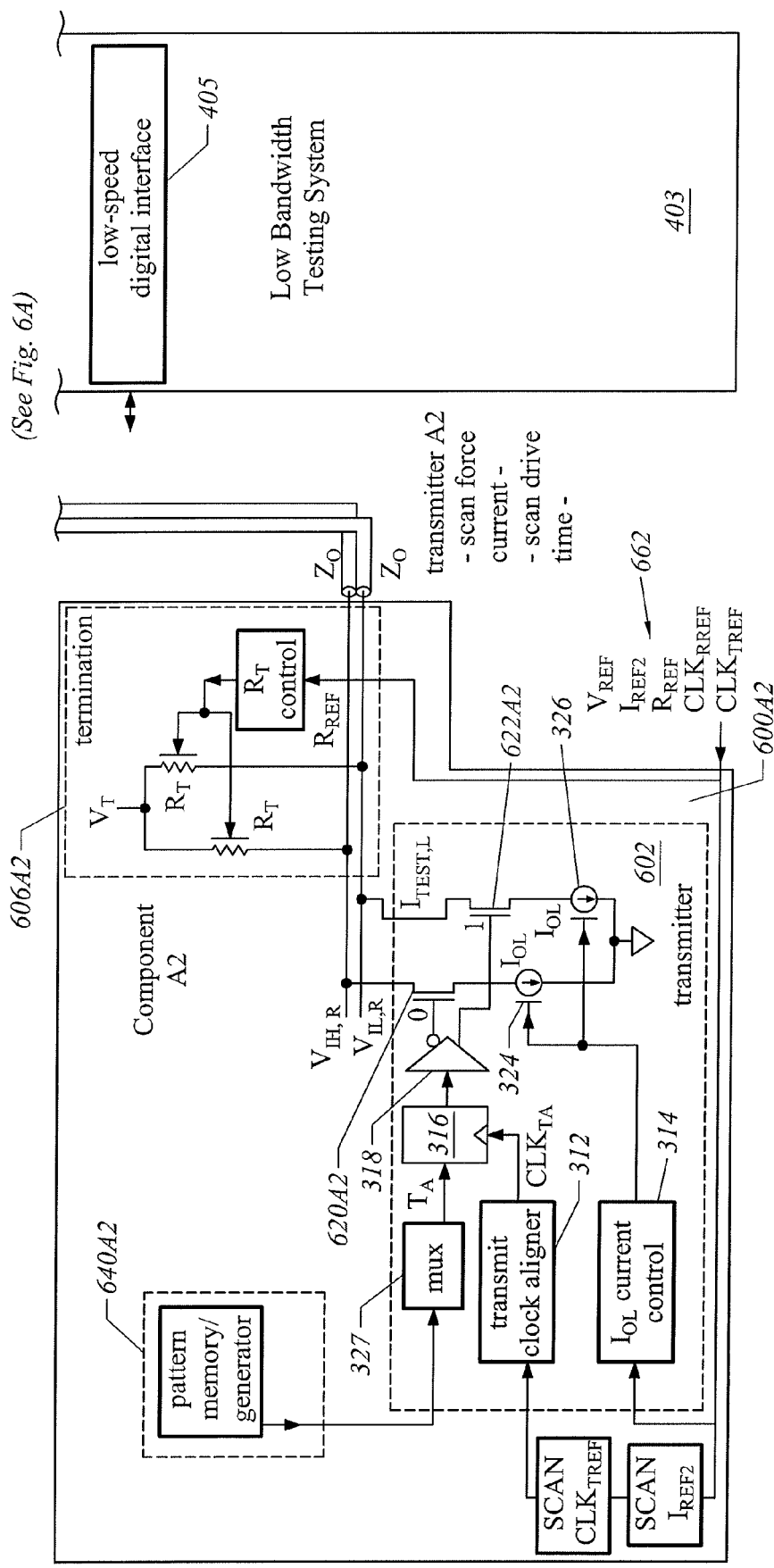

In a single component having two interfaces, each interface is able to test the other interface in an embodiment of the present invention. FIGS. 6A-B are block diagrams showing relevant portions of two interfaces 600A1 and 600A2 on one component configured to test each other using the test circuits described with reference to FIG. 3, and a low bandwidth testing system. Alternatively, the two interfaces 600A1 and 600A2 could reside on two different components. Relevant portions of the interfaces are shown. For interface 600A1, a receiver 604, a termination block 606A1, a test circuit 640A1, and a test circuit 642 are shown. Elements in FIGS. 6A-B function similarly to their similarly numbered counterparts in FIG. 3. Where there are instances of a similar element or sub-element in both interfaces 600A1 and 600A2 are shown in one figure, the elements are numbered with a suffix "A1" or "A2" as appropriate. In some instances, individual sub-elements are not numbered as to simplify FIGS. 6A-B. For interface 600A2, a transmitter 602, a test circuit 640A2, and a termination block 606A2 are shown.

In the configuration of FIGS. 6A-B, the receiver of interface 600A1 can be tested by the transmitter of interface 600A2. Interfaces 600A1 and 600A2 will usually reside on the same component when component testing and characterization is being performed (at both the wafer level and the component level). However, when testing and characterization is being performed within an actual system (typically when normal operation has been suspended), interfaces 600A1 and 600A2 will usually reside on different components. For component testing, a single interface can be configured to test itself; that is, the transmitter could test the receiver and vice-versa. Such an embodiment will be described in a later section.

In FIGS. 6A-B, a receiver 604 is being tested. The interface 600A2 includes a transmitter 602, which is used to scan a force current and to scan a drive time. There is also a low bandwidth testing system 403, which has no high-speed pin electronics. An interconnect 608 is used to couple interface 600A1 to interface 600A2, and is not coupled to the low bandwidth testing system 403. The low bandwidth testing system 403 does drive the four reference signals previously discussed: $I_{REF}$ 466, $R_{REF}$ 468, $CLK_{RREF}$ 470, and $CLK_{TREF}$ 472. It also drives the $V_{REF}$ 464 signal, which is used by test circuit 642. Also shown is the low-speed digital interface 405, which produces signals that control the test circuits 640 and 642 in the interfaces 600A1 and 600A2.

When the transmitter 602 drives a bit, one of the two driver elements 620A2 and 622A2 is on (sinking current $I_{TEST,L}$) and the other is off. The output voltage of the driver element that is off will remain high at the termination value, and the output voltage of the driver element that is on will assume a lower voltage. In addition, both driver elements 620A1 and 622A1 in interface 600A1 are on, sinking current $I_{TEST,H}$. As a result, the high voltage $V_{IH,R}$ (high logic value) and low voltage $V_{IL,R}$ (low logic value) produced for the receiver in interface 600A1 are:

$$V_{IH,R}=V_T-I_{TEST,H}*R_T/2 \qquad \text{Equation 11}$$

$$V_{IL,R}=V_T-I_{TEST,H}*R_T/2-I_{TEST,L}*R_T/2 \qquad \text{Equation 12}$$

The $I_{REF1}$ and $I_{REF2}$ signals are part of the 661 and 662 reference signals supplied by the test system, and they control the values of $I_{TEST,H}$ and $I_{TEST,L}$, respectively. The $I_{TEST,H}$ and $I_{TEST,L}$ signals control the values of the $V_{IH,R}$ and $V_{IL,R}$ voltage levels as indicated by Equations 11 and 12. The "$R_T/2$" factor reflects the fact that the interconnect 608 is terminated at both ends in a termination load of $R_T$. This allows the $V_{IH,R}$ and $V_{IL,R}$ voltage levels to be independently adjusted by changing the values of the $I_{REF1}$ and $I_{REF2}$ signals.

Alternatively, the $V_{IH,R}$ and $V_{IL,R}$ voltage levels could be independently adjusted by changing the value of the $I_{REF2}$ signals and the value of the $V_T$ termination voltage. In this case, it would not be necessary to turn on the two driver elements 620A1 and 620A1 so that the $I_{TEST,H}$ current is pulled from the signal lines providing the $V_P$ and $V_N$ voltage values. This could be beneficial if the transmitter and the receiver were in the same interface, rather than belonging to two different interfaces.

The $CLK_{RREF}$ 470 reference signal to interface 600A1 is adjusted to a nominal value. The $I_{REF1}$ signal in 661 reference signals to interface 600A1 is adjusted to the value $I_{TEST,H}$ and both driver elements 620A1 and 620A2 of interface 600A1 are enabled. The $I_{REF2}$ signal in 662 reference signals to interface 600A2 is adjusted to the value $I_{TEST,L}$.

Test circuit 640A2 in the interface 600A2 produces a pattern set. This pattern set is transmitted on the interconnect 608 from the interface 600A2 to the interface 600A1. The pattern set is received by the test circuit 642A1 in the interface 600A1. The $I_{REF1}$ signal in 661 reference signals and $I_{REF2}$ signal in 662 reference signals are scanned across current ranges, and the $CLK_{TREF}$ signal in 662 reference signals is scanned across timing intervals to test and characterize the receiver 604 in the interface 600A1.

Figure 7:
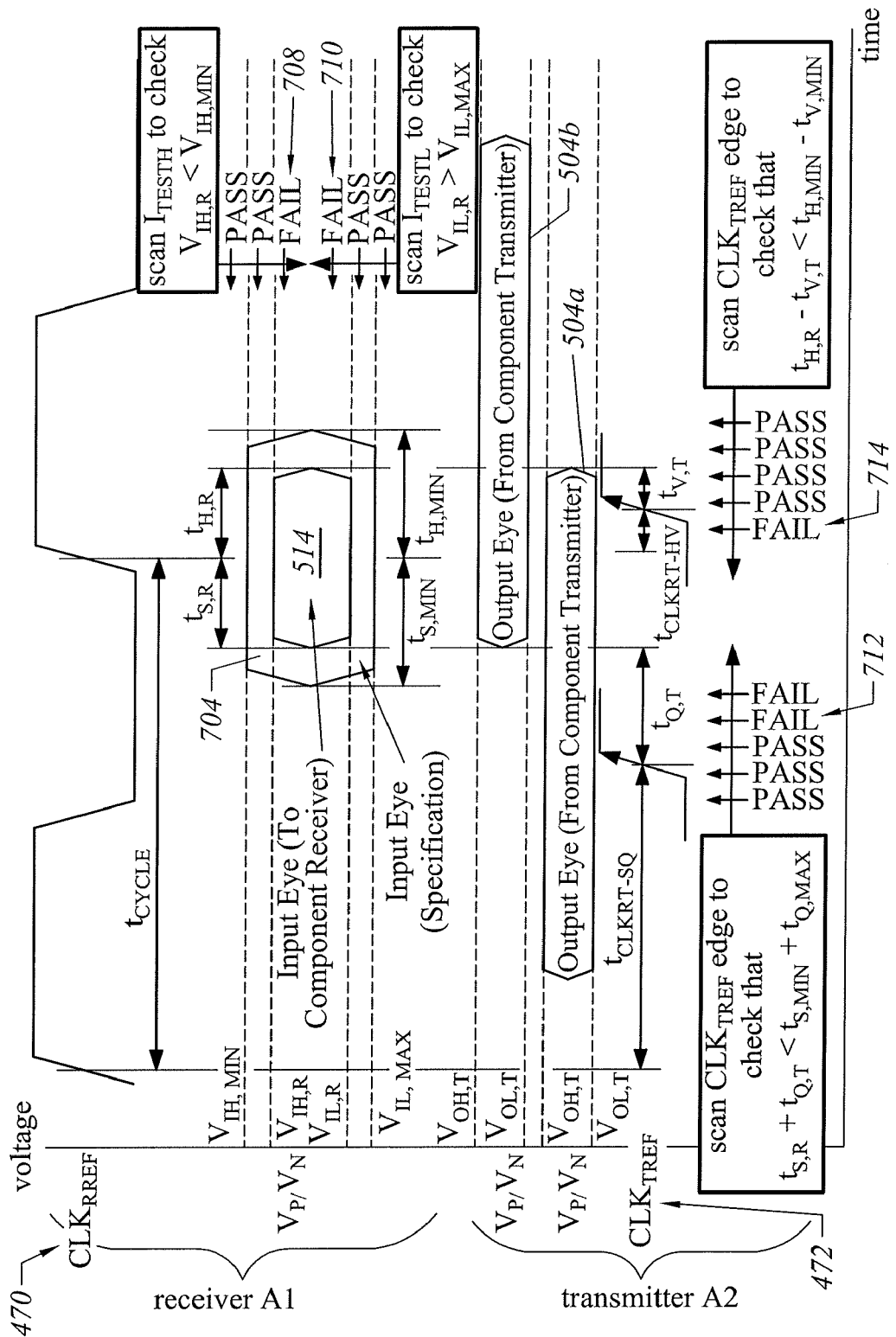
FIG. 7 is a timing diagram illustrating a receiver testing operation using the embodiment of FIG. 6.

FIG. 7 is a timing diagram showing the voltage values for the signals on a number of interconnects as a function of time for the scanning operations that evaluate the receiver 604 of interface 600A1. The specification for the receiver requires that the timing and voltage parameters for the $V_P/V_N$ signal fall within the specification-input-eye ("Input Eye (Specification)") region 704 in order for receiver 604 to pass a test based on the specification requirements. Receiver 604 passes the test if it meets or slightly exceeds specification requirements. However, it should be noted that receiver 604 might still operate properly if one or more timing or voltage parameters do not meet specification requirements. For example, the receiver 604 must be able to sample a signal that becomes valid at time $t_{S,MIN}$ (or later) before a rising edge of $CLK_{RREF}$ 470 in order to pass the test. The receiver 604 must also be able to sample a signal that remains valid until a time $t_{H,MIN}$ (or earlier) after a rising edge of $CLK_{RREF}$ 470 in order to pass the test. Likewise, during this valid interval, the receiver 604 must be able to sense a high voltage level that is equal to or less than $V_{IH,MIN}$. Also, the receiver must be able to sense a low voltage level that is equal to or more than $V_{IL,MAX}$. Consider that the actual receiver 604 has the following characteristics: $t_{S,R}$, $t_{H,R}$, $V_{IH,R}$ and $V_{IL,R}$. These parameter values define the input-eye-to-component-receiver region 514, which lies inside a specification-input-eye ("Input Eye (Specification)") region 704. These parameter values are a function of several factors, including the manufacturing process that produced the component under test, the reference values applied, the operating temperature and supply voltages of the component under test, and the test patterns used when characterizing the component under test.

The test circuits 640A1 and 642A1 on the component measures the input-eye-to-component-receiver region 514 of the receiver 604 and confirms that it is smaller than the specification-input-eye region 704. It does this by scanning the drive time and the force voltage (or current) used by the transmitter 602. To characterize the margin in the $V_{IH}$ parameter, the $I_{TEST,H}$ value that is driven on the $I_{REF1}$ reference current supplied by the testing system is scanned. It scans from a value that generates the $V_{IH,MIN}$ parameter value, and is increased until the $V_{IH,T}$ value is reached (recall that $V_{IH}=V_T-I_{TEST,H}*R_T/2$). The sampled patterns will match the expected patterns (pass) at each parameter value until it fails at a point 708 just past (below) $V_{IH,T}$. If a simple pass/fail test is desired, the sense voltage of the tester is set to the $V_{IH,MIN}$ parameter value. The $I_{TEST,H}$ value can be scanned from a passing value until it just fails. It can be placed back to the last passing value, and then the $V_{REF}$ reference signal can be scanned (and the $R_{TP}$ or $R_{TN}$ node monitored) to determine the exact value of $V_{IH,R}$. In this way, any inaccuracy in the values of $I_{TEST,H}$, $V_T$ and $R_T$ can be eliminated and $V_{IH,R}$ determined directly.

To characterize the margin in the $V_{IL}$ parameter, the $I_{TEST,L}$ value that is driven on the $I_{REF2}$ reference current supplied by the testing system is scanned. It scans from a value that generates the $V_{IL,MAX}$ parameter value, and is increased until the $V_{IL,R}$ value is reached (recall that $V_{IL}=V_T-I_{TEST,H}*R_T/2-I_{TEST,L}*R_T/2$). The sampled patterns will match the expected patterns (pass) at each parameter value until it fails at a point 710 just past (above) $V_{IL,R}$. If a simple pass/fail test is desired, the sense voltage of the tester is set to the $V_{IL,MAX}$ parameter value. The $I_{TEST,L}$ value can be scanned from a passing value until it just fails. It can be placed back to the last passing value, and then the $V_{REF}$ reference signal can be scanned (and the $R_{TP}$ or $R_{TN}$ node monitored) to determine the exact value of $V_{IL,R}$. In this way, any inaccuracy in the values of $I_{TEST,H}$, $I_{TEST,L}$, $V_T$ and $R_T$ can be eliminated and $V_{IL,R}$ determined directly.

To characterize the margin in the $t_S$ parameter, the position of the $CLK_{TREF}$ 472 edge in the transmitter 602 relative to the $CLK_{RREF}$ 470 edge in the receiver 604 ($t_{CLKRT-SQ}$) is scanned. The following equation will be true during the scanning process:

$$t_{CLKRT-SQ}+t_Q=t_{CYCLE}-t_S \quad \text{Equation 13}$$

or $$t_{CLKRT-SQ}=t_{CYCLE}-t_S-t_Q \quad \text{Equation 14}$$

Thus, the position of the $CLK_{TREF}$ 472 edge in the transmitter 602 relative to the $CLK_{RREF}$ 470 edge ($t_{CLKRT-SQ}$) will begin scanning at a passing value of ($t_{CYCLE}-t_{S,MIN}-t_{Q,MAX}$), and will increase in value until it fails at approximately point 712 as it reaches the value ($t_{CYCLE}-t_{S,R}-t_{Q,T}$). This process will not yield the minimum value of ($t_{S,R}$), but instead yields the minimum value of ($t_{S,R}+t_{Q,T}$). In other words, the transmitter 602 parameter $t_{Q,T}$ is coupled to the receiver parameter $t_{S,R}$. The consequences of this will be discussed shortly.

To characterize the margin in the $t_H$ parameter, the position of the $CLK_{TREF}$ 472 edge in the transmitter 602 relative to the $CLK_{RREF}$ 470 edge in the receiver 604 ($t_{CLKTR-HV}$) is scanned. The following equation will be true during the scanning process:

$$t_{CLKRT-HV}+t_V=t_H \quad \text{Equation 15}$$

or $$t_{CLKRT-HV}=t_H-t_V \quad \text{Equation 16}$$

The position of the $CLK_{TREF}$ 472 edge in the transmitter 602 relative to the $CLK_{RREF}$ 470 edge ($t_{CLKRT-HV}$) will begin scanning at a passing value of ($t_{H,MIN}-t_{V,MIN}$), and will decrease in value until it fails at approximately point 714 as it reaches the value ($t_{H,R}-t_{V,T}$). This process will not yield the minimum value of ($t_{H,T}$), but instead yields the minimum value of ($t_{H,R}-t_{V,T}$). In other words, the transmitter parameter $t_{V,T}$ is coupled to the receiver parameter $t_{H,R}$. The consequences of this will be discussed shortly.

In one embodiment, the scanning process that is performed for each parameter includes the following steps. Alternative processes are possible.

1. Set $CLK_{TREF}$ time or $I_{REF}$ current to an initial passing value

2. Transmitter A2 drives pattern set

3. Receiver A1 compares driven pattern set to expected pattern set

4a. If pass (pattern sets match), change $CLK_{TREF}$ time or $I_{REF}$ current to the next (more difficult) value, and go to step [2].

4b. If fail, go to [5] with last passing value

5. For the $V_{IH}/V_{IL}$ tests, measure the final passing $V_{IH,R}/V_{IL,R}$ voltage values on the signal lines providing $V_P/V_N$ voltage values using the $V_{REF}$ comparators; i.e. scan the $V_{REF}$ value until the $R_{TP}$ or $R_{TN}$ digital value changes Note that as each parameter is characterized or tested, the other parameters will usually be left at nominal values to ensure that they are not affecting the test and characterization results. In some cases one or more other parameters will be given a more constrained value.

Coupled Transmitter and Receiver Parameters

The scanning processes for the timing parameters that are illustrated in FIG. 5 and FIG. 7, and explained in the accompanying text, yield the following four equations:

$$t_{CLKTR-SQ}=t_{S,R}+t_{Q,T} \quad \text{Equation 17}$$

$$t_{CLKTR-HV}=t_{V,T}-t_{H,R} \quad \text{Equation 18}$$

$$t_{CLKRT-SQ}=t_{CYCLE}-t_{S,R}-t_{Q,T} \quad \text{Equation 19}$$

$$t_{CLKRT-HV}=t_{H,R}-t_{V,T} \quad \text{Equation 20}$$

The first two equations (Equations 17 and 18) and the last two equations (Equations 19 and 20) will reduce to essentially the same values for ($t_{S,R}+t_{Q,T}$) and ($t_{H,R}-t_{V,T}$). A distinction between the processes illustrated in FIGS. 5 and 7 is that $CLK_{TREF}$ 470 signal is scanned in one, and $CLK_{TREF}$ 472 is scanned in the other. This means that the testing procedure can only guarantee that:

$$(t_{S,R}+t_{Q,T}) \leq (t_{S,MIN}+t_{Q,MAX}) \quad \text{Equation 21}$$

$$(t_{H,R}-t_{V,T}) \leq (t_{H,MIN}-t_{V,MIN}) \quad \text{Equation 22}$$

In some testing situations, this might be acceptable. For example, for an in-system test the transmitter and receiver are located on different components. Also, this same transmitter and receiver pair must actually communicate during normal system operation. The constraints that must be satisfied during normal system operation are the above two equations. If the interconnect couples more than two components together, then each transmitter/receiver pair that must communicate may be tested to the above two constraints. When a single component is tested, however, the transmitter and receiver pair that are coupled together by interconnect on the load board of the test system are not the same transmitter and receiver pair that are used for normal system operation. This means that even if a transmitter and receiver pair can communicate on the same component, it's possible that a transmitter and receiver pair on two different components might not be able to communicate. For example, assume that component A and component B have the following $t_S$ and $t_Q$ parameter values:

$$t_{S,A} = t_{S,MIN} + t_\Delta \quad \text{Equation 23}$$

$$t_{S,B} = t_{S,MIN} - t_\Delta \quad \text{Equation 24}$$

$$t_{Q,A} = t_{Q,MAX} - t_\Delta \quad \text{Equation 25}$$

$$t_{Q,B} = t_{Q,MAX} + t_\Delta \quad \text{Equation 26}$$

When component A and component B are tested separately, and the transmitter and receiver are on the same component, the coupled parameter constraint is satisfied even though each component has an individual parameter that is out of specification:

$$(t_{S,A} + t_{Q,A}) = (t_{S,MIN} + t_\Delta + t_{Q,MAX} - t_\Delta) \leq (t_{S,MIN} + t_{Q,MAX})$$
Pass $$(t_{S,B} + t_{Q,B}) = (t_{S,MIN} - t_\Delta + t_{Q,MAX} + t_\Delta) \leq (t_{S,MIN} + t_{Q,MAX})$$
Pass When component A and component B are tested together, but the transmitter and receiver are on different components, the coupled parameter constraint is not satisfied when B transmits and A receives:

$$(t_{S,A} + t_{Q,B}) = (t_{S,MIN} + t_\Delta + t_{Q,MAX} + t_\Delta) > (t_{S,MIN} + t_{Q,MAX}) \text{ Fail}$$

$$(t_{S,B} + t_{Q,A}) = (t_{S,MIN} - t_\Delta + t_{Q,MAX} - t_\Delta) \leq (t_{S,MIN} + t_{Q,MAX})$$
Pass For some components, there may be correlation between the $t_{S,R}$ and $t_{Q,T}$ values and between the $t_{H,R}$ and $t_{V,T}$ values such that if the coupled parameters meet the specification, then the individual parameters do, as well. Further, the in-system testing guarantees that the actual components in each system can communicate, and serves as a final screening test to insure that all systems have adequate parameter margin to communicate reliably. If there is correlation, then the testing process described with reference to FIGS. 5 and 7 will be acceptable for component and in-system testing and characterization.

If the proper parameter correlation between the $t_{S,R}$ and $t_{Q,T}$ values and between the $t_{H,R}$ and $t_{V,T}$ values cannot be established, some systems would fail in-system testing due to poorly matched components. This would require repair of the failing systems, adding cost to the manufacturing process. It is possible that this cost could be offset by improved component screening earlier in the manufacturing process. In a typical manufacturing process, components are tested twice, once at the wafer level before packaging, and again after packaging. In other words, there are at least three testing stages:

1. Component wafer test—determine which components are packaged
2. Component package test—determine which components are used in system
3. In-system test—determine which systems work properly Usually high-speed testing is only performed during the second test. Using the testing process described in FIGS. 5 and 7, it is possible to perform high-speed testing during both tests (testing to the coupled parameter constraints). This reduces the number of components that pass the component wafer test and fail the component package test. This reduces manufacturing cost, because fewer out-of-specification components would pass the component wafer test. This might serve to offset the increased cost that is incurred because of components passing at the component package level and failing at the system level.

Uncoupled Transmitter Parameter Test—Test System

Returning to the topic of coupled parameter values for the transmitter and receiver, one solution is to determine the values of the individual timing parameters. Determining individual timing parameters by scanning a low bandwidth $T_{REF}$ signal, will now be discussed. In addition, as will be further explained, the $T_{REF}$ signal is used to sample $V_P$ and $V_N$ with an analog sampler to produce a delay or offset between a data transmission by a transmitter and the sampling of the data by a receiver. The sampling by the receiver should be distinguished from the sampling by the analog sampling circuit. The sampling of the receiver is sampling of a symbol, or evaluation of a voltage to determine whether it represents a "1" or a "0". This offset effectively decouples respective parameters of the transmitter and receiver. In one embodiment, the values of the individual timing parameters are determined using circuitry such as test circuit 342 of FIG. 3. Referring to FIG. 3, the test circuit 342 includes analog sampling circuit 356, differential comparator elements 354, and register 352, which are clocked by $CLK_{R4}$. The register output $R_{TT}$ is selectable by the multiplexer to be transmitted to the compare logic in the test circuit 340. The signal lines providing the $V_P$ and $V_N$ voltage values can be coupled to the inputs of the differential comparator element 354a by raising the gates of two NMOS transistors high with the $T_{REF}$ 362 signal. When the $T_{REF}$ 362 signal goes low, the voltage values on the inputs are retained by the two capacitors 358a and 358b.

The $V_P$ and $V_N$ voltage values on the signal lines must satisfy a setup time $t_S$, and hold time $t_H$, constraint relative to the falling edge of the $T_{REF}$ 362 signal. This setup and hold window is relatively narrow and remains relatively constant across process, voltage, and temperature variations. This is because the $T_{REF}$ 362 signal is routed directly from the component interface to the test circuit 342 with only a conductive interconnect; there is no alignment and buffering circuitry as there is with the $CLK_{RREF}$ 370 signal, for example. The slew rate and voltage swing of the $T_{REF}$ 362 signal affects the characteristics of the analog sampling circuit 356 most directly, and this is controlled by a low bandwidth external test system (such as the low bandwidth testing system 403). The RC delay of the conductive interconnect used for the $T_{REF}$ 362 signal on the component under test is another factor, but it also will not be strongly affected by process, voltage, and temperature variations.

The analog sampling circuit 356 may be operated as a timing gate in front of the normal sampler (the $R_{TT}$ register element 352a clocked by $CLK_{RREF}$ 370). As mentioned earlier, the normal sampler (the $R_{TT}$ register element 352a) also has a relatively narrow setup and hold window relative to the CLK$_{RA}$ signal, but the receive clock aligner element 328 adds a great deal of uncertainty to the position of the CLK$_{RA}$ signal relative to the CLK$_{RREF}$ 370 signal because of process, voltage, and temperature variations. Placing the analog sampling circuit 356 in series with the normal sampler avoids much of this variation.

The voltage discriminator element, the differential comparator elements 354, also adds to the uncertainty to the position of the input signals to register elements 352 relative to the CLK$_{RA}$ signal because of process, voltage, and temperature variations. Placing the analog sampling circuit 356 before the differential comparator elements 354 avoids widening the effective setup and hold window of the analog sampler. This, of course, requires that the analog V$_P$ and V$_N$ voltage values on the signal lines are retained in the time-discrimination (sampling) process, hence the name "analog sampler". In contrast, the time-discrimination process (the register elements 352) are "digital samplers", since they accept a digital input from the differential comparator elements 354. The effective setup and hold window of the register elements 352 are widened by the presence of the differential comparator elements 354 in the input path because of process, voltage, and temperature variations.

The analog sampling circuit 356 is more limited than the normal sampler, and may not be suitable for use as the normal sampler in the component. One reason for this is that in some components the frequency of CLK$_{RA}$ will be an integer multiple of the frequency of CLK$_{RREF}$ 370. This permits more than one bit to be transferred in a clock cycle. This allows a high signaling rate for the transmitter and receiver circuitry, while permitting the signaling rate of the clock reference to be relatively low. A clock signal distributed like the T$_{REF}$ signal is probably not a good choice for such an application.

This embodiment takes advantage of the fact that it is relatively easy for an external tester to provide highly accurate voltage (V$_{REF}$ 364, for example) and timing values (T$_{REF}$ 362, for example) to a component under test by using directly coupled reference signals (signals traveling directly on interconnect from the component interface to internal test circuits). It is not necessary for these precise reference signals to be simultaneously capable of high signaling rates. Instead, these precise reference signals complement the high signaling rate testing that can be performed by the components circuits on themselves. The circuitry shown in test circuit 342 is an example of an implementation that solves the problem of separating the coupled parameter values. Other implementations that solve the same problem are possible. The various pieces of circuitry in test circuit 342 may also be combined in other ways to reduce the cost to the component.

Figure 8A:
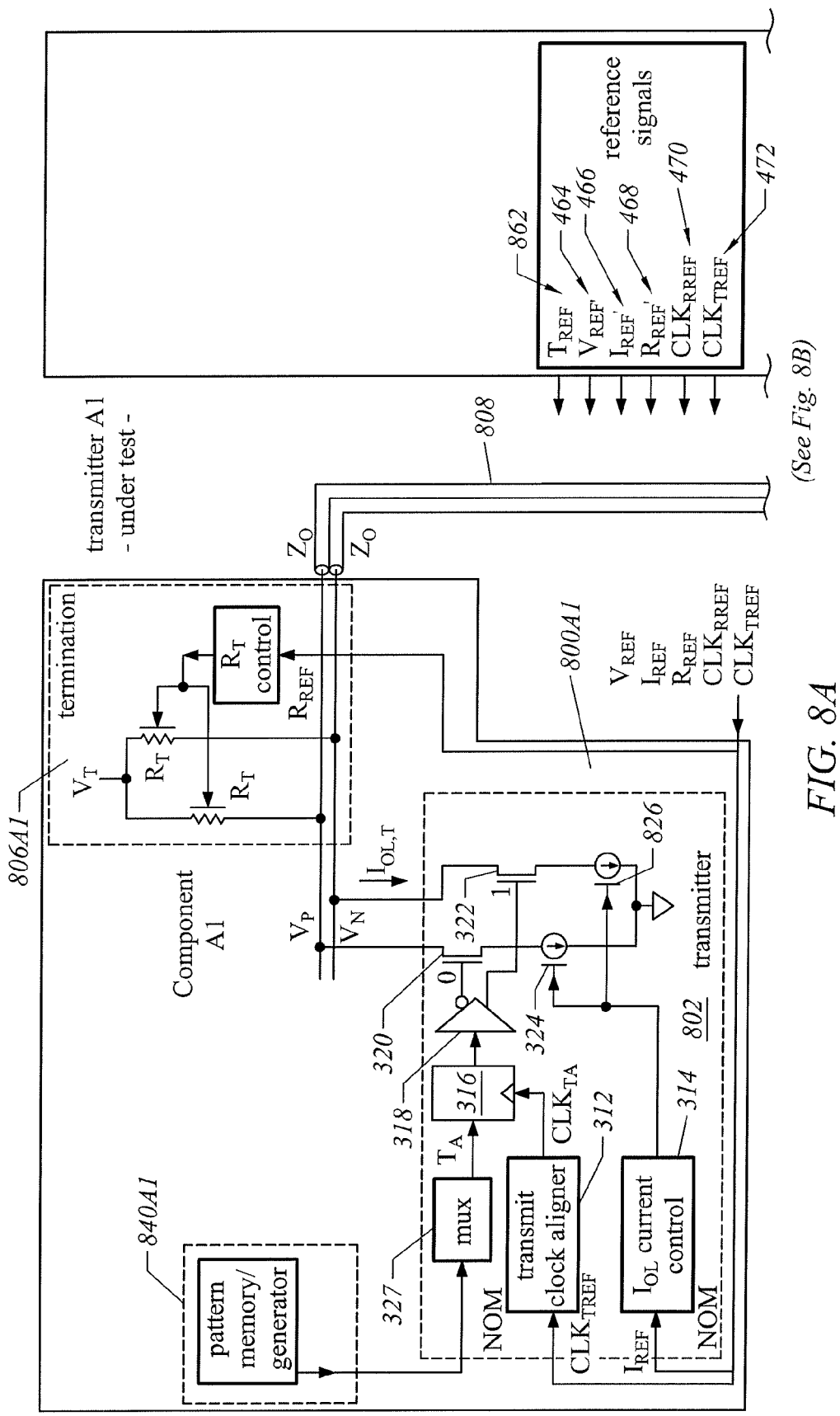
FIGS. 8A-B are block diagrams of portions of two components configured to test each other with parameters of respective components being uncoupled according to one embodiment.
Figure 8B:
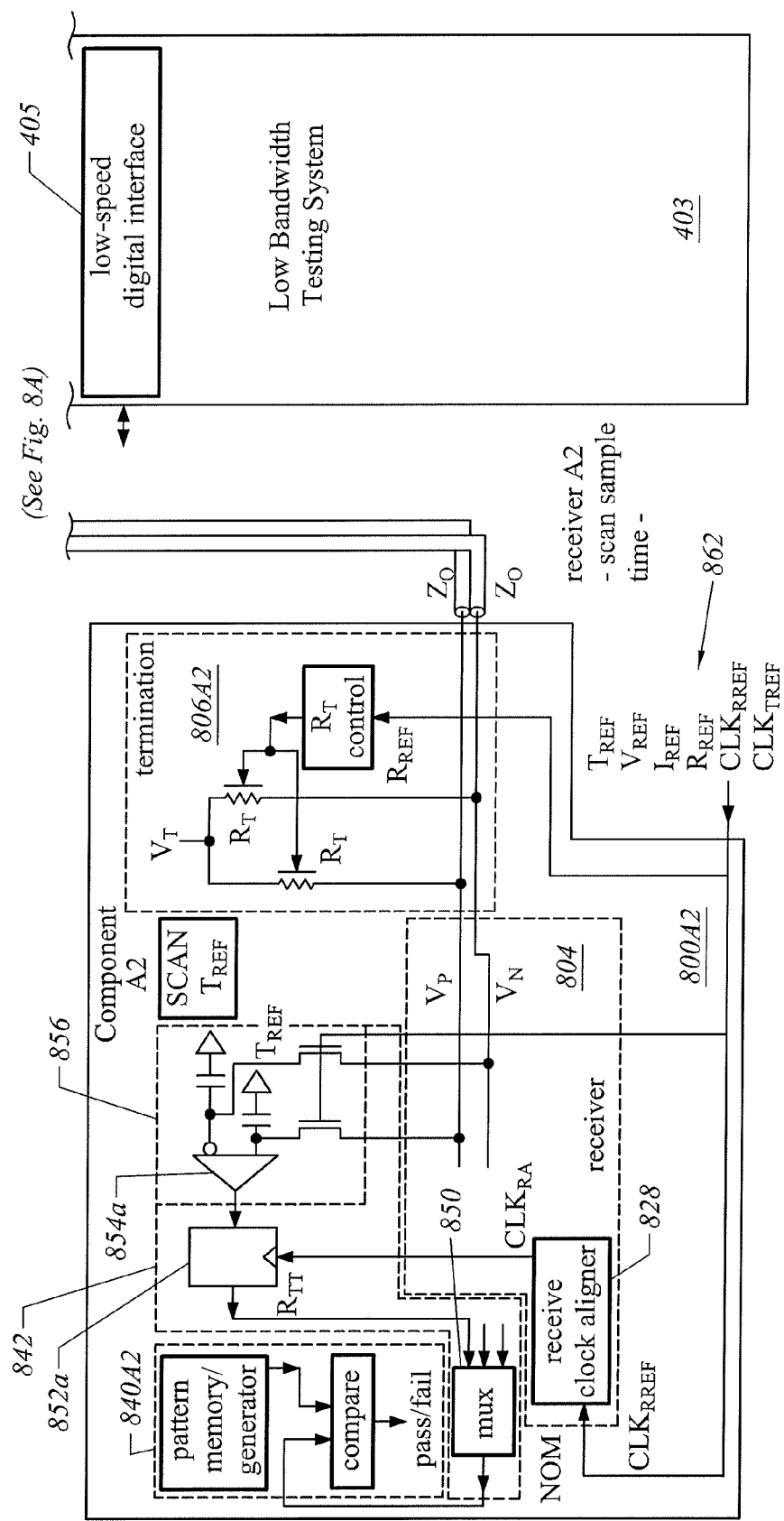

FIGS. 8A-B are block diagrams of an embodiment in which an analog sampling circuit is used in a transmitter timing test. FIGS. 8A-B are similar to the previous FIGS. 4A-B, except that the scanning for the output voltage levels has been suppressed, and the time scanning is now being performed on the T$_{REF}$ 862 signal instead of the CLK$_{RREF}$ 470 signal. The CLK$_{RREF}$ 470 signal is placed at a nominal value so that it does not interfere with the determination of the transmitter timing parameters.

An interface 800A1 and an interface 800A2 are shown coupled by an interconnect 808. The interconnect 808 is not coupled to the low bandwidth testing system 403. The interfaces 800A1 and 800A2, however, receive signals from the low bandwidth testing system 403. The low bandwidth testing system 403 produces the reference signals V$_{REF}$ 464, I$_{REF}$ 466, R$_{REF}$ 468, CLK$_{RREF}$ 470, and CLK$_{TREF}$ 472, as previously described. The low bandwidth test system also produces a T$_{REF}$ 862 signal that is received by the test circuit 842 of the interface 800A2 on the component A2. In the embodiment shown, the transmitter 802 of the interface 800A1 is under test. Only portions of the interfaces 800A1 and 800A2 that are pertinent to the following test example are shown. The interface 800A1 includes the transmitter 802, a termination block 806A1, and a test circuit 840A1. The interface 800A2 includes a receiver 804, a termination block 806A2, a test circuit 840A2, and a test circuit 842. The test circuit 842 is similar to the test circuit 342, but here only pertinent portions of the test circuit 842 are shown for the example, including an analog sampling circuit 856, a differential comparator 854a, a register 852a, and a multiplexer 850.

The analog sampling circuit 856 is operated as a timing gate in front of the normal testing sampler (the R$_{TT}$ register 852a clocked by CLK$_{RREF}$ 470). As mentioned earlier, the normal testing sampler (the R$_{TT}$ register 852a) also has a relatively narrow setup and hold window relative to the CLK$_{RA}$ signal, but the receive clock aligner 828 adds a great deal of uncertainty to the position of the CLK$_{RA}$ signal relative to the CLK$_{RREF}$ 470 signal because of process, voltage, and temperature variations. Also, the differential comparator 854a adds a great deal of uncertainty to the position of the input signal to register 852a signal relative to the CLK$_{RA}$ signal because of process, voltage, and temperature variations Placing the analog sampling circuit 856 before the differential comparator 854a and register 852a avoids much of this variation.

In one embodiment (not shown), the receiver 804 is duplicated, with one receiver being used for normal operation, and the other being used for evaluation as described further below.

Uncoupled Transmitter Parameter Test—Time Scanning

Figure 9:
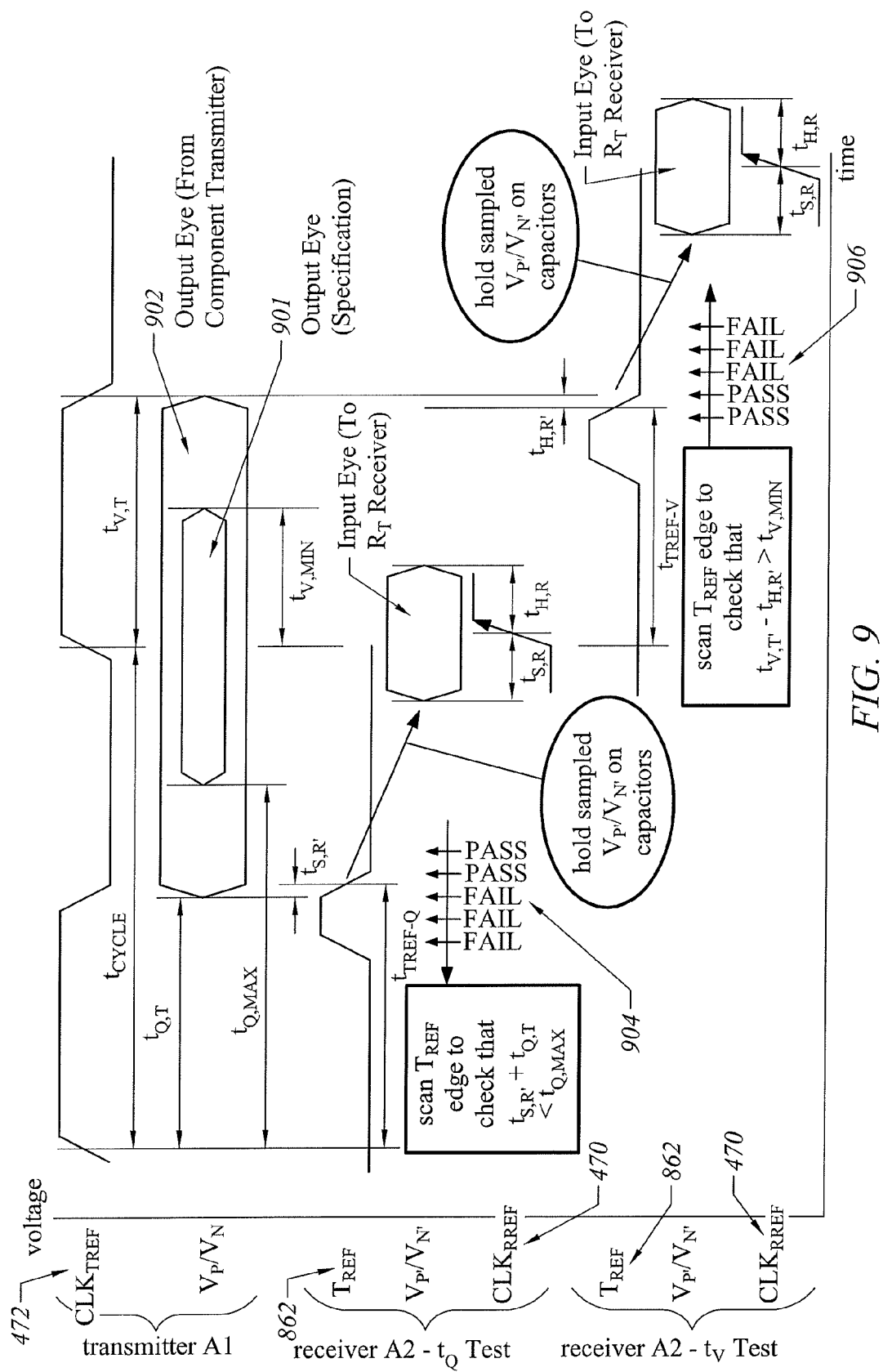
FIG. 9 is a timing diagram illustrating a transmitter testing operation using the embodiment of FIG. 8.

The operation of the embodiment of FIGS. 8A-B will be further described with reference to FIG. 9, which is a diagram showing the voltage values for the signals on a number of interconnects as a function of time during the test of the transmitter 802. FIG. 9 shows an actual output-eye-from-component-transmitter ("Output Eye (From Component Transmitter)") region 902, and a specification-output-eye ("Output Eye (Specification)") region 901. The output-eye-from-component-transmitter region 902 is the "actual" output eye of the transmitter under test. A successful test of the transmitter 802 should verify that the specification-output-eye 901 is smaller than the output-eye-from-component-transmitter 902. The voltage signals listed on the left from the top of the diagram are as follows: signals CLK$_{TREF}$ 472 and V$_P$/V$_N$ associated with the transmitter 802, the T$_{REF}$ 862, V$_P$/V$_{N'}$, and CLK$_{RREF}$ 470 signals associated with finding the t$_{Q,T}$ value for the transmitter 802, and the T$_{REF}$ 862, V$_P$/V$_{N'}$, and CLK$_{RREF}$ 470 signals associated with finding the t$_{V,T}$ values for the transmitter 802. The t$_{Q,T}$ and t$_{V,T}$ values define the output-eye-from-component-transmitter region 902.

The CLK$_{TREF}$ 472 signal is used as a timing reference. The CLK$_{TREF}$ 472 signal generates the output-eye-from-component-transmitter region 902 whose left boundary is at time t$_{Q,T}$ after the rising edge of CLK$_{TREF}$ 472, and whose right boundary is at time t$_{V,T}$ after the next rising edge of CLK$_{TREF}$ 472. These two boundaries are scanned by the T$_{REF}$ 862 signal.

The falling edge of the T$_{REF}$ 862 signal is adjusted to occur at a time t$_{TREF\text{-}Q}$ after the rising edge of the CLK$_{RREF}$ signal. Then the following equation will be true:

$$t_{TREF\text{-}Q} = t_Q + t_{S,R'} \qquad \text{Equation 27}$$

The t$_{TREF\text{-}Q}$ value is then scanned from the passing time (t$_{Q,MAX}$+t$_{S,R'}$) to a point 904 just past time (t$_{Q,T}$+t$_{S,R'}$) where it fails. Here the parameter t$_{S,R'}$ is the time needed to setup the analog sampling circuit. This parameter is relatively small, and will not vary much as a function of process, temperature and voltage. The $t_{Q,T}$ parameter will be equal to:

$$t_{Q,T} = t_{TREF-Q} - t_{S,R'}\qquad\text{Equation 28}$$

Where $t_{TREF-Q}$ is the offset of the $T_{REF}$ 862 signal at the last passing scan point. The range of $t_{S,R'}$ is known from characterization, and its minimum value can be subtracted from $t_{TREF-Q}$. This determines $t_{Q,T}$. Because the sum of $(t_{S,R}+t_{Q,T})$ is known from the earlier testing, the value of $t_{S,R}$ can be determined.

During this scanning process, the $CLK_{RREF}$ 470 signal has been set to a value that guarantees that the output of the differential comparator has settled ahead of the $t_{S,R}$ setup time of the $R_{TT}$ register 852a. The capacitors of the analog sampling circuit 856 hold the sampled $V_P/V_N$ voltage values during this interval, as shown at 1011. This allows the $T_{REF}$ 862 signal to determine the sampling point rather than the $CLK_{RREF}$ 470 signal (with its greater variability).

If the component under test allows the internal $CLK_{RA}$ and $CLK_{TA}$ clock frequencies to be an integer multiple of the $CLK_{RREF}$ 470 and $CLK_{TREF}$ 472 clock frequencies (not shown in this example), then more than one bit can be transferred between transmitter and receiver during each $t_{CYCLE}$ interval. In this case, it is likely that the $T_{REF}$ 862 signaling rate will be limited to the same rate as the $CLK_{RREF}$ 470 and $CLK_{TREF}$ 472 clock signals; a rising edge and a falling edge in each $t_{CYCLE}$ interval. In this case, scanning the $T_{REF}$ 862 signal can check only one of the output-eye regions in each tCYCLE interval. In this situation, masking logic can be added to the compare logic of the test circuit 840A2.

The masking logic will allow only one bit in each $t_{CYCLE}$ interval to be checked, and the rest ignored. However, the other bits of the interval can be checked (one at a time) by adjusting the masking logic and the offset of the $T_{REF}$ 862 signal. For example, if four bits are transferred in each $t_{CYCLE}$ interval, then the scanning process described with reference to FIG. 9 is repeated four times. During each of the four iterations, one out of every four of the bits $R_{TT}$ (from the register 852a) would be compared in the test circuit 840A2. Between each iteration, the $t_{TREF-Q}$ value is shifted by $t_{CYCLE}/4$. In this way, every bit of every pattern is checked to ensure that the worst case $t_{Q,T}$ value is found. This can be done without requiring a tester that generates high-speed signals; the tester is required to only generate signals with timing events that are accurately positioned. This will be described in more detail with FIG. 23B.

Referring now to the lower portion of FIG. 9, finding the $t_{V,T}$ value using a similar scanning process is illustrated. The falling edge of the $T_{REF}$ 862 signal is adjusted to occur at a time $t_{TREF-V}$ after the rising edge of the $CLK_{RREF}$ 470 signal. The following equation will be true:

$$t_{TREF-V} = t_V - t_{H,R'}\qquad\text{Equation 29}$$

The $t_{TREF-V}$ value is then scanned from the passing time $(t_{V,MIN} - t_{H,R'})$ to just past the time $(t_{V,T} - t_{H,R'})$ where it fails. Here the parameter $t_{H,R'}$ is the time needed to hold an input to the analog sampling circuit. This parameter is small, and will not vary much as a function of process, temperature and voltage. The $t_{V,T}$ parameter is defined as:

$$t_{V,T} = t_{TREF-V} + t_{H,R'}\qquad\text{Equation 30}$$

Where $t_{TREF-V}$ is the offset of the $T_{REF}$ 826 signal at the last passing scan point before a fail point 906. The range of $t_{H,R'}$ is known from characterization, and its minimum value can be subtracted from $t_{TREF-V}$. This determines $t_{V,T}$. Because the difference of $(t_{H,R} - t_{V,T})$ is known from the earlier testing, the value of $t_{H,R}$ can be determined. During this scanning process, the $CLK_{RREF}$ 470 signal is set to a value that guarantees that the output of the differential comparator 854a has settled ahead of the $t_{S,R}$ setup time of the $R_{TT}$ register 852a. The capacitors of the analog sampling circuit 856 hold the sampled $V_P/V_N$ voltage values during this interval. This allows the $T_{REF}$ 862 signal to determine the sampling point rather than the $CLK_{RREF}$ 470 signal (with its greater variability).

If the component allows the internal $CLK_{RA}$ and $CLK_{TA}$ clock frequencies to be an integer multiple of the $CLK_{RREF}$ 470 and $CLK_{TREF}$ 472 clock frequencies (not shown in this example), then more than one bit can be transferred between transmitter and receiver during each $t_{CYCLE}$ interval. In this case, it is likely that the $T_{REF}$ 862 signaling rate will be limited to the same rate as the $CLK_{RREF}$ 470 and $CLK_{TREF}$ 472 clock signals; a rising edge and a falling edge in each $t_{CYCLE}$ interval. In this case, scanning the $T_{REF}$ 862 signal can check only one of the output-eye regions in each tCYCLE interval. In this situation, masking logic can be added to the compare logic of the test circuit 840A2.

The masking logic will allow only one bit in each $t_{CYCLE}$ interval to be checked, and the rest ignored. However, the other bits of the interval can be checked (one at a time) by adjusting the masking logic and the offset of the $T_{REF}$ 862 signal.

For example, if four bits are transferred in each $t_{CYCLE}$ interval, then the scanning process described for FIG. 9 is repeated four times. During each of the four iterations, a different one out of every four of the bits $R_{TT}$ (from the register 852a) would be compared in test circuit 840A2. Between each iteration, the $t_{TREF-Q}$ value would be shifted by $t_{CYCLE}/4$. In this way, every bit of every pattern is checked to ensure that the worst case $t_{V,T}$ value is found. And this can be done without high-speed signals generated by a high-speed tester; the tester is required to only generate signals with timing events that are accurately positioned. This will be described in more detail with FIG. 23B.

Uncoupled Receiver Parameter Test—Time Scanning

Figure 10:
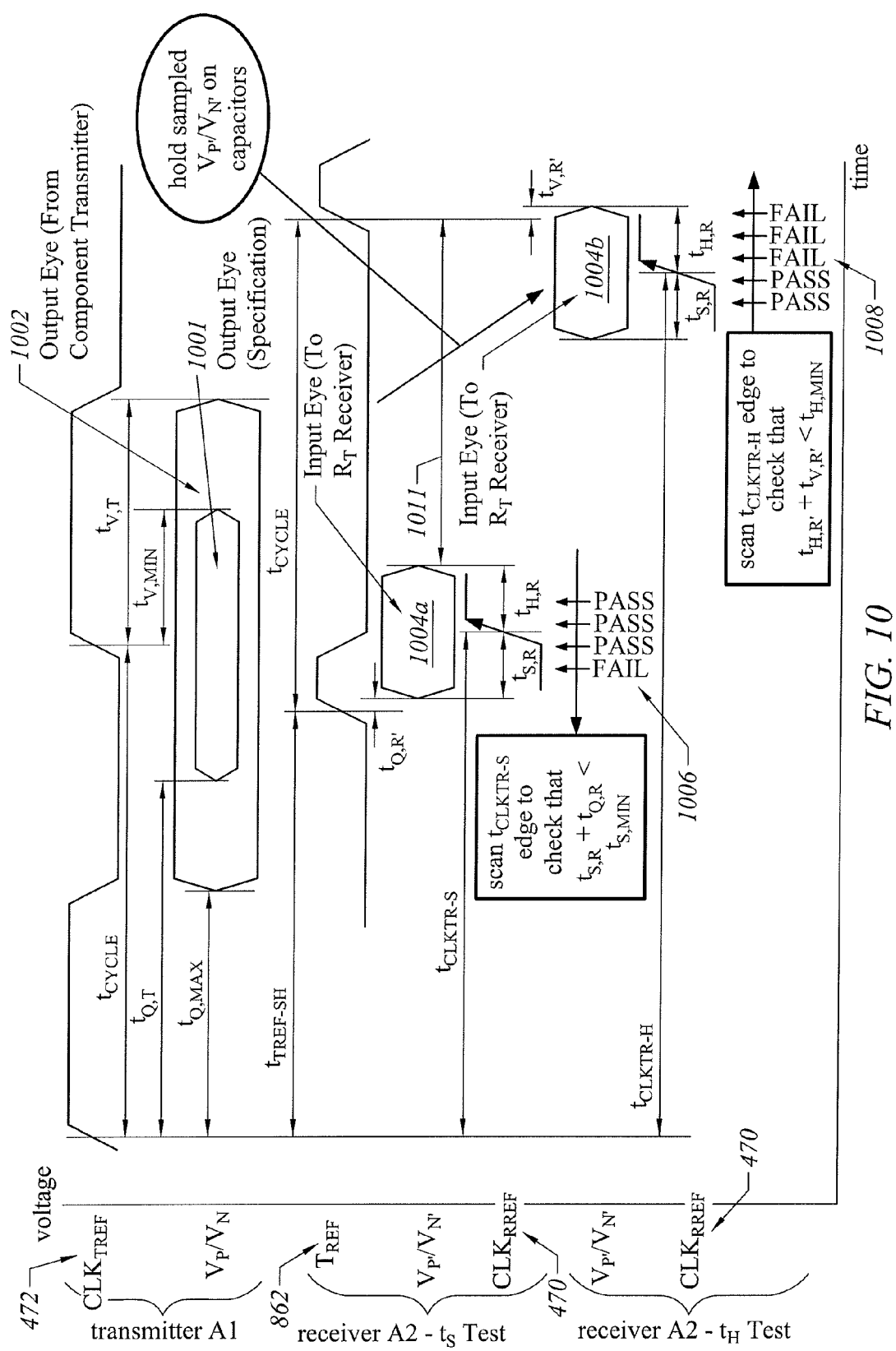
FIG. 10 is a timing diagram illustrating a receiver testing operation using the embodiment of FIG. 8.

FIG. 10 shows the timing waveforms used for determining the receiver timing parameters using the embodiment of FIGS. 8A-B. It is similar to FIG. 5, except that both the $T_{REF}$ signal and $CLK_{TREF}$ signal are placed at nominal values so that they do not interfere with the determination of the receiver timing parameters. The $CLK_{RREF}$ 470 signal is scanned in order to determine the receiver parameters. The $CLK_{TREF}$ 472 signal generates an output-eye-from-component-transmitter region 1002 whose left boundary is at time $t_{Q,T}$ after the rising edge of $CLK_{TREF}$ 472, and whose right boundary is at time $t_{V,T}$ after the next rising edge of $CLK_{TREF}$ 472. These two boundaries are scanned by the $T_{REF}$ 862 signal to determine the actual receiver input eye 1004.

First, the rising edge of the $T_{REF}$ 862 signal is adjusted to occur at a time $t_{TREF-SH}$ after the rising edge of the $CLK_{TREF}$ 472 signal. This is a point within the specification-output-eye 1001. The falling edge of the $T_{REF}$ 862 signal is adjusted to occur within the specification-output-eye 1001. The $CLK_{RREF}$ 470 signal is adjusted to occur at a time $t_{CLKTR-S}$ after the rising edge of the $CLK_{TREF}$ 472 signal. Then the following equation will be true:

$$t_{TREF-SH} + t_{Q,R'} = t_{CLKTR-S} - t_{S,R}\qquad\text{Equation 31}$$

or $$t_{CLKTR-S} = t_{TREF-SH} + t_{Q,R'} + t_{S,R}\qquad\text{Equation 32}$$

Where $t_{Q,R'}$ is the output delay of the analog sampling circuit 856 (the maximum time from the rising edge of $T_{REF}$ to $V_P/V_{N'}$ valid). This parameter is relatively small, and will not vary much as a function of process, temperature and voltage. Then the $t_{CLKTR-S}$ value is scanned (decreasing values) from the passing time ($t_{TREF-SH}t_{Q,R}+t_{S,MIN}$) to a point 1006 just past time ($t_{TREF-SH}t_{Q,R}+t_{S,R}$) where it fails. At the last passing value of $t_{CLKTR-S}$ the $t_{S,R}$ parameter will be equal to:

$$t_{S,R}=t_{CLKTR-S}-t_{TREF-SH}-t_{Q,R'} \quad \text{Equation 33}$$

The range of $t_{Q,R'}$ is known from characterization, and its minimum value can be subtracted from $t_{CLKTR-S}-t_{TREF-SH}$. This determines $t_{S,R}$. Because the sum of ($t_{S,R}+t_{Q,T}$) is known from the earlier testing, the value of $t_{Q,T}$ can be determined.

During this scanning process, the rising edge of the $T_{REF}$ 862 signal is set to a value that guarantees that the output ($V_P/V_{N'}$) of the analog sampling circuit 856 has settled after the input ($V_P/V_N$) is known to be valid. The capacitors of the analog sampling circuit hold the $V_P/V_{N'}$ voltage at their previous values, prior to the rising edge. This allows the $T_{REF}$ 862 signal to determine the driving point rather than the $CLK_{TREF}$ 472 signal (with its greater variability). If the component allows the internal $CLK_{R4}$ and $CLK_{T4}$ clock frequencies to be an integer multiple of the $CLK_{RREF}$ 470 and $CLK_{TREF}$ 472 clock frequencies (not shown in this example), then more than one bit can be transferred between transmitter and receiver during each $t_{CYCLE}$ interval. In this case, it is likely that the $T_{REF}$ 862 signaling rate will be limited to the same rate as the $CLK_{RREF}$ 470 and $CLK_{TREF}$ 472 clock signals; a rising edge and a falling edge in each $t_{CYCLE}$ interval. In this case, scanning the $T_{REF}$ 862 signal can check only one of the output eye regions in each tCYCLE interval. In this situation, masking logic can be added to the compare logic of the test circuit 840. The masking logic will allow only one bit in each $t_{CYCLE}$ interval to be checked, and the rest ignored. However, the other bits of the interval can be checked (one at a time) by adjusting the masking logic and the offset of the $T_{REF}$ 862 signal.

For example, if four bits were transferred in each $t_{CYCLE}$ interval, then the scanning process described for FIG. 10 would be repeated four times. During each of the four iterations, one out of every four of the bits $R_{TT}$ register 852a would be compared in the test circuit 840A2. Between each iteration, the $t_{TREF-SH}$ value would be shifted by $t_{CYCLE}/4$. In this way, every bit of every pattern could be checked to ensure that the worst case $t_{S,R}$ value was found. This can be done without high-speed signals generated by a high-speed tester; the tester is required to only generate signals with timing events that are accurately positioned. This will be described in more detail with FIG. 23B.

Referring now to the lower portion of FIG. 10, finding the $t_{H,R}$ value using a similar scanning process is illustrated. The rising and falling edges of the $T_{REF}$ 862 signal remain in their same places within the specification-output-eye 1001. However, since the hold time $t_{H,R}$ of the receiver $R_T$ is to be evaluated, the rising edge of the $CLK_{RREF}$ 470 signal is adjusted to occur at approximately a time $t_{H-MIN}$ before the next rising edge of the $T_{REF}$ 862 signal. The right boundary of the input-eye 1004 of receiver $R_T$ is to hold the output ($V_P/V_{N'}$) of the analog sampling circuit 856 before it is replaced by the new data after the next rising edge of $T_{REF}$ 862. Then the following equation will be true:

$$t_{CLKTR-H}+t_{H,R}=t_{TREF-SH}+t_{CYCLE}+t_{V,R'} \quad \text{Equation 34}$$

or $$t_{CLKTR-H}=t_{TREF-SH}+t_{CYCLE}+t_{V,R}-t_{H,R} \quad \text{Equation 35}$$

Then the $t_{CLKTR-H}$ value is scanned (increasing values) from the passing time ($t_{TREF-SH}+t_{CYCLE}+t_{V,R'}-t_{H,MIN}$) to point 1008 just past the time ($t_{TREF-SH}+t_{CYCLE}+t_{V,R}-t_{H,R}$) where it fails. Here the parameter $t_{V,R'}$ is the time that the output ($V_P/V_{N'}$) of the analog sampling circuit 856 remains valid after the rising edge of $T_{REF}$.862. This parameter is relatively small, and will not vary much as a function of process, temperature and voltage. The $t_{H,R}$ parameter will be equal to:

$$t_{H,R}=t_{TREF-SH}+t_{CYCLE}+t_{V,R}-t_{CLKTR-H} \quad \text{Equation 36}$$

Where $t_{CLKTR-H}$ is the offset of the $CLK_{RREF}$ 470 signal at the last passing scan point. The range of $t_{V,R'}$ is known from characterization, and its maximum value can be added to $t_{TREF-SH}+t_{CYCLE}-t_{CLKTR-H}$. This determines $t_{H,R}$. Because the difference of ($t_{H,R}-t_{V,T}$) is known from the earlier testing, the value of $t_{V,T}$ can be determined.

During this scanning process, the $CLK_{TREF}$ 472 signal has been set to a value that ensures that the output $V_P/V_{N'}$ of the analog sampling circuit is valid during the input-eye 1004 of the $R_T$ register. The capacitors of the analog sampling circuit 856 hold the $V_P/V_{N'}$ voltage values during much of this interval. This allows the $T_{REF}$ 862 signal to determine the driving point rather than the $CLK_{TREF}$ 472 signal (with its greater variability).

If the component allows the internal $CLK_{R4}$ and $CLK_{T4}$ clock frequencies to be an integer multiple of the $CLK_{RREF}$ 470 and $CLK_{TREF}$ 472 clock frequencies (not shown in this example), then more than one bit can be transferred between transmitter and receiver during each $t_{CYCLE}$ interval. In this case, it is likely that the $T_{REF}$ 862 signaling rate will be limited to the same rate as the $CLK_{RREF}$ 470 and $CLK_{TREF}$ 472 clock signals; a rising edge and a falling edge in each $t_{CYCLE}$ interval. In this case, scanning the $T_{REF}$ 862 signal can check only one of the output-eye regions in each tCYCLE interval. In this situation, masking logic can be added to the compare logic of test circuit 840A2. The masking logic will allow only one bit in each $t_{CYCLE}$ interval to be checked, and the rest ignored. However, the other bits of the interval can be checked (one at a time) by adjusting the masking logic and the offset of the $T_{REF}$ 862 signal.

For example, if four bits were transferred in each $t_{CYCLE}$ interval, then the scanning process described for FIG. 10 would be repeated four times. During each of the four iterations, a different one out of every four of the bits $R_T$ would be compared in the test circuit 840. Between each iteration, the $t_{TREF-SH}$ value would be shifted by $t_{CYCLE}/4$. In this way, every bit of every pattern is checked to ensure that the worst case $t_{V,T}$ value is found. This can be done without high-speed signals generated by a high-speed tester; the tester is required to only generate signals with timing events that are accurately positioned. This will be described in more detail with FIG. 23B.

The previous figures and text have described embodiments that permit component interface circuitry to perform all of the normal high-speed testing and characterization on itself, reducing the performance requirements of the external test system significantly. The embodiments were described with reference to specific interface examples that illustrate some possible circuit enhancements that provide these benefits. Specifically, the example interface used the following circuit and signaling techniques:

Open-drain, pull-down (unipolar) drivers in the transmitter circuit

Differential signals (two interconnects per signal)

Current calibrated signaling with calibration to external reference value

No slew rate control in the transmitter circuit
Two transmitters needed for full receiver circuit test
One bit transferred per clock cycle
External reference values used for calibration of internal circuit elements
  PLL or DLL used for transmit and receive clock alignment
  Separate external reference signals for transmit and receive clocks
Internal termination elements with calibration to external reference value
Bidirectional signals
Point-to-point interconnect topology
Two element symbol set (bits)

Each of these circuit and signaling techniques could be modified in other embodiments to use alternate techniques. In some cases, the variation could have an effect upon the previously described circuit and procedural enhancements that improve the ability to evaluate a component. The following sections will refer to previously described embodiments and describe alternative embodiments. Any of these alternatives can be combined with any of the others to realize the advantages of the resulting embodiments.

Interface Variation—Push-Pull (Bipolar) Drivers

Figure 11:
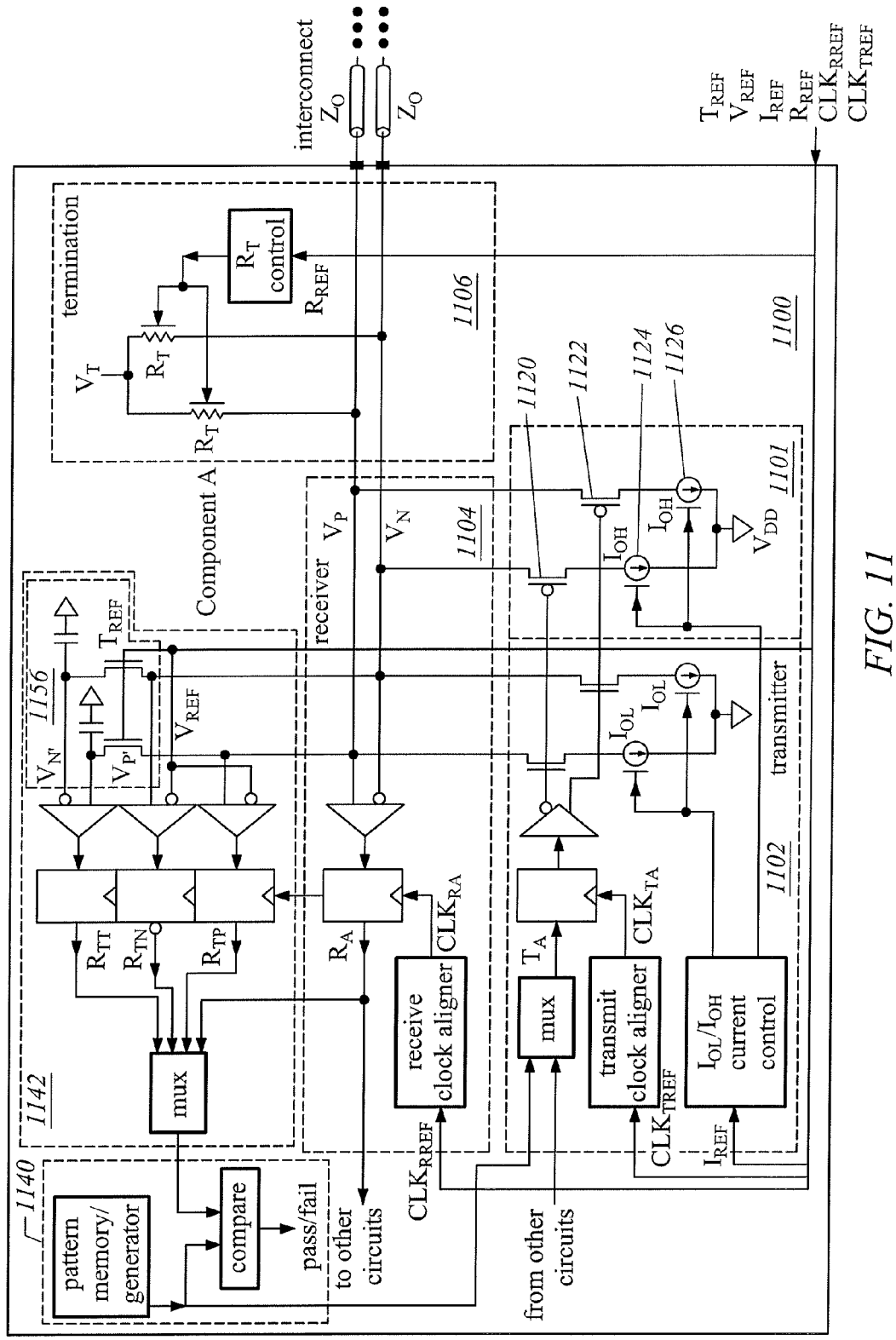
FIG. 11 is a block diagram of an embodiment with bipolar drivers.

FIG. 11 shows one way in which the pull-down drivers of the previous examples could be converted to push-pull drivers. Note that the terms "unipolar" and "bipolar" are sometimes used to refer to these driver classifications (these terms are also used to refer to transistor classifications), but they will not be so used here. An interface 1100 is shown. The interface 1100 includes a transmitter 1102, a receiver 1104, a termination block 1106, a test circuit 1140, and a test circuit 1142. The test circuit 1142 includes an analog sampler 1156. The interface 1100 further includes additional circuitry 1101 that includes driver elements 1120 and 1122 and current source elements 1124 and 1126. The resulting push-pull driver arrangement creates a high voltage by pushing current through the resistive load of the termination block 1106.

In an alternate embodiment, the two current source elements 1124 and 1126 could be merged into a single current source element, with one terminal connecting to the high supply voltage (VDD) and the other terminal connecting to the source terminals of the two driver elements 1120 and 1122. This will be equivalent to the circuit shown in transmitter block 1101 since only one of the two driver elements 1120 and 1122 may be on at any time.

Interface Variation—Single-Ended Signals

Figure 12:
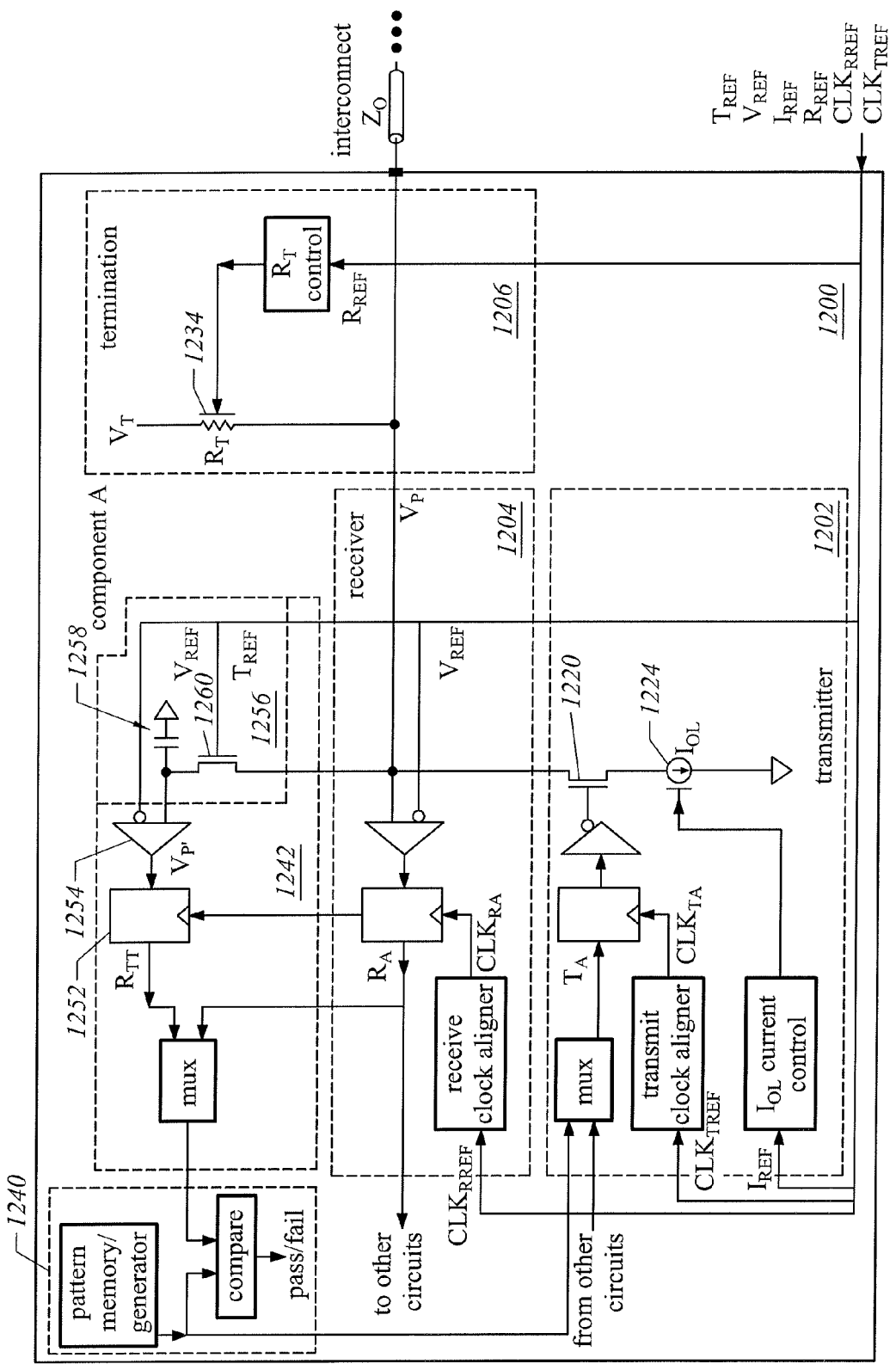
FIG. 12 is a block diagram of an embodiment with single-ended signals.

FIG. 12 shows a single-ended signaling embodiment of a high-speed component interface 1200. The high-speed component interface 1200 includes a transmitter 1202, a receiver 1204, a termination block 1206, a test circuit 1240, and a test circuit 1242. For the single-ended signaling embodiment, circuit elements present in previous embodiments are eliminated from the transmitter 1202, the test circuit 1242, and the termination block 1206.

The transmitter 1202 includes one output driver 1220 and one current source 1224, rather than having two of each. The test circuit 1242 includes only one differential comparator, differential comparator 1254, which receives a $V_{REF}$ signal as well as an output of an analog sampling circuit 1256. The $V_{REF}$ signal is not just used for testing in this embodiment, but is also used during normal operation as a voltage reference for the receiver 1204 (which drives the $R_A$ signal) and the register 1252. The register 1252 drives the $R_T$ signal and is gated by the analog sampling circuit 1256. The analog sampling circuit 1256 is halved with respect to previously described analog sampling circuits, and includes only one transistor 1260 connected to $T_{REF}$, and one capacitor 1258. The $V_{REF}$ signal is typically set to a value midway between $V_{IH}$ and $V_{IL}$ for normal operation, but can be adjusted by an external tester during test and characterization. The termination block 1206 includes only one termination load resistor 1234. The receiver 1204 and the test circuit 1240 are similar to those corresponding elements in previously described embodiments.

Interface Variation—Calibrated Driver Alternatives

Figure 13:
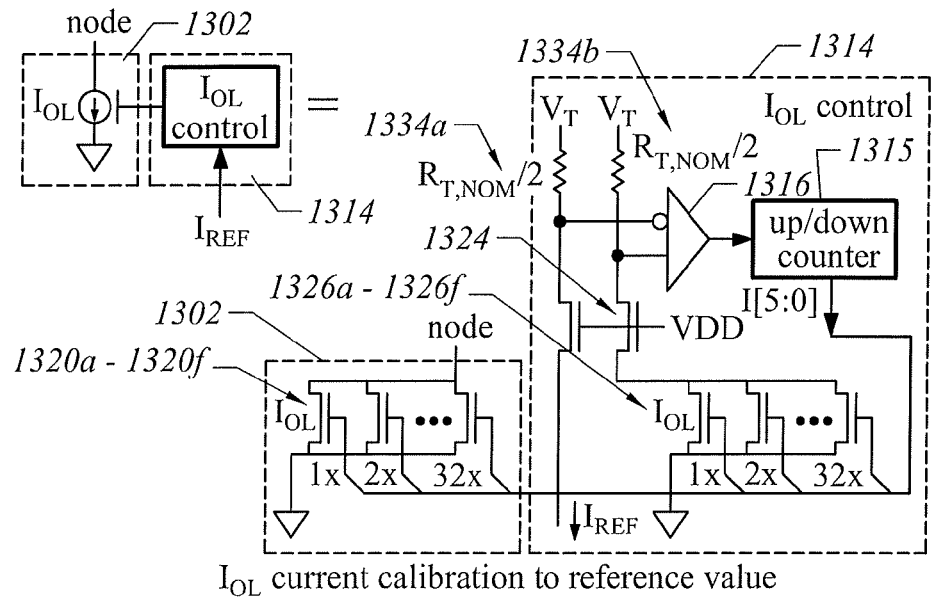
FIG. 13 is a block diagram of an embodiment of $I_{OL}$ current control.

FIG. 13 is a block diagram showing one way to implement an $I_{OL}$ current control, such as the $I_{OL}$ current control element 314 of FIG. 3. FIG. 13 is a block diagram of an embodiment of an $I_{OL}$ current control 1314 used to control a current source $I_{OL}$ 1302 like the current source elements 324 and 326 of FIG. 3. A reference current $I_{REF}$ is provided externally, and connects to one terminal of a load $R_{T,NOM}$ 1334a, which has the other terminal connected to $V_T$. The current control 1314 includes six transistors, 1326a-1326f, with binary-scaled widths. They are connected in parallel between ground and one terminal of a second load $R_{T,NOM}$ 1334b, which also has the other terminal connected to $V_T$. The voltages on one terminal of each of the $R_{T,NOM}$ loads are compared by a differential voltage comparator 1316. The output of the voltage comparator 1316 controls an up/down counter 1315 whose six bit value I[5:0] controls the gates of the six scaled transistors 1326a-1326b. The counter value I[5:0] is adjusted until the $I_{REF}$ and $I_{OL}$ values are approximately the same. The counter value I[5:0] is also used by other copies of the $I_{OL}$ current source, such as the current source that includes the six transistors 1320a-1320f. The value of the load $R_{T,NOM}$ is not critical, but should fall within a nominal $R_T$ range. It is not necessary to provide a calibrated termination. In fact convergence problems might result if $R_T$ control circuitry and $I_{OL}$ control circuitry interacted.

The value of the up/down counter 1315 is normally updated when the system is powered on. With calibration of the I[5:0] value at system initialization, the difference between $I_{REF}$ and $I_{OL}$ due to manufacturing process variations between components can be made very small. The value of the up/down counter 1315 can also be updated between intervals of normal system operation. With periodic calibration of the I[5:0] value, the difference between $I_{REF}$ and $I_{OL}$ due to temperature and supply voltage variations can also be made very small. Other alternative circuits are possible. For example, the current source $I_{OL}$ 1302 element could be a single transistor whose gate voltage is varied to adjust its current value. Or the $I_{OL}$ elements could be built from PMOS transistors instead of NMOS transistors, as shown. The reference value could be a resistance value or a voltage value instead of a current value. These alternative circuits would all share the following characteristics, however. An external reference value is provided, control circuitry adjusts a generated value to match the reference value, and the generated value can be replicated throughout the component.

Figure 14:
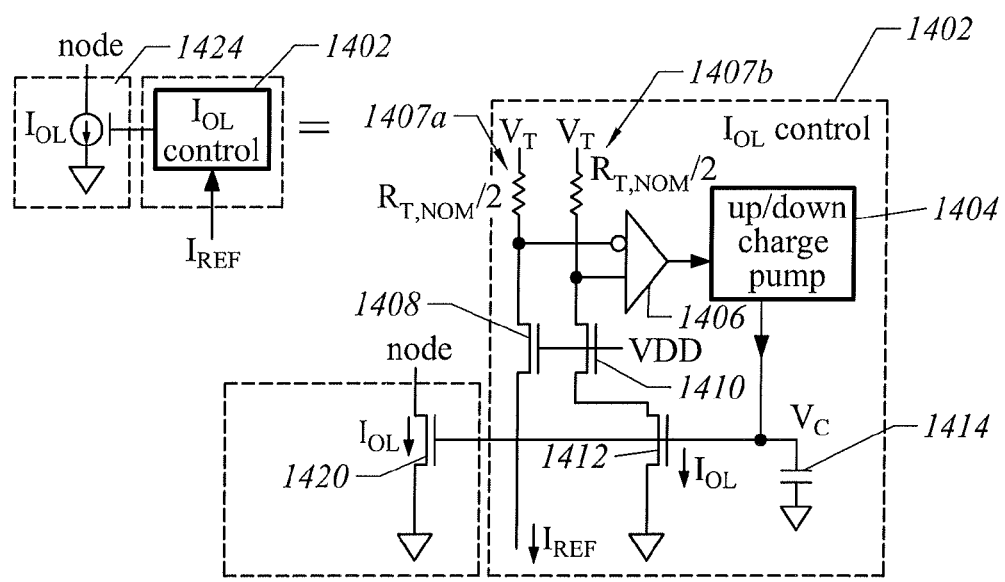
FIG. 14 is a block diagram of an embodiment of $I_{OL}$ current control.

In another embodiment, adjusting the current through the output driver structure involves changing the voltage on the gate of the calibrated device rather than turning on a subset of device segments (scaled transistors) with a digital control value, as shown in FIG. 13. An example of such an embodiment is shown in FIG. 14. FIG. 14 shows a current source 1424 controlled by a control circuit 1402. The $I_{OL}$ control circuit 1402 includes an up/down charge pump 1404, load devices 1407a and 1407b, a comparator 1406, transistors 1408 1410, and 1412, and a capacitor 1414. A control value $V_C$ is maintained in the form of an analog voltage, which changes the amount of current the calibrated device 1420 can sink. This is an alternative to a six bit digital value I[5:0] that indicates which of several binary weighted transistors are on.

This control voltage approach could be used with either an external current reference or an external voltage reference.

Figure 15:
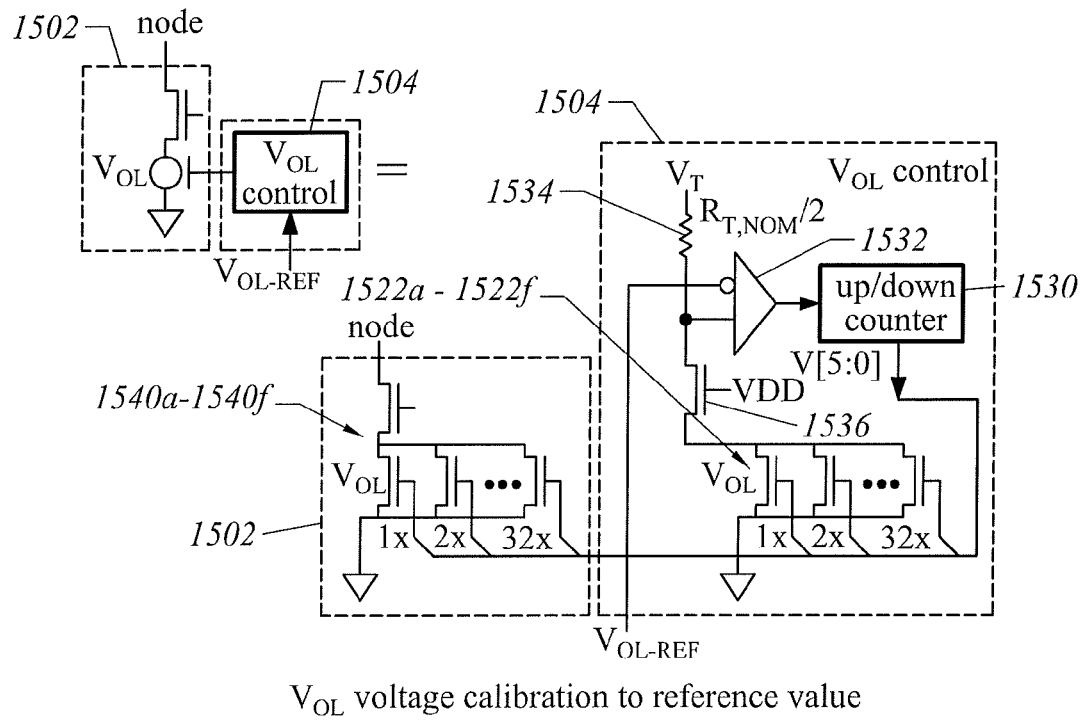
FIG. 15 is a block diagram of an embodiment of $V_{OL}$ voltage control.

The use of a calibrated output driver with an external reference value is one of the features that permit receiver and transmitter circuits of a component to test one another. Changing the external reference value changes the output voltage levels (and output current levels) of the driver, and permits the various voltage parameters of the transmitter and receiver to be tested. In previously described embodiments, a reference current $I_{REF}$ is used to specify the $I_{OL}$ sink current of an output driver. FIG. 15 shows an alternate embodiment in which a $V_{OL}$ output voltage value is used as a reference value ($V_{OL-REF}$). This may be an easier reference signal to generate in a test environment, particularly since it must be swept across a range of values for receiver testing. FIG. 15 is a block diagram of pertinent circuit elements of such an embodiment. FIG. 15 shows an output driver structure 1502 that includes a voltage source and an output driver. The output driver structure 1502 is coupled to a $V_{OL}$ control circuit 1504.

The control circuit 1504 includes six transistors, 1522a-1522f, with scaled widths. They are connected in parallel between ground and one terminal of a resistive load $R_{T,NOM}$ 1534, by way of transistor 1536, which has the other terminal connected to $V_T$. The voltage on one terminal of each of the resistive load $R_{T,NOM}$ 1534 load and an externally supplied voltage $V_{OL-REF}$ are compared by a voltage comparator 1532. The output of the voltage comparator 1532 controls an up/down counter 1530 whose six bit value V[5:0] controls the gates of the six scaled transistors 1522a-1522f. The counter value V[5:0] is adjusted until the $V_{OL-REF}$ and $V_{OL}$ values are approximately the same. The counter value V[5:0] is also used by other copies of the $V_{OL}$ current source, such as the current source that includes the six transistors 1540a-1540f. The value of the resistive load $R_{T,NOM}$ 1534 is not critical, but should fall within a nominal $R_T$ range. It is not necessary to provide a calibrated termination. In fact convergence problems might result if $R_T$ control circuitry and $V_{OL}$ control circuitry interacted.

The value of the up/down counter 1530 is normally updated when the system is powered on. With calibration of the V[5:0] value at system initialization, the difference between $V_{OL-REF}$ and $V_{OL}$ due to manufacturing process variations between components can be made small. The value of the up/down counter 1530 can also be updated between intervals of normal system operation. With periodic calibration of the V[5:0] value, the difference between $V_{OL-REF}$ and $V_{OL}$ due to temperature and supply voltage variations can also be made small. Other alternative circuits are possible. For example, the $V_{OL}$ elements (transistors 1540a-f and 1522a-f) could be a single transistor whose gate voltage is varied to adjust its current value. Or the $V_{OL}$ elements (transistors 1540a-f and 1522a-f) could be built from PMOS transistors instead of NMOS transistors, as shown. The reference value could be a resistance value or a current value instead of a voltage value.

Figure 16:
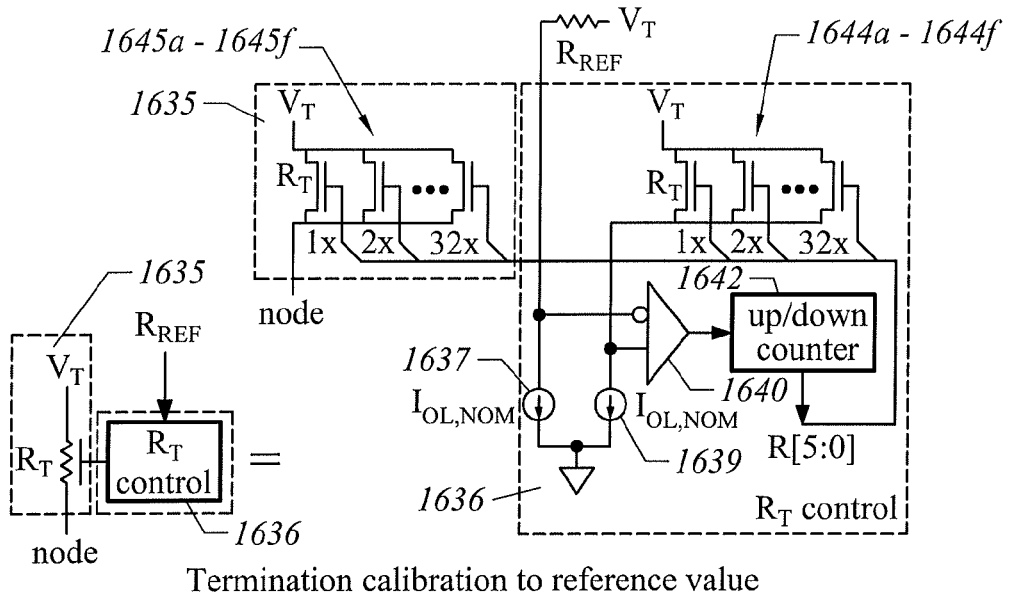
FIG. 16 is a block diagram of an embodiment of $R_T$ termination load control.

FIG. 16 is a block diagram of an embodiment of an $R_T$ control, such as the $R_T$ control element 336 of FIG. 3. The $R_T$ control 1636 is coupled to an adjustable resistive load arrangement 1635 consisting of a termination load $R_T$ and a termination voltage $V_T$. The $R_T$ control 1636 receives an externally supplied reference load $R_{REF}$, which has one terminal connected to $V_T$ and the other connected to a current source 1637 of value $I_{OL,NOM}$. The termination load $R_T$ consists of six transistors, 1644a-1644f, with scaled widths. They are connected in parallel between $V_T$ and a second current source 1639 of value $I_{OL,NOM}$. A voltage comparator 1640 compares the voltages on one terminal of $R_{REF}$ and $R_T$. The output of the voltage comparator 1640 controls an up/down counter 1642 whose six bit value R[5:0] controls the gates of the six scaled transistors 1644a-1644f. The counter value R[5:0] is adjusted until the $R_{REF}$ and $R_T$ values are approximately the same. The counter value R[5:0] is also used by other copies of the $R_T$ termination load, such as the transistors 1645a-1645f of the load arrangement 1635.

The value of the current source $I_{OL,NOM}$ is not critical. The current source need not be a calibrated current source. In fact, a calibrated current source may cause convergence problems if the $R_T$ control circuitry and $I_{OL}$ control circuitry interacted. It is only necessary to generate a current value that falls within the nominal $I_{OL}$ range. The value of the up/down counter 1642 is normally updated when the system is powered on. With calibration of the R[5:0] value at system initialization, the difference between $R_{REF}$ and $R_T$ due to manufacturing process variations between components is made very small. The value of the up/down counter 1642 can also be updated between intervals of normal system operation. With periodic calibration of the R[5:0] value, the difference between $R_{REF}$ and $R_T$ due to temperature and supply voltage variations is also made very small.

Other alternative circuits are possible. For example, the $R_T$ element could be a single transistor whose gate voltage is varied to adjust its resistive value. The $R_T$ element could also be built from PMOS transistors instead of NMOS transistors. The reference value could be a current value or a voltage value instead of a resistance value. The reference value could consist of a length of interconnect with termination loads. The $R_T$ element could be turned on and off during normal operation to reduce power, or to eliminate termination at the transmitter end of the interconnect. These alternative circuits would all share the following characteristics, however. The external reference value is provided, control circuitry adjusts a generated value to match the reference value, and the generated value can be replicated throughout the component.

Figure 17:
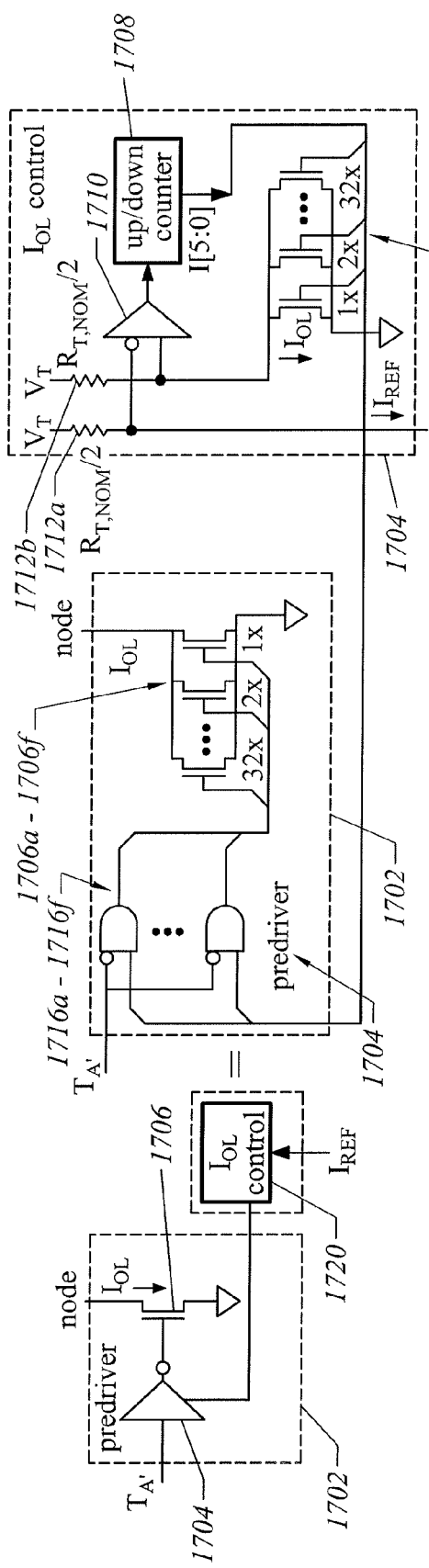
FIG. 17 is a block diagram of an embodiment of $I_{OL}$ current control.

Referring briefly to FIG. 13, a calibrated output driver consists of an upper switch device (the transistor 1324, which is designed to be as similar as possible to the driver elements 320 and 322 of FIG. 3), and a set of six weighted devices (the transistors 1326a-1326f) forming a lower calibration device. In an alternative embodiment, AND gating of the switch device and the lower calibration device is performed in a predriver instead of the driver. FIG. 17 is a block diagram of such an alternative embodiment of a calibrated output driver 1702 and an $I_{OL}$ control circuit 1720. The output driver 1702 includes a predriver 1704 coupled to a driver 1706. The driver 1706 consists of a set of six weighted transistors, 1706a-1706f, forming a calibrated device. Transistors 1706a-1706f are enabled by six AND gates, 1716a-1716f, in the predriver 1704. A transmit bit $T_A$, is one of the inputs to each of the AND gates 1716a-1716f. The other input to each of the AND gates 1716a-1716f is one of the six bits I[5:0] forming an $I_{OL}$ control value. The $I_{OL}$ control value is generated as previously described, with a set of six weighted devices 1714a-1714f, termination values 1712a and 1712b, an external reference value $I_{REF}$, a voltage comparator 1710, and an up/down counter 1708.

Another way in which the output driver can be varied in other embodiments is in the selection of gate and drain voltages used. The gate voltages of the driver devices are usually the supply voltage $V_{DD}$ used for all the digital circuits on the component (an exception to this is when an analog control voltage $V_C$ is used for driver calibration). The drain voltage of the upper device is usually at a value of $V_T$ (the termination voltage) as the driver begins conducting. The values of $V_{DD}$ and $V_T$ will determine the part of the transistor characteristic (the graph of $I_{DS}$ versus $V_{DS}$ for different $V_{GS}$ values) used by the devices. When $V_{DD}$ is larger than $V_T$, the transistor will operate in the linear region with a lower source impedance. When $V_{DD}$ is smaller than $V_T$, the transistor will operate in the saturated region with a higher source impedance. A zero source impedance is called voltage-mode signaling, and an infinite source impedance is called current-mode signaling. In the embodiments previously described, with point-to-point interconnect topology and termination present at both ends of the termination; this distinction is unimportant to first order. However, if the termination value and the interconnect impedance value are not well matched, the source impedance can become important when assessing the accumulation of reflections. Also, if multi-drop interconnect topology is used, or if termination is not present at each end of an interconnect, the source impedance can also become an important factor. The variations described for implementing a calibrated output driver could also be applied to a calibrated termination load.

Clock Aligner Circuit Variations

Figure 18:
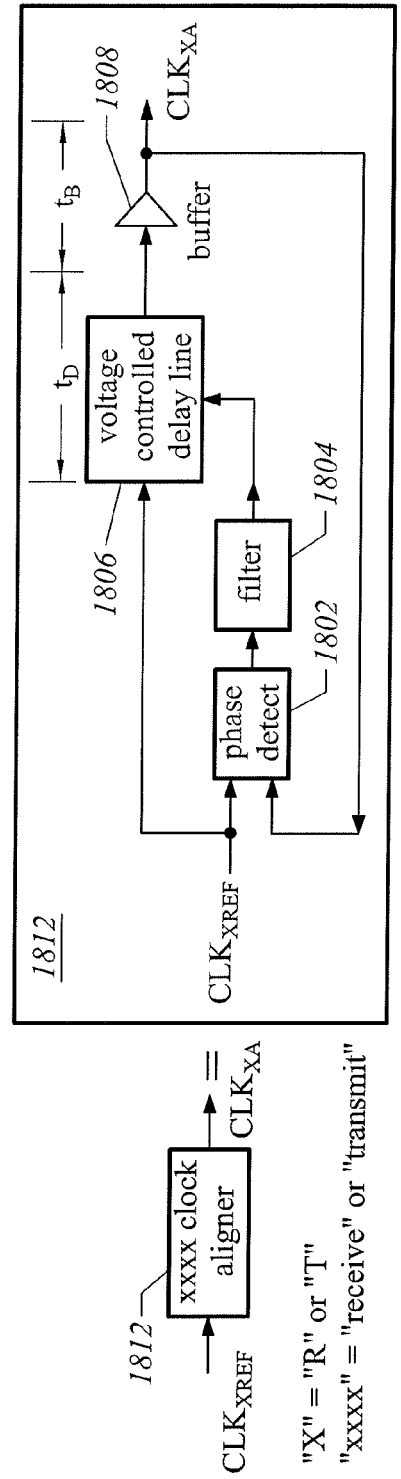
FIG. 18 is a block diagram of an embodiment of clock aligner circuit.

The clock aligner elements 312 and 328 of FIG. 3 may be implemented in various ways in different embodiments. FIG. 18 is a block diagram of one embodiment of a clock aligner circuit 1812 implemented using a delay-locked-loop ("DLL"). The clock aligner circuit 1812 includes a phase detector 1802, a filter 1804, a voltage controlled delay line 1806 with delay $t_D$, and a buffer 1808. The clock aligner circuit 1812 compares the reference clock $CLK_{XREF}$ with the generated clock $CLK_{XA}$ and delays the generated clock until they have the same phase. In this way, the delay of the buffer $t_B$ can be effectively eliminated, although there will be some range of timing skew ($t_{SKEW-X,MAX} - t_{SKEW-X,MIN}$) between the reference clock $CLKR_{XREF}$ and the generated clock $CLK_{XA}$ because of the intervening circuitry.

The timing equation that is satisfied will be:

$$t_D + t_B = N * t_{CYCLE} \quad N=\{1, 2, \ldots\} \quad \text{Equation 37}$$

where N is usually chosen to be one, and $t_{CYCLE}$ is the time interval between successive timing events (a rising edge, for example) on the reference clock $CLK_{XREF}$.

Figure 19:
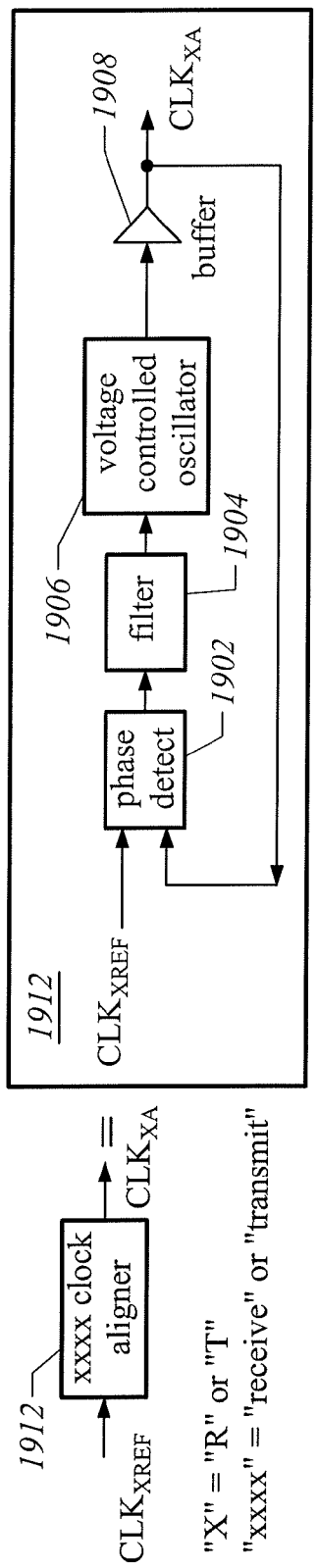
FIG. 19 is a block diagram of an embodiment of clock aligner circuit.

FIG. 19 is a block diagram of one embodiment of another clock aligner circuit 1912 implemented using a phased-locked-loop ("PLL"). The clock aligner circuit 1912 includes a phase detector 1902, a filter 1904, a voltage controlled oscillator 1906, and a buffer 1908. The clock aligner circuit 1912 compares the reference clock $CLK_{XREF}$ with the generated clock $CLK_{XA}$, and adjusts the generated clock until they have the same frequency and phase. In this way, the delay $t_B$ of the buffer 1908 can be effectively eliminated, although there will be some range of timing skew ($t_{SKEW-X,MAX} - t_{SKEW-X,MIN}$) between the reference clock $CLKRX_{REF}$ and the generated clock $CLK_{XA}$ because of the intervening circuitry.

Either the DLL clock aligner circuit 1812 or the PLL clock aligner circuit 1912 may be used to implement the receive clock aligner and the transmit clock aligner circuit blocks in the embodiments described. The PLL clock aligner circuit 1912 might be chosen if the reference clock is not the same frequency as the generated clock, because the PLL can perform frequency multiplication at the same time that it is aligning the generated clock to the reference clock. For example, the generated clock $CLK_{XA}$ could have four times the frequency of the reference clock $CLKR_{XREF}$, permitting four bits to be transferred in each $t_{CYCLE}$ interval.

The DLL clock aligner circuit 1812 might be chosen if the generated clock needed a fixed offset relative to the reference clock. This can be done by tapping the delay line at intermediate points. For example, the $CLKR_{TA}$ clock can be adjusted so its rising edge is +180 degrees relative to the rising edge of $CLKR_{TREF}$ in the transmitter.

The PLL and DLL circuit features could also be merged into one structure, permitting both frequency multiplication and phase adjustment. Such an embodiment will be discussed further below.

Interface Variation—Output Register/Predriver/Driver Loop Compensation

Figure 20:
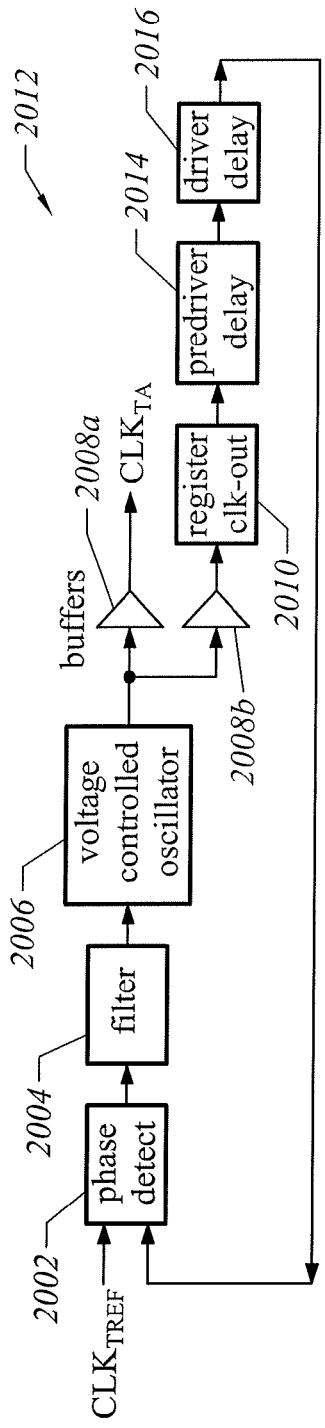
FIG. 20 is a block diagram of an embodiment of a transmit clock aligner circuit.

FIGS. 18 and 19 illustrated embodiments of clock aligner circuits. A transmit clock aligner circuit 1812 or 1912 includes a clock buffer delay in the feedback loop. In another embodiment, the delay of the register, the predriver, and driver circuits in the transmitter (316, 318, and 320/322 in FIG. 3, for example) can also be included in the feedback loop so that process, supply voltage, and temperature variations can be tracked out. FIG. 20 is a block diagram of such an embodiment of a transmit clock aligner circuit 2012. The transmit clock aligner circuit 2012 includes a phase detector 2002, a filter 2004, a voltage controlled oscillator ("VCO") 2006, buffers 2008a and 2008b, a register 2010, a predriver 2014, and a driver 2016. The output of the VCO 2006 is connected to the two buffers 2008a and 2008b. The buffer 2008a supplies $CLK_{TA}$ to the transmitter, and the buffer 2008b provides an equivalent delay to a feedback signal. The register 2010 provides a delay that is equivalent to the register 316 clock-to-output delay. The predriver 2014 provides a delay that is equivalent to the predriver element 318 delay. The driver 2016 provides a delay that is equivalent to the driver elements 320/322 delay. The first order delay of the entire path from the $CLK_{TREF}$ signal to the $V_P/V_N$ output signal is compensated in the feedback path, reducing the variation in the $t_{V-T}$ and $t_{Q-T}$ timing parameters.

A similar modification could be made to the clock aligner for the receiver circuit, including the delays that are equivalent to the delays of the voltage comparator and input register in the feedback loop. This would reduce the variation in the $t_{S-R}$ and $t_{H-R}$ timing parameters.

Interface Variation—Slew Rate Control

Figure 21:
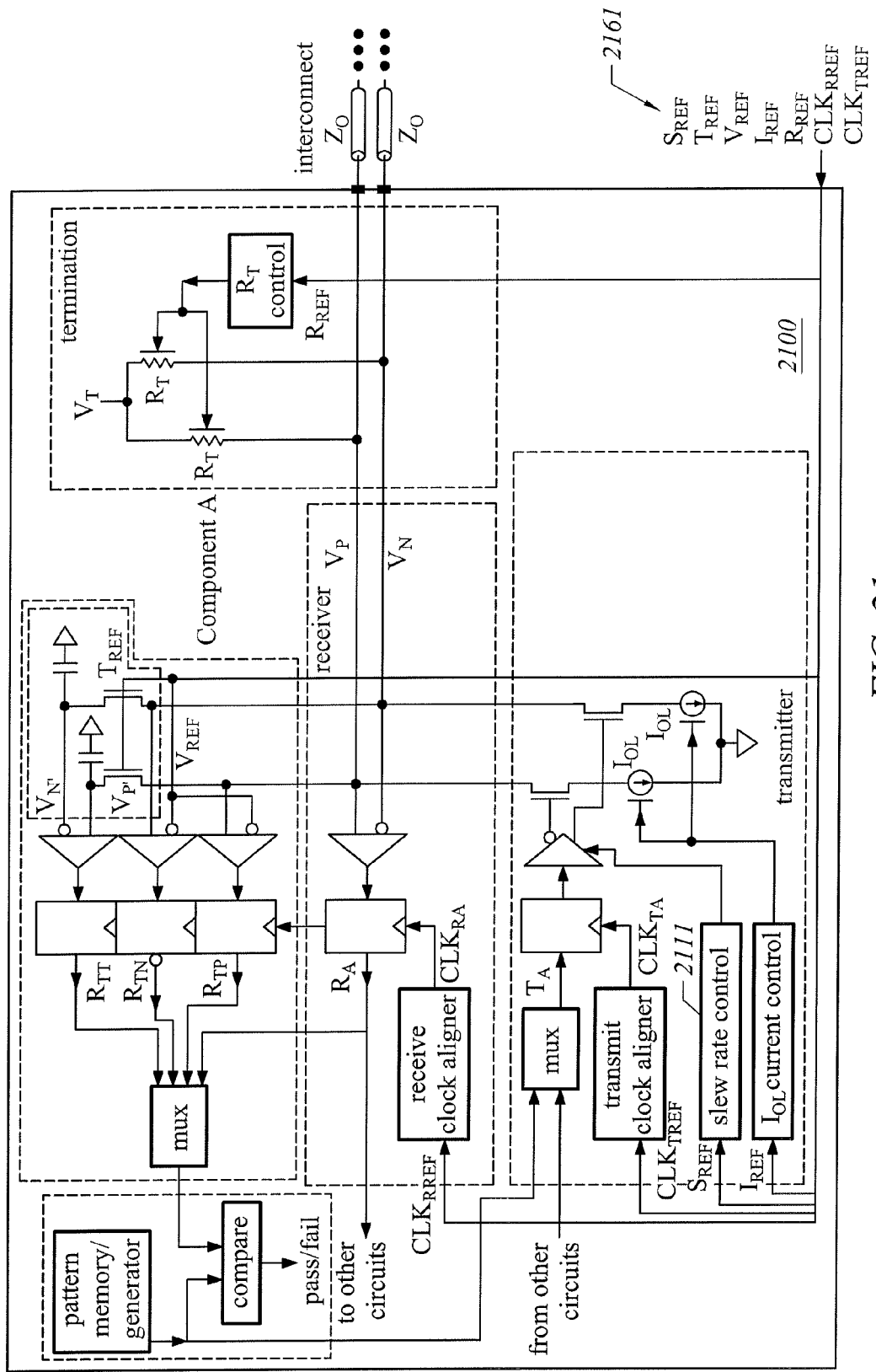
FIG. 21 is a block diagram of an embodiment of a high-speed interface with a slew rate control circuit.

FIG. 21 is a block diagram of an embodiment of a high-speed interface 2100. The high-speed interface 2100 is a variation of the high-speed interface 300 of FIG. 3. Where circuit elements and signals of the interface 2100 are similar to corresponding circuit elements and signals of the interface 300, the circuit elements and signals are not numbered or discussed. The interface 2100 includes an additional calibration element, slew rate control circuit 2111, in the output path. The slew rate control circuit 2111 adds the ability to control the predriver strength with an external reference signal $S_{REF}$ 2161, and thus control the slew rate of the driver. The slew rate is a measure of the rate of change (in volts per second) of the output voltage as the transmitter changes the value of the bit it is driving (high voltage to low voltage or the reverse). Controlling the slew rate is an important aspect of high-speed signaling. By controlling the slew rate, the higher frequency spectral components of the output signal are limited, allowing the signaling rate to approach the limit of the interconnect media more closely.

The slew rate control 2111 can be implemented using segmented devices, as previously described, for example with reference to the termination calibration and FIG. 16. An external reference value (a resistance, for example) could be used with a voltage comparator and an up/down counter that generates a control value, which changes the number of predriver segments that are enabled.

Interface Variation—Test Current Source

In the previous receiver test examples, when the $V_{IH}$ and $V_{IL}$ receiver parameters are checked, it is assumed that the two interface circuits that are coupled by the interconnect are bidirectional with pull-down drivers. This allows the two transmitter circuits to be set the to $V_{IH}$ and $V_{IL}$ parameters independently. In some cases with this arrangement, it is not possible to vary the high output level for checking the $V_{IH}$ parameter. For example, this is true in the case of a single bidirectional interface circuit testing itself. This is also true in the case of two unidirectional interface circuits (one a transmitter and one a receiver) coupled by an interconnect for testing each other.

Figure 22:
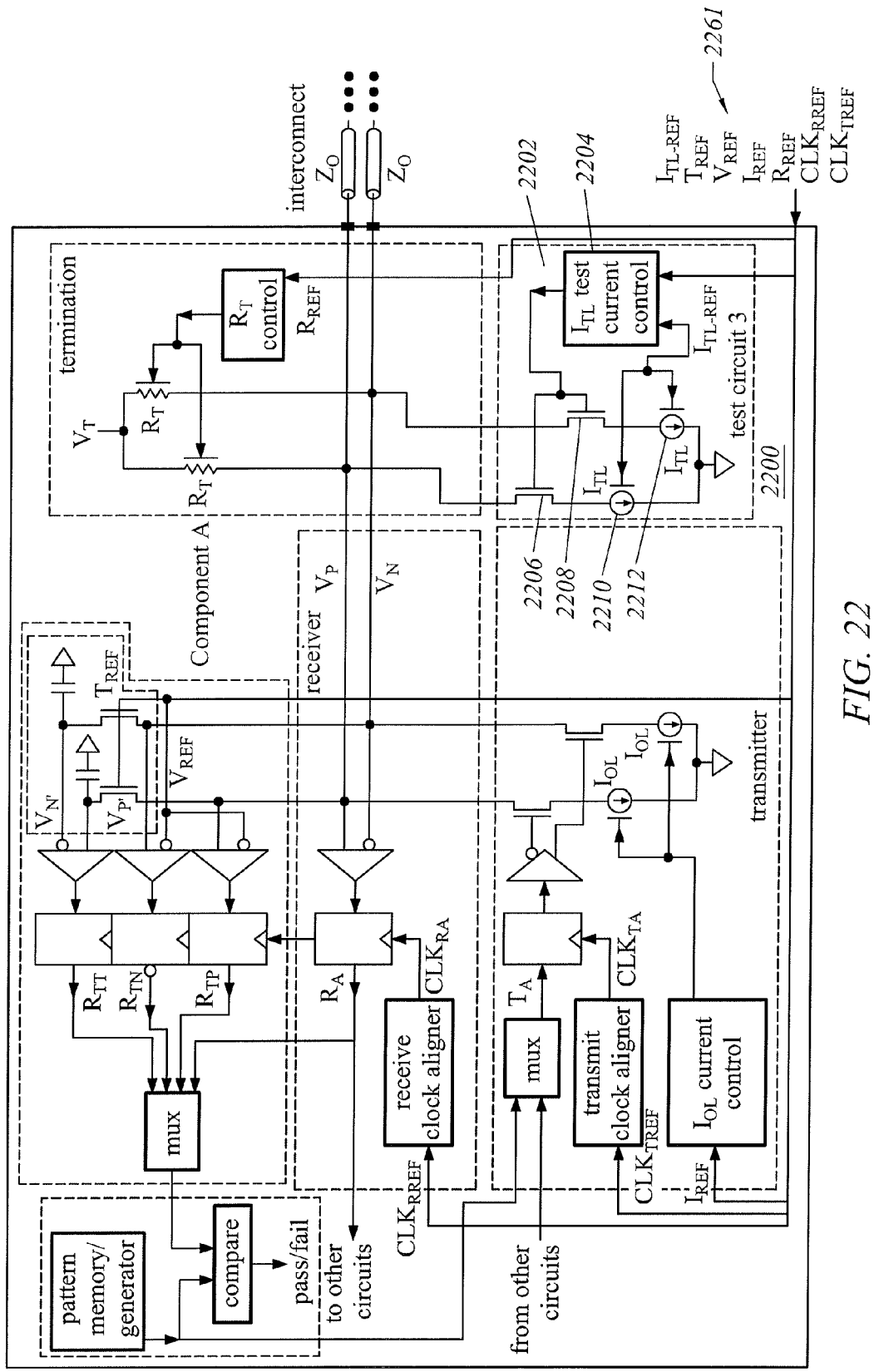
FIG. 22 is a block diagram of an embodiment of a high-speed interface with a test current source.

In another embodiment, shown in FIG. 22, circuitry is added to the interface 2200 to allow a single bidirectional interface circuit to test itself, and to allow two unidirectional interface circuits (one a transmitter and one a receiver) coupled by an interconnect to test each other. The high-speed interface 2200 is a variation of the high-speed interface 300 of FIG. 3. Where circuit elements and signals of the interface 2200 are similar to corresponding circuit elements and signals of the interface 300, the circuit elements and signals are not numbered or discussed. The interface 2200 includes a test circuit 2202 and a test current reference signal $I_{TL-REF}$ 2261 input to $I_{TL}$ test current control 2204. The test circuit 2202 is similar to the calibrated output driver structure previously described with reference to other embodiments. The test circuit 2202 includes drivers 2206 and 2208, and current sources 2210 and 2212. The $I_{TL-REF}$ 2261 is externally supplied, and sets the sink current $I_{TL}$ in both legs of the test circuit 2202. In effect, this duplicates the action of the interface 2200 for the $V_{IH}$ test (for example see the description of FIGS. 6 and 7 for a description of a $V_{IH}$ test).

An alternative embodiment uses a low bandwidth test system to vary the $V_T$ termination voltage for the $V_{IH}$ test. The $V_{OH}$ level produced by the transmitter is determined by the termination voltage value, which is made adjustable in some test systems.

In the case in which push-pull drivers are used in the transmitter, a receiver can be tested with a single transmitter without the test circuit 2202 or an adjustable $V_T$. The push-pull driver calibration circuitry (with two external reference signals) permits both the $V_{OH}$ and $V_{OL}$ levels to be adjusted, allowing both $V_{IH}$ and $V_{IL}$ receiver parameters to be tested.

Interface Variation—Multiple Bits per Clock Cycle

Figure 23A:
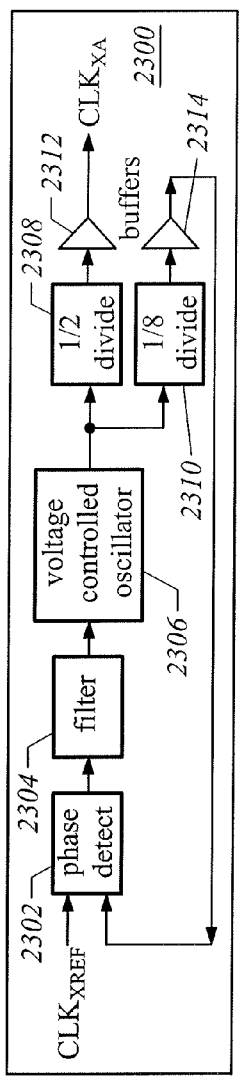
FIG. 23A is a block diagram of an embodiment of a clock aligner circuit used for frequency multiplication.
Figure 23B:
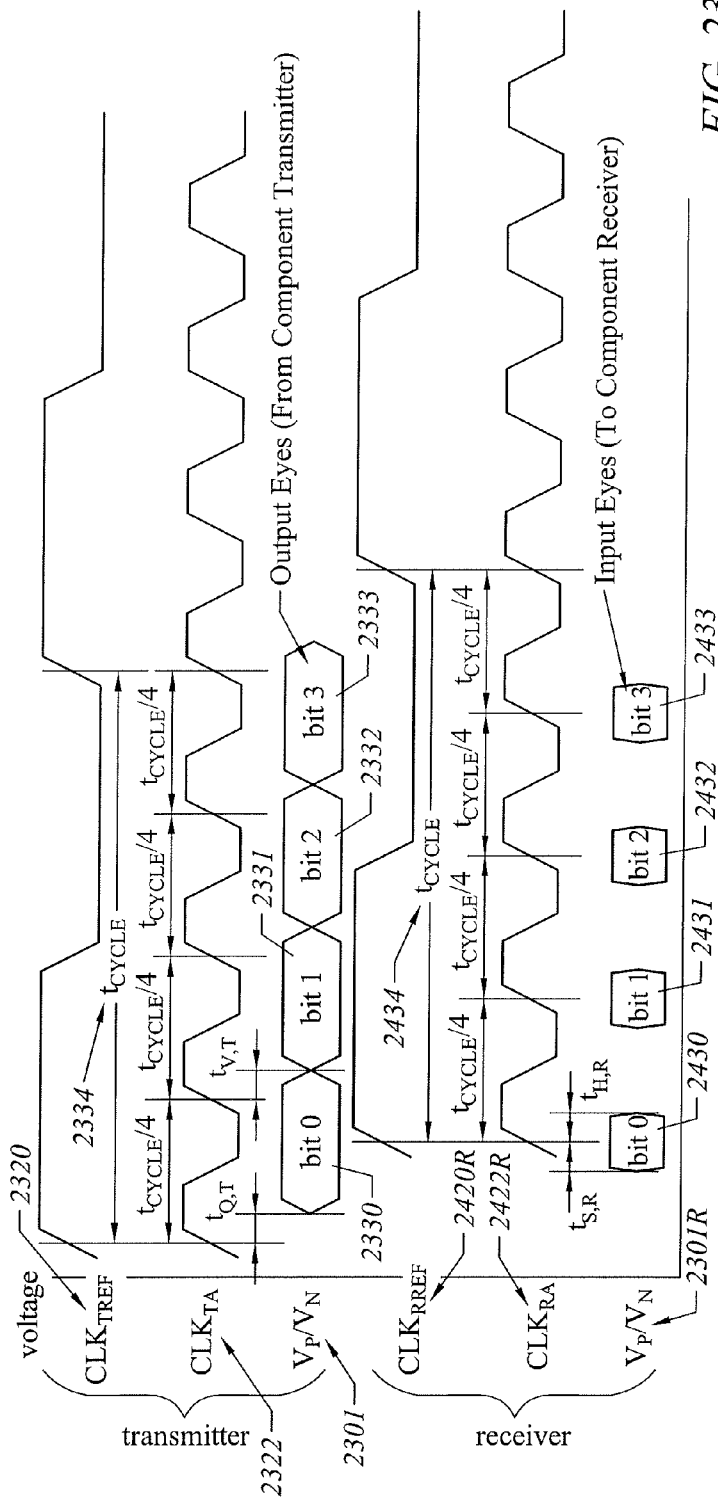
FIG. 23B is a timing diagram that shows the clock signals from the embodiment of FIG. 23A for both a transmitter circuit and a receiver.

In the embodiments described so far, one bit was transferred in each clock cycle. In many applications more than one bit is transferred in each clock cycle. In these applications, external clock signals provide a frequency reference and a static phase reference for the clock circuitry on the component. FIGS. 23A and 23B illustrate an embodiment in which more than one bit is transferred in one clock cycle. FIG. 23A is a block diagram of a clock aligner circuit 2300 that is used with a receiver and a transmitter. The clock aligner circuit 2300 is a PLL that includes a phase detector 2302, a filter 2304, and a VCO 2306. A signal from the VCO 2306 is coupled to two frequency divider circuits, 2308 and 2310. In this embodiment, the frequency divider circuit 2308 reduces the frequency of the VCO output by a factor of two and the frequency divider circuit 2310 reduces the frequency of the VCO output by a factor of eight. The outputs of the frequency divider circuits 2308 and 2310 are coupled to respective buffers 2312 and 2314. The buffered ½ frequency signal becomes the $CLK_{X4}$ clock signal used by the transmitter or receiver. The buffered ⅛ frequency signal becomes the feedback that is compared to the external $CLK_{XREF}$ clock signal. This forces the VCO 2306 output to run at eight times the frequency of the $CLK_{XREF}$ clock signal, and the $CLK_{X4}$ clock signal to run at four times the frequency of the $CLK_{XREF}$ clock signal.

FIG. 23B is a timing diagram that shows the clock signals from the clock aligner circuit 2300 plotted together with the $V_P/V_N$ signals 2301 and 2301R for both a transmitter circuit and a receiver circuit. In the case of the $CLK_{TA}$ 2322 and $CLK_{TREF}$ 2320 clock signals, the rising edges are closely aligned (within the specified error of the clock circuitry). Each of four successive output eyes 2330-2333 are defined around timing points at $t_{CYCLE/4}$ increments across one $t_{CYCLE}$ 2334 interval. One $t_{CYCLE}$ 2334 interval is one cycle of $CLK_{TREF}$ 2320. The $t_{V,T}$ and $t_{Q,T}$ timing parameters are defined with respect to these timing points.

Similarly, in the case of the CLKRA 2422R and $CLK_{RREF}$ 2420R clock signals, the rising edges are closely aligned (within the specified error of the clock circuitry). Each of four successive input eyes 2430-2433 are defined around timing points at $t_{CYCLE/4}$ increments across one $t_{CYCLE}$ 2434 interval. One $t_{CYCLE}$ 2434 interval is one cycle of $CLK_{TREF}$ 2320. The $t_{S,R}$ and $t_{H,R}$ timing parameters are defined with respect to these timing points.

Interface Variation—Adjustable Clocking, Termination, and Current Elements

Figure 24:
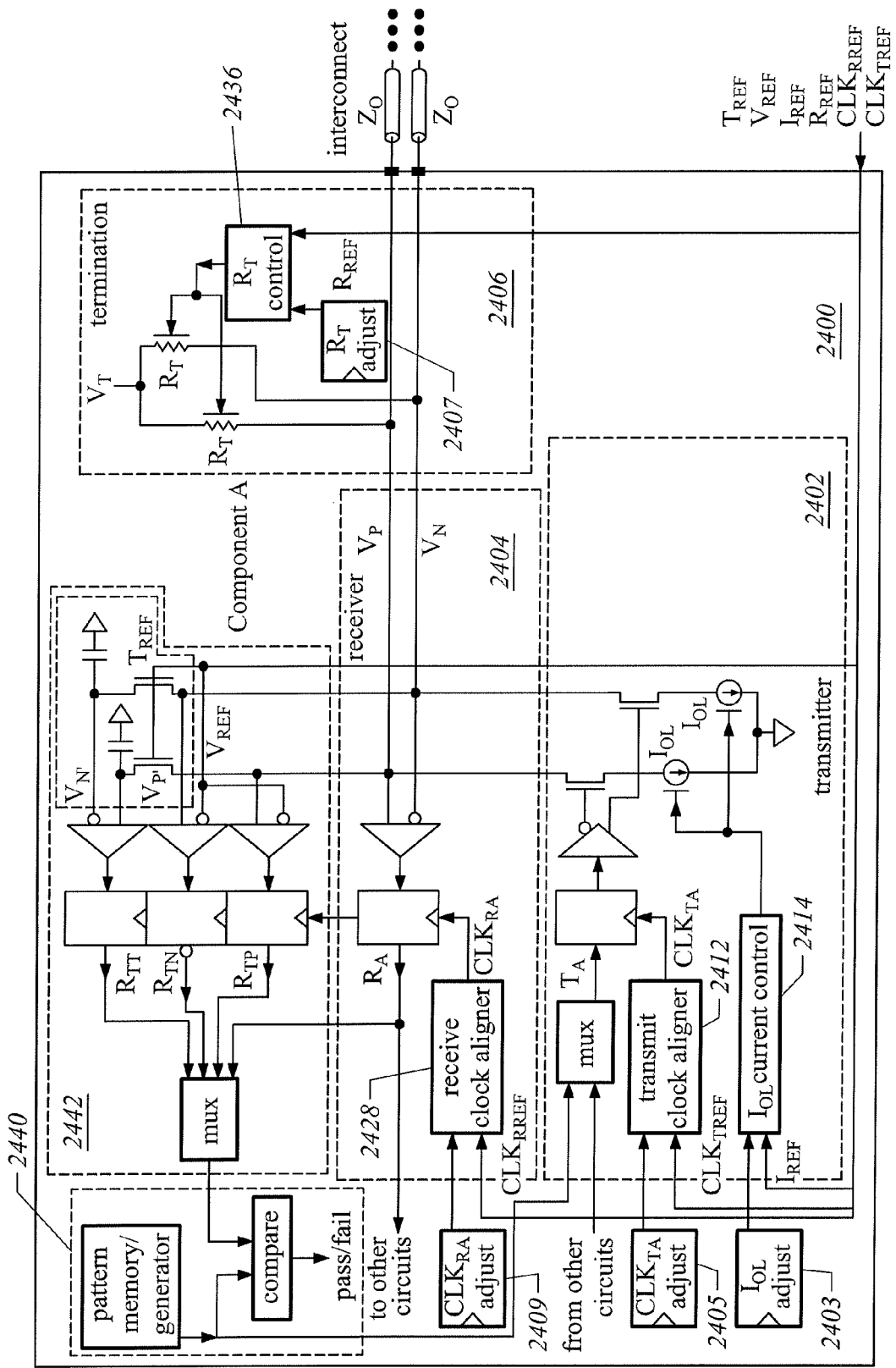
FIG. 24 is a block diagram of an embodiment of a high-speed interface with clock, current, and termination value adjustment circuitry

The clocking calibration elements in the previously described embodiments used a value on an external reference signal to set their operating points. For example, with reference to FIG. 3, an $I_{REF}$ 366 signal, an $R_{REF}$ 368 signal, a $CLK_{RREF}$ 370 signal, and a $CLK_{TREF}$ 372 signal are used to set respective operating points. In another embodiment, an alternative approach is used. FIG. 24 is a block diagram of an embodiment of an interface 2400 in which an adjustment value is provided in addition to a reference value to set an operating point. In the embodiment of FIG. 24, circuitry is added to the interface 2400 to provide adjustment values. The high-speed interface 2400 is a variation of the high-speed interface 300 of FIG. 3. Where circuit elements and signals of the interface 2400 are similar to corresponding circuit elements and signals of the interface 300, the circuit elements and signals are not numbered or discussed. The interface 2400 includes a receiver 2404, a transmitter 2402, a termination block 2406, a test circuit 2440, and a test circuit 2442. The interface 2400 further includes adjustment circuitry added to four calibration elements. The four calibration elements are a receive clock aligner 2428, a transmit clock aligner 2412, an $I_{OL}$ current control 2414, and an $R_T$ control 2436. The adjustment value received by each of the calibration elements is a digital value that is held in a respective register and passed to the respective calibration element. The registers include a $CLK_{RA}$ adjust register 2409, a $CLK_{TA}$ adjust register 2405, an $I_{OL}$ adjust register 2403, and an $R_T$ adjust register 2407.

Figure 25:
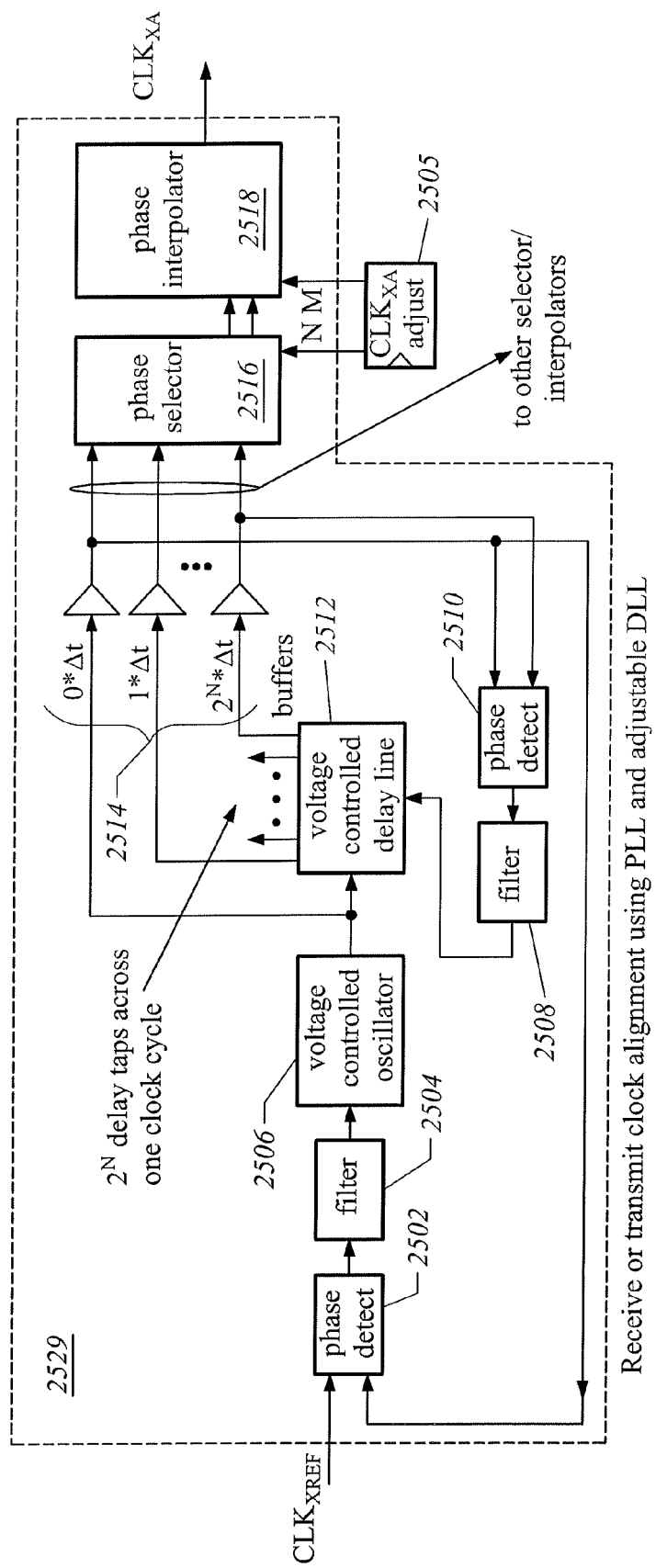
FIG. 25 is a block diagram of an embodiment of a clock aligner circuit with a PLL and a DLL.

FIG. 25 is a block diagram that illustrates how an adjustment value from a $CLK_{X4}$ adjust register 2505 is used by a transmitter or receiver clock aligner 2529. The clock aligner 2529 includes merged PLL and DLL circuits, including a phase detector 2502, a filter 2504, and a VCO 2506. The clock aligner 2529 further includes a voltage-controlled delay line 2512, a filter 2508, a phase detector 2510, and buffers 2514. The clock aligner 2529 further includes a phase selector 2516, and a phase interpolator 2518, each of which is coupled to the $CLK_{X4}$ adjust register 2505. The PLL circuit receives an external clock signal $CLK_{XREF}$. The output of the VCO 2506 is fed into the voltage controlled delay line 2512 with $2^N$ delay elements. The delay of each of the delay elements is "1*$\Delta t$" delay. The VCO 2506 signal and the $2^N$ delay taps drive $2^N+1$ buffers 2514. The buffer 2514 with "0*$\Delta t$" delay is fed back to the phase detector 2502 of the PLL, causing this signal to lock to the external clock signal $CLK_{XREF}$. The buffer 2514 with "0*Δt" delay and the buffer 2514 with "$2^N$*Δt" delay are fed to the phase detector 2510 of the DLL. This causes the total delay of the delay line ($2^N$*Δt) to adjust to one clock cycle. The $2^N$ delay taps now provide $2^N$ clock signals whose phase is offset by increments of $360°/2^N$. The $CLK_{X4}$ adjust register 2505 selects one of these $2^N$ clock signals with an N bit field with multiplexing logic in a phase selector 2516. An M bit field from the $CLK_{X4}$ adjust register 2505 specifies an interpolation value between this clock signal and the next higher clock signal. This improves the phase resolution of the output clock $CLK_{X4}$ from the phase interpolator 2518.

In other embodiments, the delay of the phase selector 2516 and the phase interpolator 2518 can be modeled in a delay circuit that is inserted in the feedback loop for the PLL to reduce the error in the $CLK_{X4}$ signal due to process, supply voltage, and temperature variations.

When the phases of the transmitter and receiver clocks are adjustable, the phase of the external clock reference signal $CLK_{XREF}$ becomes unimportant as long as it remains stable. The phase of the internal $CLK_{X4}$ clock signal can be set to the proper value by an initialization process prior to normal system operation. The phase can also be modified by an update process between intervals of normal system operation to improve the accuracy of the internal clock phase.

When the adjustable phase feature is added to the component, test and characterization of the component is improved, as is normal system operation. In embodiments that allow the phase of the transmitter and receiver clocks to be adjusted by simply writing to a register, all the time scanning procedures described with reference to previous embodiments can be performed via this mechanism. Therefore, it is not necessary for a test system to adjust the phase of the external clock reference signals. The external clock reference signals serve simply as a frequency source and a static phase reference. This reduces component testing costs, and consequently, component manufacturing costs.

The benefit just described is also available to a component in which either one of the two clock aligner circuits can also be adjusted. All of the time scanning tests require that one of the external clock signals be held at a fixed value while the other is scanned through a range of values. The use of the clock adjustment circuitry with just one of the clock aligners permits all the time scanning procedures to be performed. For example, an internal receiver clock $CLK_{RA}$ can be phase and frequency locked to an external signal $CLK_{RREF}$ using a PLL or DLL clock aligner with no phase adjustment. An internal transmitter clock $CLK_{TA}$ can be frequency locked to the external signal $CLK_{TREF}$, but can have an adjustable phase by using a clock aligner/adjuster block such as the one shown in FIG. 25. This permits the phase difference between the internal receiver clock and internal transmitter clock to be set to any arbitrary value (while the external clock signals are at static phase values), but only requires the phase selector and phase interpolator for the transmitter clock.

This benefit can also be extended to use of the $T_{REF}$ signal for uncoupling the transmitter and receiver parameters as detailed in FIGS. 9 and 10. In both cases, a $T_{REF}$ edge must be moved relative to $CLK_{RA}$ or $CLK_{TA}$. This can be accomplished by keeping the $T_{REF}$ edge fixed, and moving $CLK_{RA}$ or $CLK_{TA}$ using the adjustment mechanism just described. This is particularly useful because the $T_{REF}$ must be carried directly from the test system to the analog sampler in the interface in order to minimize timing variation; the $T_{REF}$ cannot use alignment circuitry or adjustment circuitry like $CLK_{RA}$ or $CLK_{TA}$. With the adjustment feature present in either the transmit or receive circuit (or both) it is possible to perform all the time-scanning procedures needed for uncoupling the transmitter and receiver parameters.

Figure 26:
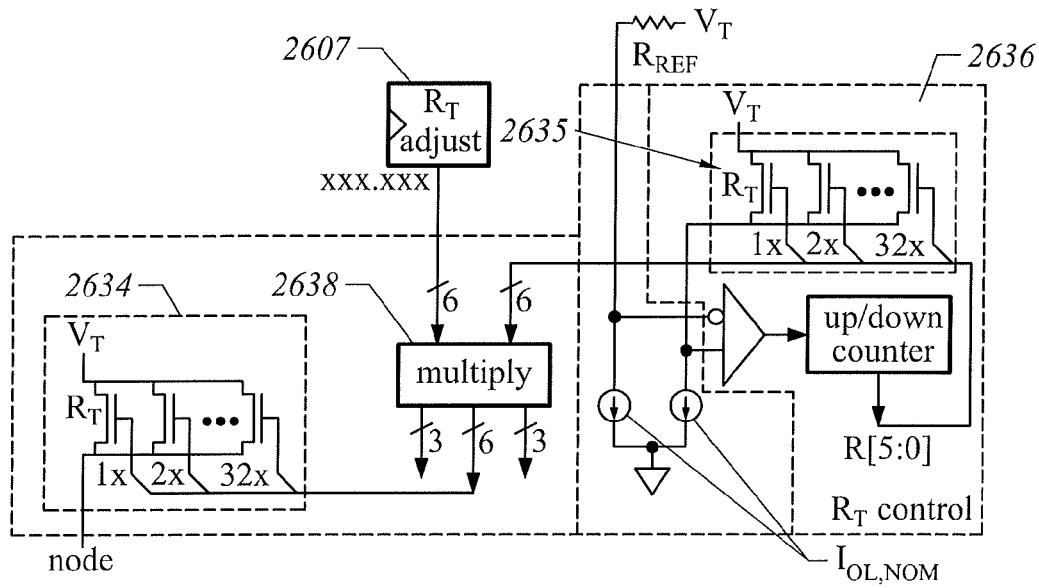
FIG. 26 is a block diagram of an embodiment of adjustable termination circuit.

FIG. 26 is a block diagram showing how an $R_T$ adjust register 2607 is used with an $R_T$ control element 2636 in one embodiment. $R_T$ control element 2636 is similar to the $R_T$ control element 336 of FIG. 3. However, in the embodiment of FIG. 26, the R[5:0] termination control value that is passed to the $R_T$ termination load 2634 is now passed through a digital multiply block 2638 in the calibrated resistive load $R_T$ (such as 1635 of FIG. 16 or 334a and 334b of FIG. 3). The R[5:0] value is interpreted as an unsigned binary number of the form "xxxxxx.", and is multiplied by the value in the $R_T$ adjust register 2607, which is interpreted as an unsigned binary number of the form "xxx.xxx". The upper 3 bits and the lower 3 bits of the product are discarded, the middle six bits are interpreted as an unsigned binary number of the form "xxxxxx.", and are passed to the $R_T$ termination load 2634. This permits the R[5:0] termination control value to be scaled by the adjustment value. For example, assume that an external $R_{REF}$ value produces a R[5:0] termination control value of "000110." If the value in the $R_T$ adjust register 2607 is "010.000", then the control value used by the $R_T$ termination load 2634 is "001100." This causes the real $R_T$ termination load 2634 to have about half the resistance of the dummy $R_T$ termination load 2635 in the $R_T$ control element 2636, and about half the resistance of the external $R_{REF}$ load, assuming that the calibration mapping is linear.

If the calibration mapping is not linear, then a calibration process is performed. In one embodiment, this consists of measuring and comparing internal signals. For example, the voltage dropped across the $R_T$ termination load 2634 is compared to the voltage dropped across the dummy $R_T$ termination load 2635. Measuring each voltage with a voltage comparator against a scanned external voltage reference signal $V_{REF}$ performs the measurement process. Alternatively, if the calibration mapping is not linear, it may not be necessary to actually determine the value of the voltage dropped across the $R_T$ termination load 2634. It may be sufficient to use a calibration process to measure the effect of adjusting the $R_T$ termination load 2634 upon a related parameter of the receiver or transmitter (like $V_{OL}$). This allows the $R_T$ termination load 2634 to be optimally adjusted without determining what its actual value is. It would not be necessary to precisely match the $R_{REF}$ external reference value to the impedance of the interconnect in either the actual system environment or in the testing environment.

The flexibility of adjusting a calibrated element like the $R_T$ termination load 2634 prior to normal operation or prior to test and characterization has beneficial effects. The matching of external reference values is not critical, and the external reference values do not need to be adjusted. Writing to internal registers of the component can perform matching and adjustment. This reduces component testing costs, and consequently, component manufacturing costs. It also means that writing to an internal register of the component rather than changing a reference value supplied by the test system needed for test and characterization can carry out the scanning process. This can simplify the test system requirements and reduce cost.

Figure 27:
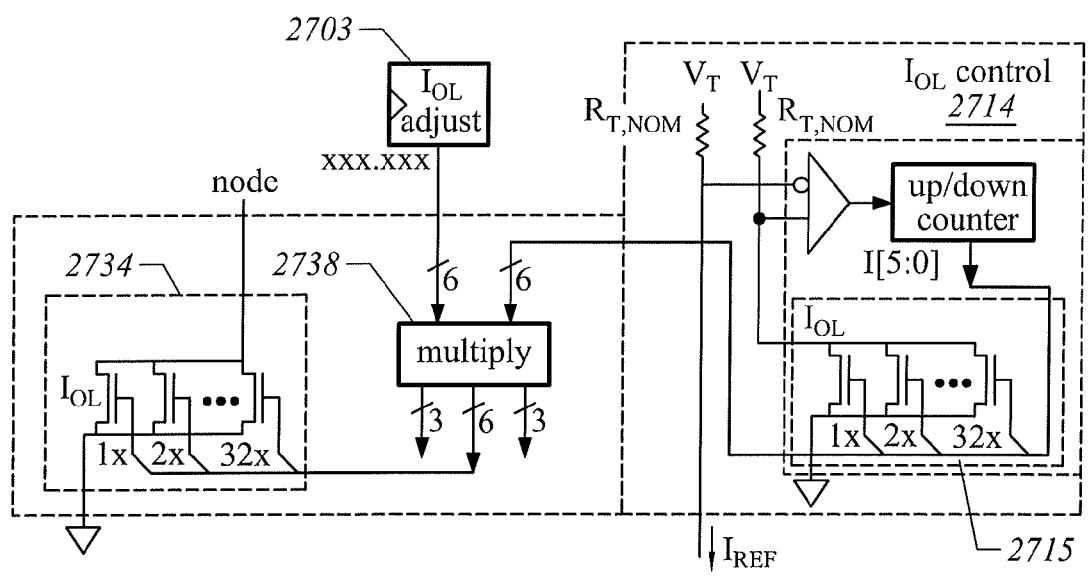
FIG. 27 is a block diagram of an embodiment of adjustable current circuit.

FIG. 27 is a block diagram showing how an $I_{OL}$ adjust register 2703 is used with an $I_{OL}$ control element 2714 in one embodiment. The $I_{OL}$ control element 2714 is similar to the $I_{OL}$ current control element 314 of FIG. 3. However, the I[5:0] current control value that is passed to the $I_{OL}$ current sink is now passed through a digital multiply block 2738 in the calibrated current source $I_{OL}$ (such as 1302 of FIG. 13 or current source elements 324 and 326 of FIG. 3). The I[5:0]

value is interpreted as an unsigned binary number of the form "xxxxxx.", and is multiplied by the value in the $I_{OL}$ adjust register 2703 which is interpreted as an unsigned binary number of the form "xxx.xxx". The upper 3 bits and the lower 3 bits of the product are discarded, and the middle six bits are interpreted as an unsigned binary number of the form "xxxxxx." and passed to the $I_{OL}$ current sink 2734. This permits the I[5:0] current control value to be scaled by the adjustment value.

For example, assume that the external $I_{REF}$ value produces a I[5:0] current control value of "000101.". If the value in the $I_{OL}$ adjust register 2703 is "010.000", then the control value used by the $I_{OL}$ current sink 2734 would be "001010". This would cause the real $I_{OL}$ current sink to become about twice as great as the dummy $I_{OL}$ current sink 2715 in the $I_{OL}$ control block and to become about twice as great as the external $I_{REF}$ load, assuming that the calibration mapping is linear.

If the calibration mapping is not linear, then a calibration process is performed. The calibration process consists of measuring and comparing internal signals. For example, the voltage dropped across the $I_{OL}$ current sink 2734 is compared to the voltage dropped across the dummy $I_{OL}$ current sink 2715. Measuring each voltage with a voltage comparator against the scanned external voltage reference signal VREF performs the measurement process.

Alternatively, if the calibration mapping is not linear, it may not be necessary to actually determine the value of the voltage dropped across the $I_{OL}$ current sink. It may be enough to use a calibration process to measure the effect of adjusting the $I_{OL}$ current sink 2734 upon a related parameter of the receiver or transmitter (like $V_{OL}$). This would allow the $I_{OL}$ current sink 2734 to be optimally adjusted without determining what its actual value is.

The flexibility of adjusting a calibrated element like the $I_{OL}$ current sink 2734 prior to normal operation or prior to test and characterization has beneficial effects. The matching of external reference values is not critical, and the external reference values do not need to be adjusted. Writing to internal registers of the component performs matching and adjustment. This reduces component testing costs, and consequently, component manufacturing costs. It also means that writing to an internal register of the component rather than changing a reference value supplied by the test system needed for test and characterization can carry out the scanning process. This can simplify the test system requirements and reduce cost.

Interface Variation—Adjustable Voltage Reference

Embodiments previously described use an external voltage reference signal $V_{REF}$ to measure voltages on internal nodes of a component. For example, this is done by connecting an internal node and $V_{REF}$ to the inputs of a voltage comparator, scanning $V_{REF}$ across some range, and monitoring the digital output of the comparator for when it changes from high to low or low to high. The $V_{REF}$ signal is assumed to directly couple from the external test system to the voltage comparator(s) to which it is coupled. This permits a voltage forcing circuit in the pin electronics of the test system to make accurate voltage measurements of internal signals. An alternative to this is to use an external voltage reference signal that remains at a fixed value. This eliminates the requirement that the test system be able to scan the voltage reference value across some range, potentially reducing the test system cost. The component includes a voltage calibration and adjustment circuit (not shown) that is similar to the calibration and adjustment arrangements of FIGS. 26 and 27, but with the difference that the voltage calibration and adjustment circuit operates on a fixed external voltage reference to create an adjustable internal voltage reference. For this embodiment, the voltage calibration and adjustment circuit should be linear, since it is assumed that the test system no longer can generate a range of accurate voltage reference values, but instead is limited to generating a single accurate voltage reference value. The adjustable internal voltage reference connects to voltage comparators to allow the voltage on other internal signals to be measured against it. The measurement process consists of writing different values to a voltage adjustment register to scan the internal voltage reference across a range of values.

In yet another alternative embodiment, an adjustable internal voltage reference is generated as described in the preceding paragraph, but instead of using a single, fixed external voltage reference, an internal voltage reference is generated using a supply voltage or a voltage reference circuit, such as a band gap reference.

All of these alternative embodiments allow a test system to trade off accuracy and flexibility with cost. The method that is used depends upon the test accuracy that is required by a component specification.

Interface Variation—Single Internal Clock Reference

Figure 28:
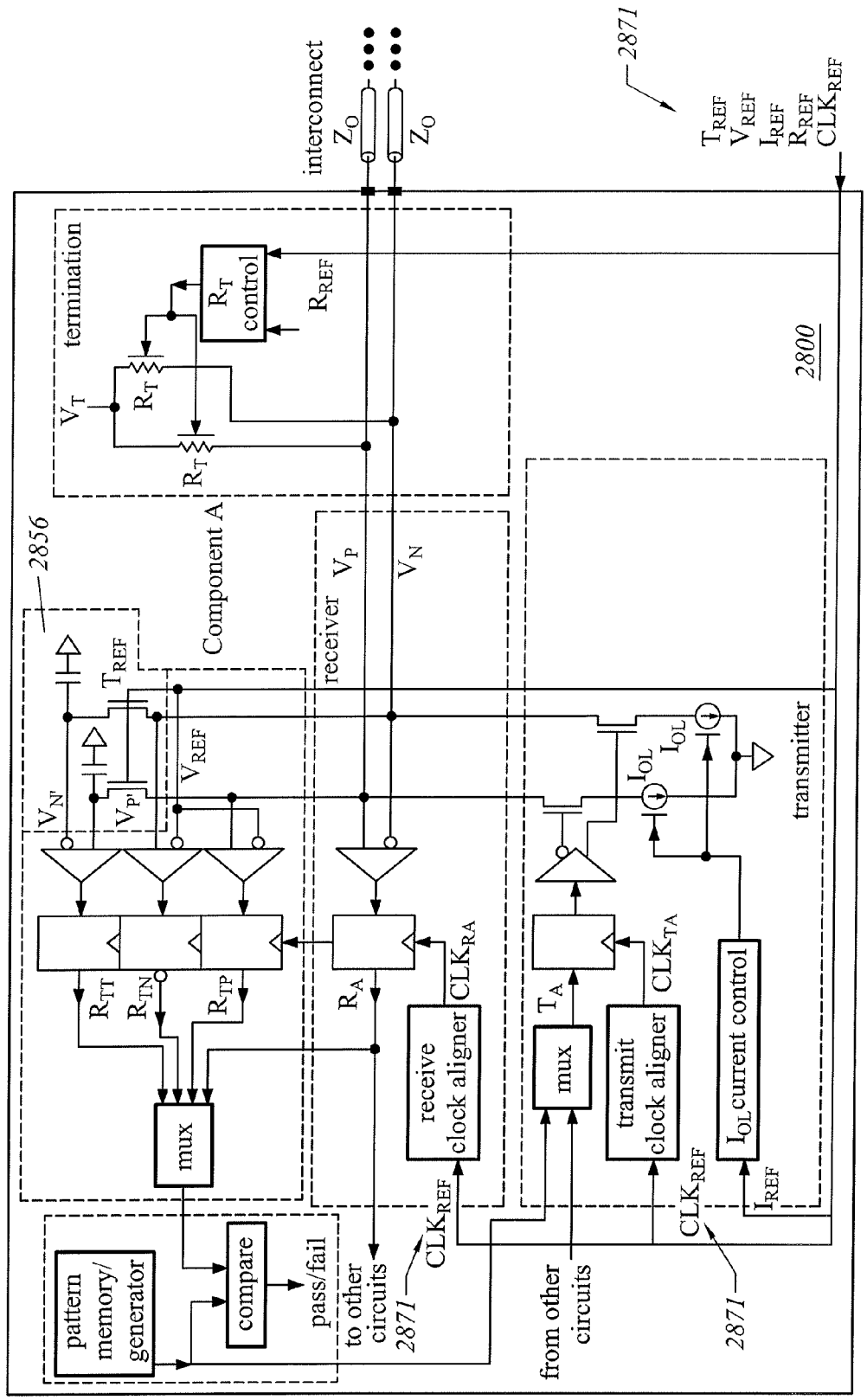
FIG. 28 is a block diagram of an embodiment of a high-speed interface with a single external clock reference.

Embodiments previously described use two clock reference signals ($CLK_{TREF}$ and $CLK_{RREF}$) to indicate when a transmitter is to drive a bit and when a receiver is to sample a bit for both normal operation, and for test and characterization. This provides flexibility in setting the position of the transmitter and receiver eye regions, and also provides an easy way to scan either the transmitter or receiver in order to evaluate a timing parameter. However, some components may only have a single external clock reference $CLK_{REF}$. FIG. 28 is a block diagram of an interface 2800 of such a component. The interface 2800 is similar to the interface 300 of FIG. 3 with the exception of the replacement of $CLK_{RREF}$ and $CLK_{TREF}$ signals with a single $CLK_{REF}$ 2871 signal.

In the case of internal clock signals for the transmitter and receiver with a fixed phase relationship a component will be unable to evaluate the timing parameters for its transmitter and receiver in the manner described with reference to FIGS. 4, 5, 6, and 7. This is true because there is no phase adjustment circuitry in such an arrangement. The test system is unable to scan a transmitter drive point to evaluate a receiver sample point, and is unable to scan a receiver sample point to evaluate a transmitter drive point.

One solution to permit testing and characterization with a single clock reference is to couple two identical components together on the load board during testing. This allows a transmitter on one component to evaluate a receiver on the other component by adjusting the external clock reference of one component relative to the external clock reference of the other component. This solution still has a transmitter timing parameter of one component coupled to a receiver timing parameter of the other component, but this may be acceptable in some situations such as when the component parameters are correlated as previously described.

Another solution to allow testing and characterization with a single clock reference is to add adjustment circuitry to at least one of the clock aligner circuits (either the transmitter or the receiver). This would permit one of the internal clock signals to be scanned relative to the other, and allow the timing parameters to be evaluated. This solution still has a transmitter timing parameter of one component coupled to a receiver timing parameter of the other component, but this may be acceptable in some situations such as when the component parameters are correlated as previously described.

Yet another solution is to provide an analog sampling circuit, such as the analog sampling circuit 2856 of FIG. 28. In such an embodiment a $T_{REF}$ external timing signal is scanned across a timing range, permitting the receiver and transmitter timing parameters to be evaluated without changing the position of the transmitter drive point or the receiver sample point. This is potentially the best solution since it allows scanning to be performed, and also keeps the transmitter and receiver parameters uncoupled.

Interface Variation—External Termination

The embodiments previously described show termination loads for the interconnect located within a component interface. In alternative embodiments (not shown), the termination loads are located external to the component. The test and characterization procedures described with reference to previously embodiments apply equally to embodiments with external termination loads.

Interface Variation—Unidirectional Signals

The embodiments previously described show an interface for each signal including a transmitter and a receiver, a bidirectional interface, and signals that travel in either direction. When one such bidirectional interface is coupled to another, the transmitter of one can test the receiver of the other. Alternatively, such a bidirectional interface may test itself, without being coupled to another interface. However, some components contain a unidirectional signal, in which case the interface for the signal contains either a receiver or a transmitter but not both. In a normal system environment, such an interface is usually coupled to another unidirectional interface of the opposite type. In an alternative embodiment, a single component contains unidirectional interfaces, and the test and characterization procedures previously described with reference to bidirectional interfaces can be performed by pairing each receiver interface with a transmitter interface.

Figure 29:
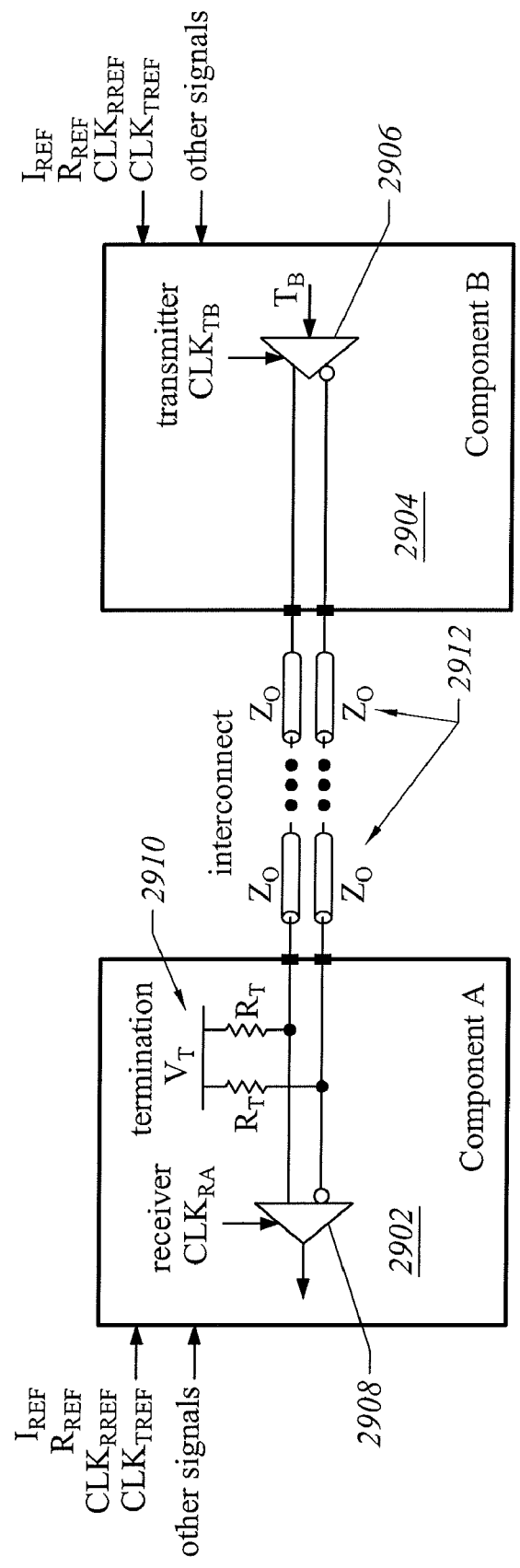
FIG. 29 is a block diagram of an embodiment with two high-speed interfaces communicating using unidirectional signaling.

FIG. 29 is a block diagram of one embodiment in which a first component 2902 is coupled to a second component 2904 through an interconnect 2912. The components 2902 and 2904 communicate using unidirectional signaling. In the embodiment shown, the component 2904 is transmitting with a transmitter 2906, and the component 2902 is receiving with a receiver 2908. For unidirectional signaling, termination loads are only required at the end of the interconnect 2912 that is opposite the transmitter 2906. The single termination load 2910 in the component 2902 is the only termination load required.

In other embodiments, both the components 2902 and 2904 include transmitters, receivers, and termination loads, but only the termination load on the receiving component is active. In this case (not shown), the two components are coupled to each other with point-to-point interconnect and are capable of bidirectional signaling. Activating only one termination load at a time reduces power consumption because the transmitting component only needs to supply half the current for the same voltage swing. An enable signal is added for the termination loads. The enable signal in a component is deasserted when the component is to transmit or, alternatively, asserted when the component is to receive.

In yet another embodiment, bidirectional signaling is used on a multi-drop interconnect to which more than two components are coupled (typically the interconnect is non-branching, and the components are placed along the length of the interconnect). If a transmitter is located in a component at either end of the interconnect, the termination load at the transmitter end can be disabled, as in previously described in the point-to-point case. If the transmitter is located in a component not at either end of the interconnect, then both termination loads (at either end of the interconnect) are be enabled to limit reflections, and the transmitter must drive twice as much current as a transmitter located at either end of the interconnect. The enable signal in the components at the ends of the interconnect are deasserted when a respective component is to transmit, otherwise it is asserted. The enable signal for a component not at the end of the interconnect is always deasserted.

Alternatively, if signaling power is not an issue, the enable signals may be set to static values in a multi-drop interconnect system. The enable signal for a termination element in a component at the ends of the interconnect is always asserted. The enable signal for a component not at the end of the interconnect is always deasserted.

Interface Variation—Analog Sampling Circuit in Transmitter

FIGS. 8A-B illustrate an embodiment with an analog sampling circuit added to the existing receiver circuit so that the individual timing parameters of the transmitter and receiver can be evaluated separately. FIGS. 9 and 10 show the results of the "uncoupled" evaluations for a transmitter and a receiver. These separate uncoupled evaluations are combined with the coupled evaluations. Coupled component evaluations are described with reference to FIGS. 4 and 5 (for coupled transmitter evaluation) and FIGS. 6 and 7 (for coupled receiver evaluation).

Figure 30A:
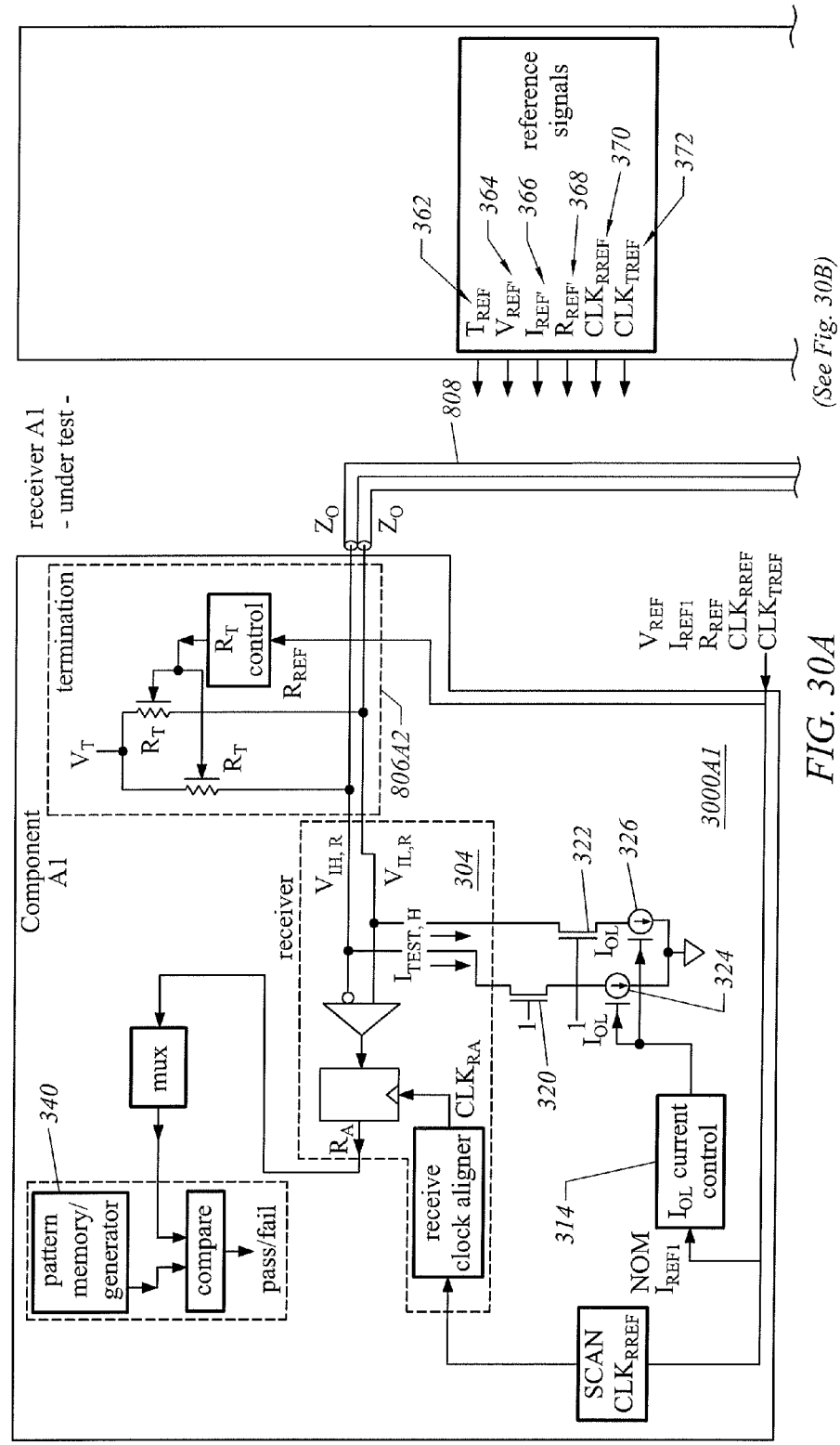
FIGS. 30A-B are block diagrams of an embodiment of a high-speed interface with an analog sampling circuit in a transmitter.
Figure 30B:
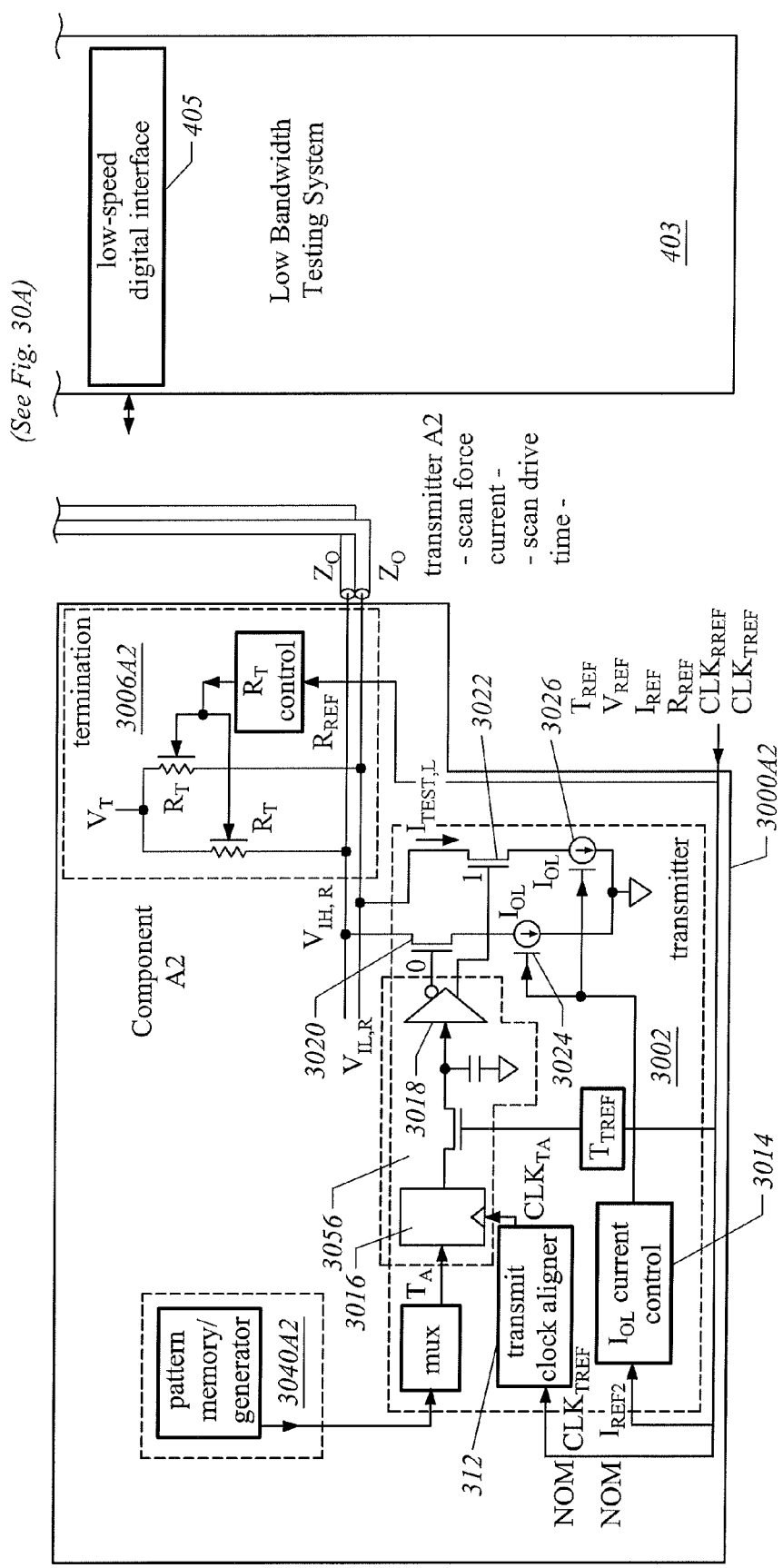

In an alternative to the previous embodiments that include an analog sampling circuit in a receiver, an embodiment shown in FIGS. 30A-B include an analog sampling circuit added to an existing transmitter circuit. This embodiment provides a benefit similar to the previously described embodiments, namely the ability to evaluate individual timing parameters of the transmitter and receiver. The interface 3000A1 is similar to the interface 600A1 of FIGS. 6A-B, but does not include an analog sampling circuit. Elements in FIGS. 30A-B with numbering analogous to elements in FIGS. 6A-B have similar functions.

The interface 3000A2 of FIGS. 30A-B includes a transmitter 3002 and an analog sampler 3056 between an output register 3016 and a predriver 3018 of the transmitter. The interface 3000A2 further includes drivers 3020 and 3022, current sources 3024 and 3026 and current control 3014. The interface 3000A2 further includes a termination block 3006A2 and a test circuit 3040A2. The embodiment of FIGS. 30A-B performs receiver testing as illustrated in FIG. 7.

As explained with reference to FIGS. 8A-B, in an embodiment in which the analog sampler is present with the receiver, the receiver circuit is duplicated. One receiver is active during evaluation, and the other receiver functions for normal operation. There is a cost associated with duplicating circuits on a component. In most cases, the embodiment of FIGS. 8A-B is more economical than the embodiment of FIGS. 30A-B because the transmitter components (the predriver 3018 and the drivers 3020 and 3022) are typically relatively large in area than the duplicated components in the receiver case.

Interface Variation—Additional Analog Sampler

The scanning procedures described with reference to FIGS. 5 and 7 (coupled transmitter evaluation and coupled receiver evaluation, respectively) yield the following timing parameter relationships. Here, the parameter name formats "$t_{S,R}$", "$t_{H,R}$", "$t_{Q,T}$" and "$t_{V,T}$" have been changed to the format "$t_S$", "$t_H$", "$t_Q$" and "$t_V$"):

$$t_S + t_Q = t_{CLKTR-SQ} = k1 \quad \text{Equation 38}$$

$$t_V - t_H = t_{CLKTR-HV} = k2 \quad \text{Equation 39}$$

$$t_S + t_Q = t_{CYCLE} - t_{CLKRT-SQ} = k1 \quad \text{Equation 40}$$

$$t_V - t_H = t_{CYCLE} - t_{CLKRT-HV} = k2 \quad \text{Equation 41}$$

Figure 31:
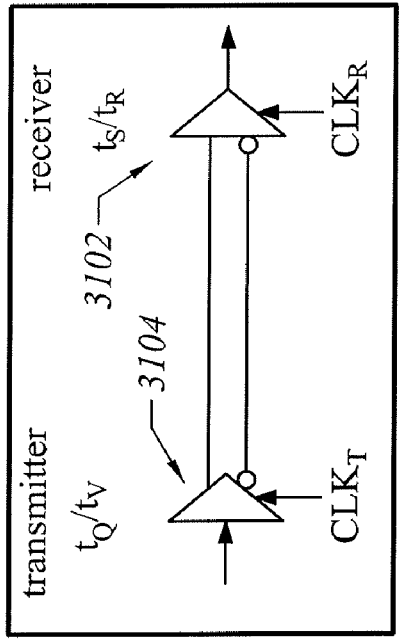
FIG. 31 is a block diagram of an embodiment of a coupled transmitter and receiver illustrating timing relationships.

The values $t_{CLKTR-SQ}$, $t_{CLKTR-HV}$, $t_{CYCLE}$, $t_{CLKRT-SQ}$ and $t_{CLKRT-HV}$ are timing delays from the test system (the offsets between the $CLK_{RREF}$ and $CLK_{TREF}$ edges for the different cases). The four equations above are not independent. When the timing delay values are inserted equations 38 and 40 become equivalent, and equations 39 and 41 become equivalent. This equivalence is indicated by assigning the same constants (k1 and k2) for each pair of equations. FIG. 31 summarizes this relationship for a transmitter 3104 coupled to a receiver 3102. This is the case of coupled transmitter and receiver parameters.

FIGS. 9 and 10 illustrate evaluation of transmitter and receiver when the transmitter and receiver parameters are uncoupled as previously described. The scanning procedure as described with reference to FIG. 9 yields the following timing parameter relationship. The parameter name formats "$t_{S,R}$" and "$t_{H,R}$" have been changed to the format "$t_{S1}$" and "$t_{H1}$":

$$t_Q = t_{TREF-Q} - t_{S1} = k3 - t_{S1} \qquad \text{Equation 42}$$

$$t_V = t_{TREF-V} + t_{H1} = k4 + t_{H1} \qquad \text{Equation 43}$$

The scanning procedure as described with reference to FIG. 10 yields the following timing parameter relationship. The parameter name formats "$t_{Q,R}$" and "$t_{V,R}$" have been changed to the format "$t_{Q1}$" and "$t_{V1}$":

$$t_S = t_{CLKTR-S} - t_{TREF-SH} - t_{Q1} = k7 - t_{Q1} \qquad \text{Equation 44}$$

$$t_H = t_{TREF-SH} + t_{CYCLE} + t_{V1} - t_{CLKTR-H} = k8 + t_{V1} \qquad \text{Equation 45}$$

Figure 32:
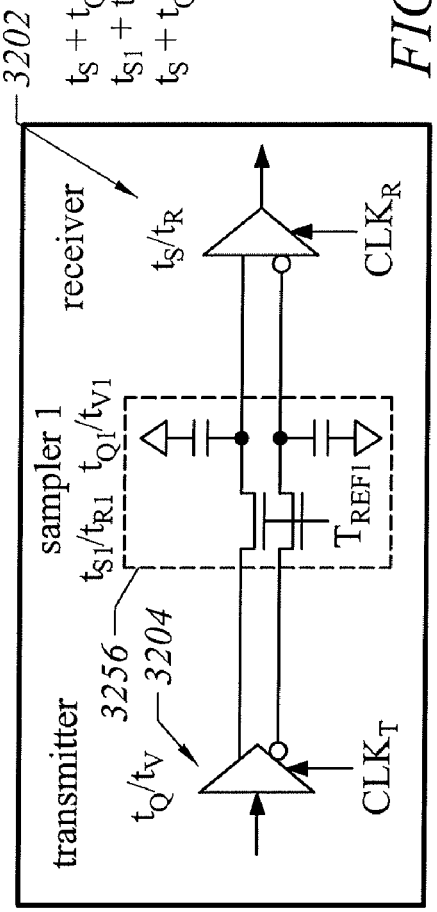
FIG. 32 is a block diagram of an embodiment of a transmitter and receiver uncoupled by an analog sampling circuit, illustrating timing relationships.

The values $t_{TREF-Q}$, $t_{TREF-V}$, $t_{CLKTR-S}$, $t_{TREF-SH}$, $t_{CLKTR-H}$, and $t_{CYCLE}$ are timing delays from the test system. The values $t_{S1}$, $t_{H1}$, $t_{Q1}$, and $t_{V1}$ are the timing parameters of the analog sampling circuit. FIG. 32 illustrates this situation in which one analog sampling circuit 3256 is coupled between a transmitter 3204 and a receiver 3202. Six equations are shown, with four unknowns for the transmitter 3204 and receiver 3202 ($t_S$, $t_H$, $t_Q$, and $t_V$) and four unknowns for the analog sampler ($t_{S1}$, $t_{H1}$, $t_{Q1}$, and $t_{V1}$). The equations may be rewritten:

$$t_S + t_Q = k1 \qquad \text{Equation 46}$$

$$t_V - t_H = k2 \qquad \text{Equation 47}$$

$$t_{S1} + t_Q = k3 \qquad \text{Equation 48}$$

$$t_V - t_{H1} = k4 \qquad \text{Equation 49}$$

$$t_S + t_{Q1} = k7 \qquad \text{Equation 50}$$

$$t_{V1} - t_H = k8 \qquad \text{Equation 51}$$

Figure 33:
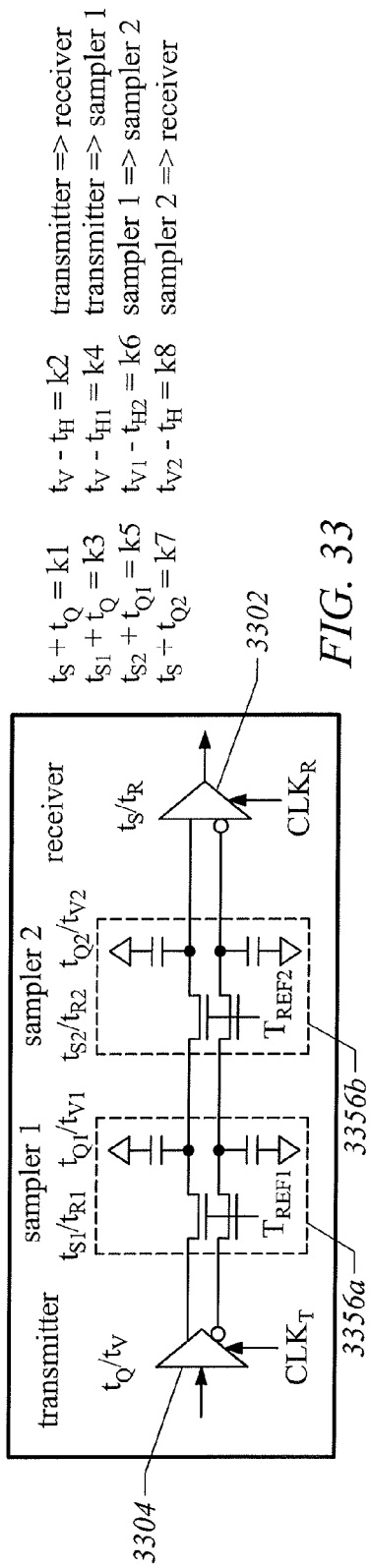
FIG. 33 is a block diagram of an embodiment of a transmitter and receiver uncoupled by two analog sampling circuits, illustrating timing relationships.

There are not enough equations to solve for the unknowns. However, by adding a second sampler circuit, as shown in FIG. 33, the equations may be solved. FIG. 33 shows a transmitter 3304, a receiver 3302. Between the transmitter 3304 and receiver 3302 are coupled two analog sampling circuits 3356a and 3356b. The analog sampling circuits 3356a and 3356b have approximately the same parameters. For the embodiment illustrated by FIG. 33, this implies that the pass transistor and storage capacitors required for the analog sampling circuit 3356a larger than the corresponding transistor and capacitors for the analog sampling circuit 3356b. The transistor and capacitor values chosen take into account the capacitance presented by the receiver 3302, and the current that can be supplied by the transmitter 3304. In other embodiments, other circuit designs are possible. The design shown in FIG. 33 represents a relatively simple approach, since it only performs the time discrimination function of a receiver, and doesn't attempt to perform voltage discrimination. It records the analog voltages and passes them along, letting the receiver 3302 perform the voltage discrimination task.

If the timing parameters of the two analog sampling circuits 3356a and 3356b are made to be essentially the same, and they scale with manufacturing process, supply voltage, and temperature in the same way, then the following eight equations provide enough information to solve for the eight unknowns:

$$t_S + t_Q = k1 \qquad \text{Equation 52}$$

$$t_V - t_H = k2 \qquad \text{Equation 53}$$

$$t_{S1} + t_Q = k3 \qquad \text{Equation 54}$$

$$t_V - t_{H1} = k4 \qquad \text{Equation 55}$$

$$t_{S2} + t_{Q1} = k5 \qquad \text{Equation 56}$$

$$t_{V1} - t_{H2} = k6 \qquad \text{Equation 57}$$

$$t_S + t_{Q2} = k7 \qquad \text{Equation 54}$$

$$t_{V2} - t_H = k8 \qquad \text{Equation 58}$$

Pairs of equations are generated by choosing one transmitter/receiver pair, tightening the transfer of information for that pair, and simultaneously loosening the transfer between the other transmitter/receiver pairs so that they do not affect the determination for the pair under test. For example, when the transfer between analog sampling circuit 3356a and analog sampling circuit 3356b is tested, a $T_{REF1}$ timing event and a $T_{REF2}$ timing event (rising and falling edges, respectively) are adjusted so that they end at separations of ($t_{S2} + t_{Q1}$) or ($t_{V1} - t_{H2}$) for the two scanning procedures. During the scanning procedures, the separation of $CLK_T$ and $T_{REF1}$ timing events (rising edges) are kept larger than the required interval of ($t_{S1} + t_Q$) and ($t_V - t_{H1}$) so that the transfer from the transmitter 3304 to the analog sampling circuit 3356a does not affect the timing measurement. Likewise, the separation of the $T_{REF2}$ and $CLK_R$ timing events (falling and rising edges, respectively) are kept larger than the required interval of ($t_S + t_{Q2}$) and ($t_{V2} - t_H$) so that the transfer from the transmitter 3304 to the analog sampling circuit 3356a does not affect the timing measurement. In this manner, the values of the timing parameters of the transmitter 3304 and the receiver 3302 may be determined. Costs associated with the embodiment include the costs of an extra (dummy) receiver circuit, two analog sampling circuits, and two interconnects carrying the $T_{REF1}$ and $T_{REF2}$ timing reference signals.

In some applications, a single analog sampling circuit and a single timing reference signal may be adequate. In other applications, no analog sampling circuit may be needed. This depends upon the design approach used for the transmitter and receiver circuits, and upon the correlation of parameters between respective transmitter and receiver circuits.

Test Pattern Generation

A number of embodiments for testing and characterizing high-speed signaling circuits are described in the foregoing text and figures. The following sections describe hardware and methods for generating test patterns according to various embodiments.

Figure 34:
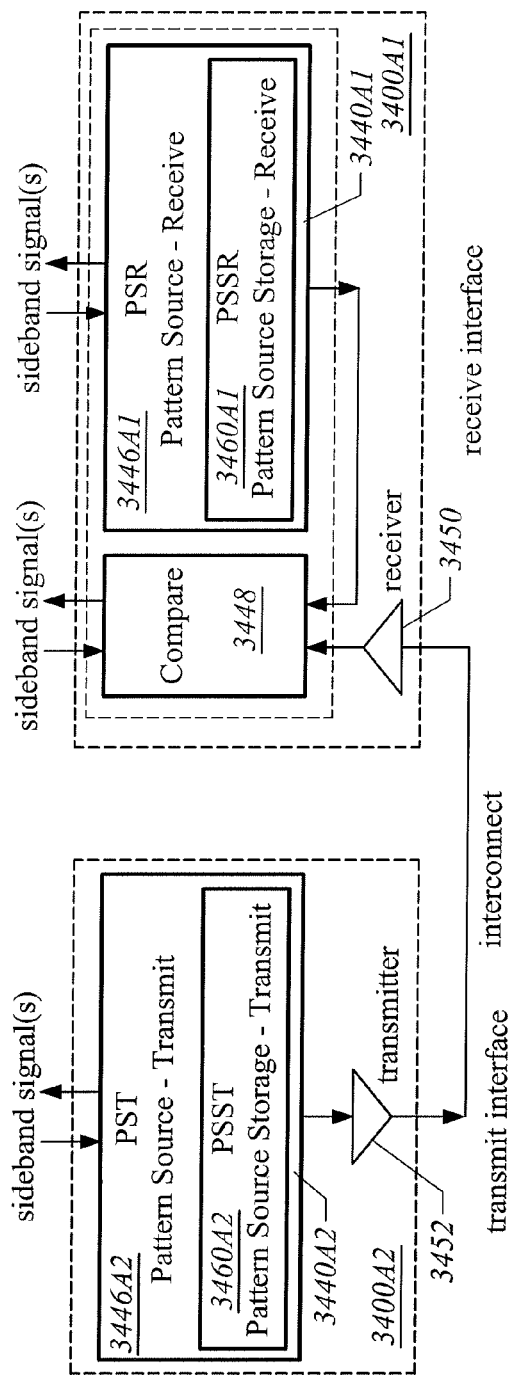
FIG. 34 is a block diagram of a transmit interface with pattern storage and a receive interface with pattern storage according to one embodiment.

FIG. 34 is a block diagram of a transmit interface 3400A2 and a receive interface 3400A1 according to one embodiment. The transmit interface 3400A2 includes a test circuit 3440A2 and a transmitter 3452. The receive interface 3400A1 includes a test circuit 3440A1, which will be described in more detail below, and a receiver 3450. The interfaces 3400A1 and 3400A2 may have one of several relationships to one another, including the relationships illustrated in FIGS. 35A, 35B, and 35C.

Figure 35A:
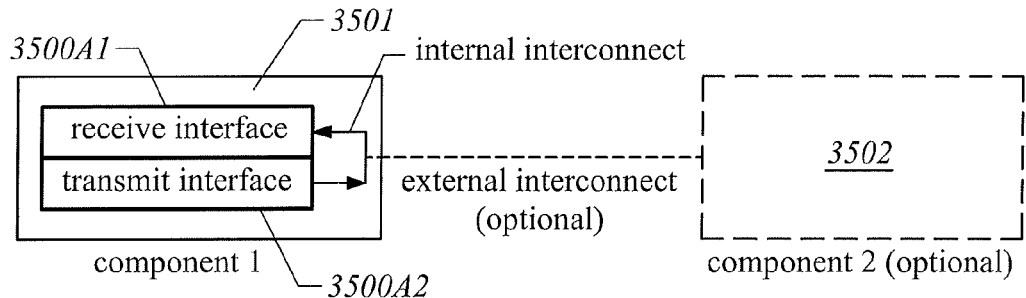
FIG. 35A is a block diagram of a transmit interface, a receive interface, and interconnects according to one embodiment.

FIG. 35A illustrates one possible relationship between a receive interface 3500A1 and a transmit interface 3500A2, which are similar to the interfaces 3400A1 and 3400A2, respectively. Two components, a component 3501 and a component 3502, communicate with each other via an external interconnect. The receive interface 3500A1 and the transmit interface 3500A2 both reside on the component 3501, communicate with each other via an internal interconnect. The receive interface 3500A1 and the transmit interface 3500A2 are also coupled to the external interconnect. The external interconnect shown is not required for test and/or characterization. The two interfaces 3500A1 and 3500A2 may undergo wafer test, package test, or system test in the configuration shown. In the case of system test, there will usually be an external interconnect present, coupling to one or more additional component(s) which do not participate in the test and/or characterization.

Figure 35B:
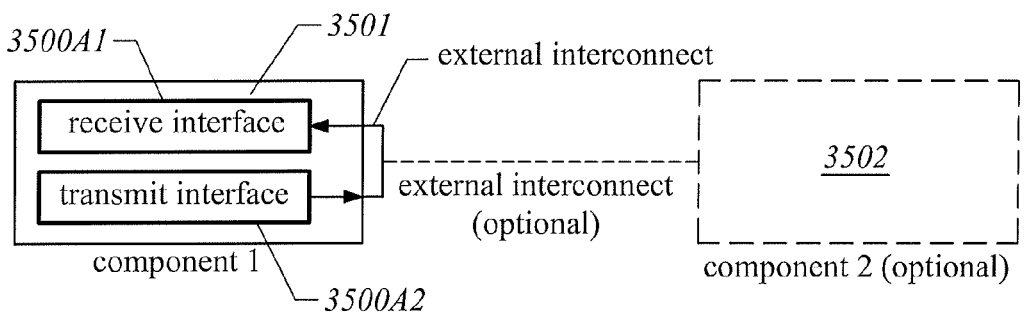
FIG. 35B is a block diagram of a transmit interface, a receive interface, and interconnects according to one embodiment.

FIG. 35B illustrates another possible relationship between a receive interface 3500A1 and a transmit interface 3500A2, which are similar to the interfaces 3400A1 and 3400A2, respectively. Two components, a component 3501 and a component 3502, communicate with each other via an external interconnect. The receive interface 3500A1 and the transmit interface 3500A2 both reside on the component 3501, and communicate with each other via an external interconnect. In this embodiment, the external interconnect is required for test and/or characterization. The two interfaces 3500A1 and 3500A2 may undergo wafer test, package test, or system test in the configuration shown. In the case of system test, the external interconnect may couple to one or more additional component(s) which do not participate in the test and/or characterization.

Figure 35C:
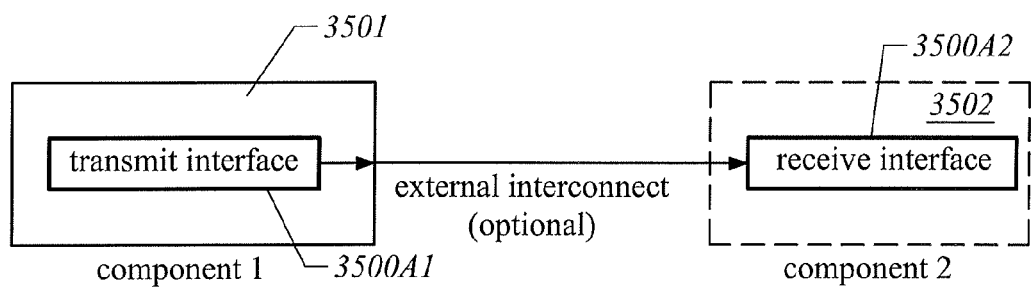
FIG. 35C is a block diagram of a transmit interface, a receive interface, and an interconnect according to one embodiment.

FIG. 35C illustrates another possible relationship between the receive interface 3500A1 and the transmit interface 3500A2. The receive interface 3500A1 resides on the component 3501 and the transmit interface 3500A2 resides on the component 3501. In this case the external interconnect is required for test and/or characterization. The two interfaces 3500A1 and 3500A2 may undergo wafer test, package test, or system test in the configuration shown. In the case of system test, the external interconnect may couple to one or more additional component(s) which do not participate in the test and/or characterization.

Variations of Pattern Source—Transmit Pattern Source ("PST") Element

Referring again to FIG. 34, the transmit interface 3400A2 contains a transmit pattern source—("PST") element 3446A2. The PST element 3446A2 generates a set of patterns for test and characterization. This pattern set is a sequence of digital symbols, typically bits, which are driven by the transmit interface 3400A2 in a continuous, uninterrupted stream. There are a number of methods by which the PST element 3446A2 generates pattern sets in various embodiments.

In one embodiment, a pattern set is driven into the transmit interface 3400A2 on one or more sideband signals. These sideband signals may couple to circuitry elsewhere on the same component as the transmit interface 3400A2. Alternatively, the sideband signals may couple to circuitry that is external to the component. In the alternative case, these sideband signals will usually have a lower signaling bandwidth than the high-speed signal driven by the transmit interface 3400A2. This permits the pattern set to be provided by a low-bandwidth test system.

In another embodiment, a pattern set is driven into the transmit interface 3400A2 on one or more sideband signals, as in the previous embodiment. However, in this embodiment, some form of information compression is employed. For example, to create a pattern burst of 1024 bits with alternating one and zero bits, it may only be necessary to provide a code to indicate that the "10" pattern is repeated 512 times. Thus, a 1024 bit pattern set can be specified with only a small number of bits (16-32, for example). Using this method, a small amount of information on the sideband signals can produce a large amount of information to drive from the transmit interface 3400A2. The compression factor may be large enough to enable the slower sideband signals to keep up with the high-speed signal from the transmit interface 3400A2, permitting each pattern set to butted seamlessly with the next, and allowing an arbitrarily long pattern stream to be created.

In yet another embodiment, the pattern set is generated by circuitry in the PST element 3446A2. For example, a linear feedback shift register (LFSR) is used to produce a long pattern sequence from a small seed value. A shift register with ten shift stages can produce a pattern set that is up to 1024 bits in length. The seed value required is ten bits in size. This provides an alternative form of compression to the one already described, and has the same benefits. Namely, that if the compression factor is large enough to enable the slower sideband signal to keep up with the high-speed signal from the transmit interface, each pattern set may be butted seamlessly with the next, allowing an arbitrarily long pattern stream to be created.

In yet another embodiment, the PST element 3446A2 contains some form of non-volatile storage (such as mask ROM, Flash RAM, etc) that is always available. This storage provides a pattern set directly, and replaces the sideband signals previously described. Alternatively, this storage holds compressed pattern information, and replaces the sideband signals previously described.

Variations of Pattern Source Storage—Transmit Pattern Source Storage ("PSST") Element The PST element 3446A2 includes some internal read/write memory or register circuitry for pattern storage, referred to here as transmit pattern source storage ("PSST") 3460A2. This storage permits a pattern set to be accumulated according to one of the methods described above. This accumulation may be necessary if the pattern creation process is slower than the pattern transmit process; the storage provides buffering for the two mismatched processes. The amount of storage is typically dictated by the size of the pattern set desired. This permits the pattern set to be transmitted in an uninterrupted burst.

In one embodiment, the PSST 3460A2 is dedicated to the task of buffering the pattern set. The PSST 3460A2 could alternatively be shared with other circuitry for some function during normal operation, where the other circuitry is not used during test and characterization. For example, in one embodiment, the PSST 3460A2 also functions as a write buffer in the component. A write buffer can be present in components, which are part of a system containing memory components. A write buffer typically consists of storage circuitry in the path of information being transferred to a memory component.

In another embodiment, the PSST 3460A2 also functions as a read buffer in the component. A read buffer can be present in components, which are part of a system containing memory components. A read buffer typically consists of storage circuitry in the path of information being transferred from a memory component.

In another embodiment, the PSST 3460A2 also functions as a cache in the component. A cache is storage circuitry that is used to keep a copy of information held elsewhere in the same component or in another component.

In another embodiment, the PSST 3460A2 also functions as a storage element in the transmit interface 3400A2. The normal transmit process can require some storage circuitry in some implementations. For example, the transmit data may need to go through a parallel-to-serial conversion process. This process requires storage circuitry. This storage circuitry could be adopted to also accept and store the pattern set from the PST element 3446A2 during test and characterization.

Variations of Pattern Source—Receive Pattern Source ("PSR") Element

A receive pattern source ("PSR") element 3446A1 in the receive interface 3400A1 generates a set of patterns for test and characterization, and is essentially identical to the PST element 3446A2 for the transmit interface 3400A2, except where explicitly noted in the following discussion. The pattern set is a sequence of digital symbols, typically bits, that are provided to a compare element 3448 in the receive interface 3400A1 in a continuous, uninterrupted stream. There are a number of methods by which the pattern set is generated by the PSR element 3446A1 in various embodiments, as described below.

In one embodiment, the pattern set is driven into the receive interface 3400A1 on one or more sideband signals. These sideband signals may be the same signals received by the transmit interface 3400A2, or they may be different. These sideband signals may couple to circuitry elsewhere on the same component. Alternatively, they may couple to circuitry, which is external to the component. These sideband signals will usually have a lower signaling bandwidth than the high-speed signal driven by the transmit interface in the alternative case. This permits the pattern set to be provided by a low-bandwidth test system.

In another embodiment, the pattern set is driven into the receive interface on one or more sideband signals, as just described. However, some form of information compression is employed. For example, to create a pattern burst of 1024 bits with alternating one and zero bits, it may only be necessary to provide a code to indicate that the "10" pattern is repeated 512 times. Thus, it is possible to specify a 1024 bit pattern set with only a small number of bits (16-32, for example). Using this method, a small amount of information on the sideband signals can produce a large amount of information to drive from the transmit interface. The compression factor may be large enough to enable the slower sideband signals to keep up with the high-speed signal from the receive interface 3400A1, permitting each pattern set to butted seamlessly with the next, and allowing an arbitrarily long pattern stream to be created.

In yet another embodiment, the pattern set is generated by circuitry in the PSR element 3446A1. For example, a linear feedback shift register (LFSR) is used to produce a long pattern sequence from a small seed value. A shift register with ten shift stages can produce a pattern set that is up to 1024 bits in length. The seed value required is ten bits in size. This provides an alternative form of compression to the one already described, and has the same benefits. Namely, that if the compression factor is large enough to enable the slower sideband signal to keep up with the high-speed signal from the transmit interface, each pattern set may be butted seamlessly with the next, allowing an arbitrarily long pattern stream to be created.

In yet another embodiment, the PSR element 3446A1 contains some form of non-volatile storage (such as mask ROM, Flash RAM, etc) that is always available. This storage provides a pattern set directly, thus replacing the sideband signals previously described. Alternatively, this storage holds compressed pattern information, and replaces the sideband signals previously described.

Variations of Pattern Source Storage—Receive Pattern Source Storage ("PSSR") Element The PSR element 3446A1 includes some internal read/write memory or register circuitry for pattern storage, referred to here as transmit pattern source storage ("PSSR") 3460A1. This storage permits a pattern set to be accumulated according to one of the methods described above. This accumulation may be necessary if the pattern creation process is slower than the pattern transmit process; the storage provides buffering for the two mismatched processes. The amount of storage is typically dictated by the size of the pattern set desired. This permits the pattern set to be transmitted in an uninterrupted burst.

In one embodiment, the PSSR 3460A1 is dedicated to the task of buffering the pattern set. The PSSR 3460A1 could alternatively be shared with other circuitry for some function during normal operation, where the other circuitry is not used during test and characterization. For example, in one embodiment, the PSSR 3460A1 also functions as a write buffer in the component. A write buffer can be present in components, which are part of a system containing memory components. A write buffer typically consists of storage circuitry in the path of information being transferred to a memory component.

In another embodiment, the PSSR 3460A1 also functions as a read buffer in the component. A read buffer can be present in components, which are part of a system containing memory components. A read buffer typically consists of storage circuitry in the path of information being transferred from a memory component.

In another embodiment, the PSSR 3460A1 also functions as a cache in the component. A cache is storage circuitry that is used to keep a copy of information held elsewhere in the same component or in another component.

In another embodiment, the PSSR 3460A1 also functions as a storage element in the receive interface 3400A1. The normal transmit process can require some storage circuitry in some implementations. For example, the transmit data may need to go through a parallel-to-serial conversion process. This process requires storage circuitry. This storage circuitry could be adopted to also accept and store the pattern set from the PSR element 3446A1 during test and characterization.

Pattern Set—Transmit and Receive Process

In alternate embodiments of the present invention, steps illustrated in FIGS. 39, 41A-C, 43A-C, 45A-D, and 47A-C are carried out by hardware, software or a combination thereof. In alternate embodiments, the steps illustrated in FIGS. 39, 41A-C, 43A-C, 45A-D, and 47A-C are carried out by the components described herein.

Figure 36:
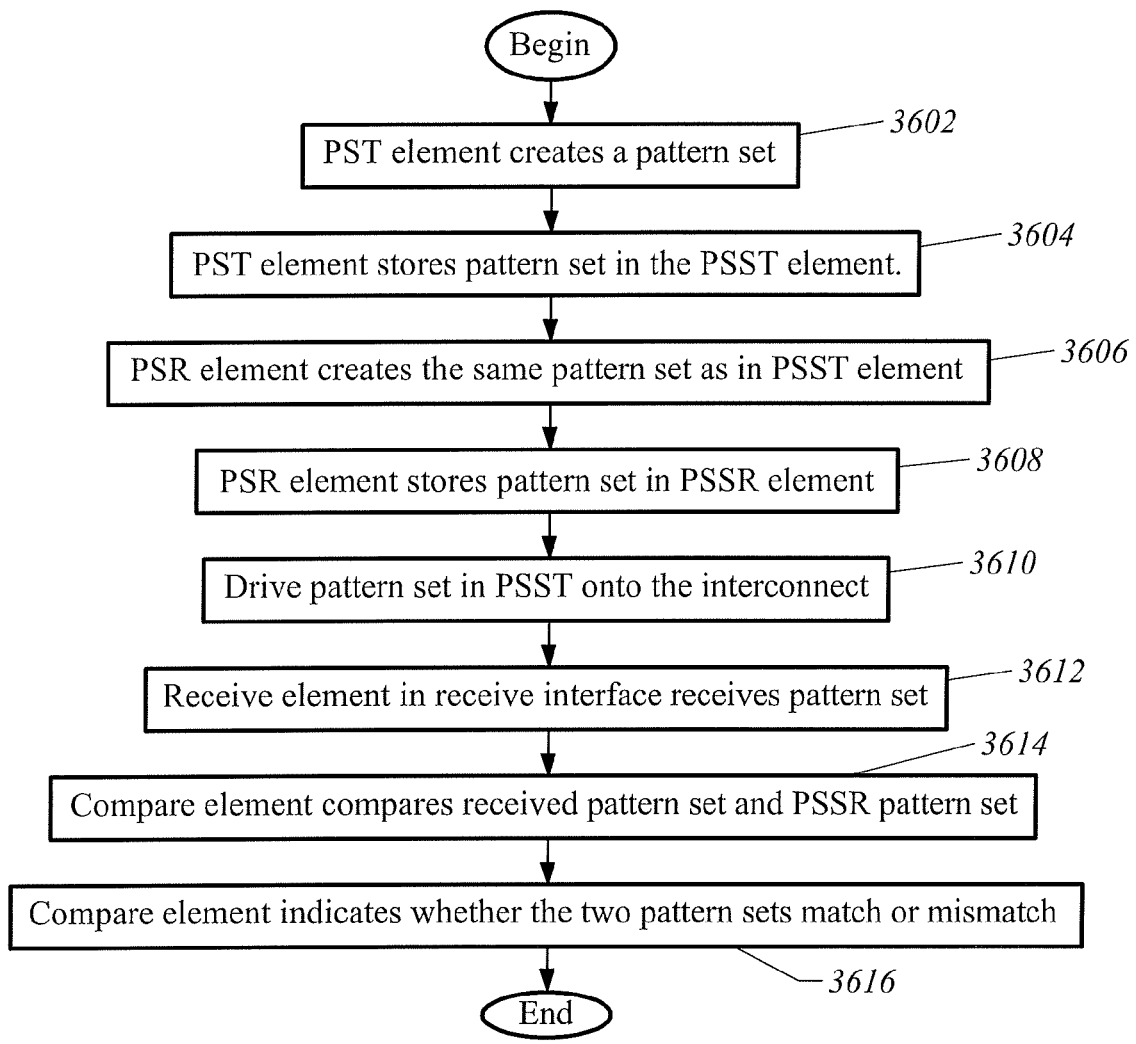
FIG. 36 is a flow diagram of an embodiment of a pattern generation, storage and comparison process.

One process for transmitting and receiving a pattern set in the embodiment of a FIG. 34 is illustrated in the flow diagram of FIG. 36. At logic block 3602, the PST element 3446A2 creates a pattern set. The pattern set is stored in the PSST 3460A2 at logic block 3604. The PSR element 3446A1 creates the same pattern set as the one stored in the PSST 3460A2 at logic block 3606, and stores it in the PSSR 3460A1 at logic block 3608. The pattern set is driven onto the interconnect at 3610, and is received in the receive interface 3400A1 at logic block 3612. The compare element 3448 compares the received pattern set and the pattern set stored in the PSSR 3460A1 at logic block 3614. At logic block 3616, the compare element 3448 indicates whether the compared pattern sets matched or not.

Variations for Compare Element

There are several variations in the way in which the compare element 3448 may be used in different embodiments. In one embodiment, the compare element couples to one or more of the sideband signals. The sideband signals may be the same signals received by the transmit interface 3400A2 or the receive interface 3400A1, or they may be different. The sideband signals may couple to circuitry elsewhere on the same component. Alternatively, the sideband signals may couple to circuitry, which is external to the component. In the alternative case, the sideband signals usually have a lower signaling bandwidth than the high-speed signal driven by the transmit interface 3400A2. The compare element 3448 drives a signal indicating a match/mismatch status onto the sideband signal(s) as each pattern set is compared. In another embodiment, the match/mismatch signal is accumulated after each pattern set, and driven onto the sideband signal(s) after two or more pattern sets have been compared.

Pattern Source ("PS") Sharing Between Transmit and Receive Interfaces

Figure 37:
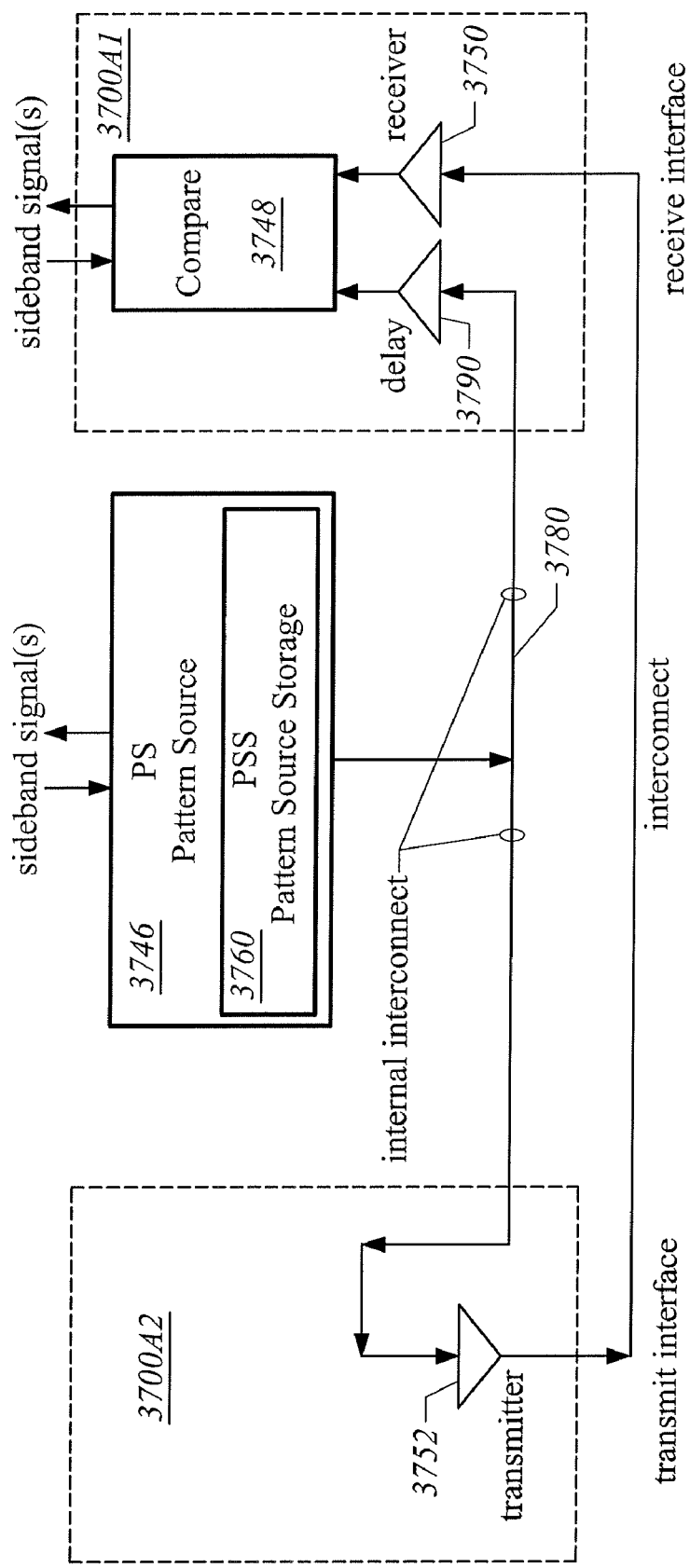
FIG. 37 is a block diagram of a transmit interface, a receive interface, and shared pattern generation and storage elements, according to one embodiment.

FIG. 37 is a block diagram of an embodiment in which elements are shared between the transmit and receive interfaces. A pattern source ("PS") element 3746 and a pattern source storage ("PSS") element 3760 are shared between a transmit interface 3700A2 and a receive interface 3700A1. Transmit interface 3700A2 is coupled to receive interface 3700A1 by internal interconnect 3780 and an external interconnect. The receive interface includes a compare element 3748 and a receiver 3750. The transmit interface 3700A2 includes a transmitter 3752. Typically, this arrangement is possible for cases in which the transmit interface 3700A2 and the receive interface 3700A1 reside on the same component (this is the case in FIGS. 35A and 35B). When the PS element 3746 and the PSS element 3760 are shared, the area required for the circuitry is reduced.

Certain consequences of this arrangement are taken into account when the arrangement is used. For example, the pattern set should be supplied to the transmit interface 3700A2 earlier than to the receive interface 3700A1. This is a result of the time it takes for the pattern set to be driven through the circuitry of the transmit interface 3700A2, through the interconnect 3780, and through the circuitry of the receive interface 3700A1. In one embodiment, delay element 3790 is placed in the path between the PS element 3746 and the compare element 3748. The delay produced by the delay element 3790 matches the delay seen for the path that passes through the interconnect 3780. In another embodiment (not shown), the PSS element 3760 is implemented with circuitry that permits two simultaneous accesses, one for a pattern set for the transmitter 3752, and one for a pattern set for the compare element 3748.

Pattern Generation—Component with Memory Array

The discussion of the pattern generation apparatus and methods to this point is applicable to components classified as "logic" components, components classified as "memory" component, and components classified as some combination of logic and memory. For purposes of discussion herein, a memory array includes as set of storage cells in an array, surrounded by logic circuitry that permits access operations to the storage cells. Components that contain one or more such memory arrays will be called memory components. Components with no such memory array will be called logic components. Components that have one or more such memory arrays as well as significant amounts of other circuitry that does not directly support accesses to the memory array(s) will be called logic components with embedded memory.

The presence of one or more memory arrays in a memory component or a logic component with embedded memory introduces two issues that are relevant to pattern generation. First, the memory array itself needs to be tested. This memory testing is different from the testing needed for the transmit and receive interfaces of the component. It is also different from the testing needed for the logic portions of the component, if logic circuitry is present. Second, the memory array provides a storage resource that is not available in a logic-only component. This resource means that a pattern source storage element (for example PSST 3460A1 or PSST 3460A2 in FIG. 34) can reduced in size. For example, the size of the pattern source element may be reduced to only the size of a buffer between the pattern source element and the memory array(s).

Transmit and Receive Interfaces with Shared Memory Array

Figure 38:
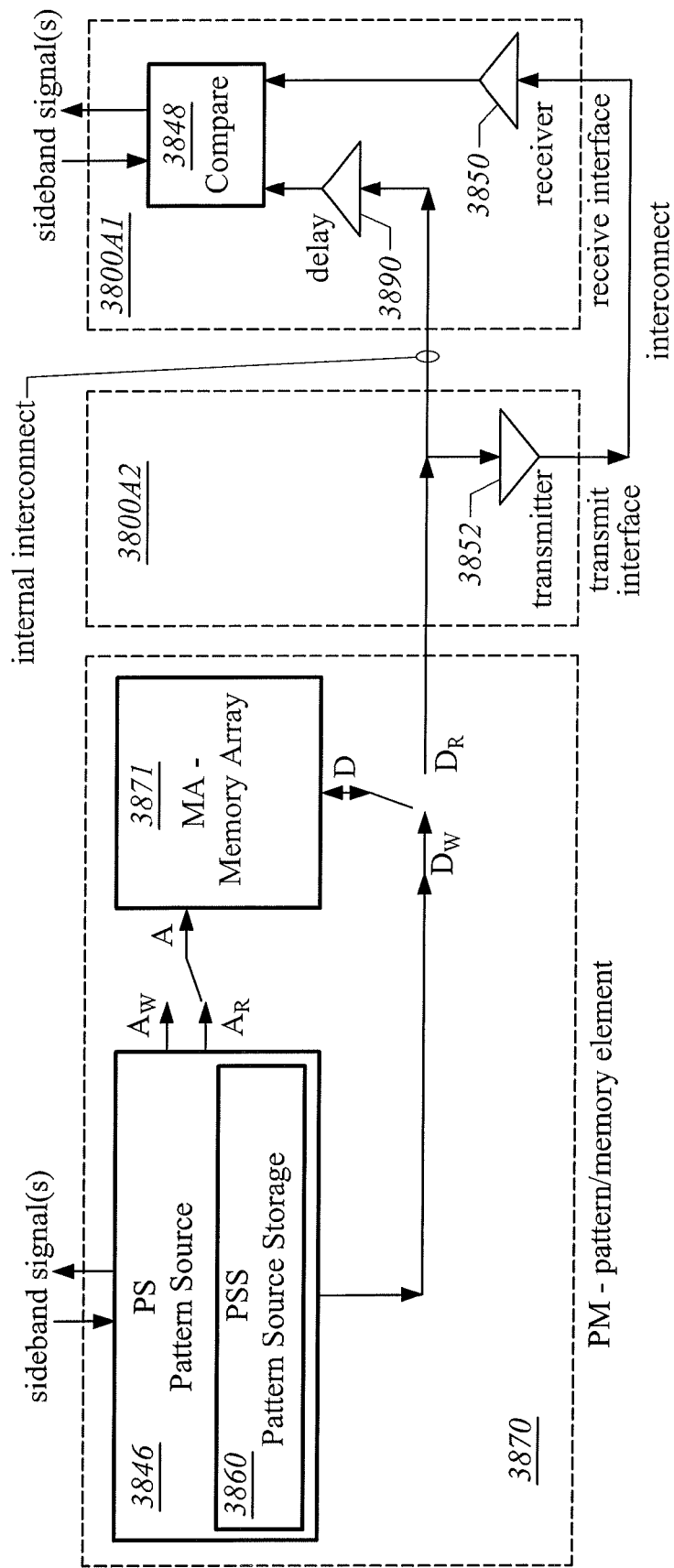
FIG. 38 is a block diagram of a transmit interface, a receive interface, and shared pattern generation and storage elements, according to one embodiment.

FIG. 38 is a block diagram of an embodiment with a memory array element incorporated into a pattern generation process similar to those already described with reference to FIGS. 34-37. In the embodiment of FIG. 38, a PS element 3846 and a memory array ("MA") element 3871 are included in a pattern/memory ("PM") element 3870 that is shared between a transmit interface 3800A2 and a receive interface 3800A1. This transmit interface 3800A2 includes a transmitter 3852. The receive interface 3800A1 includes a receiver 3850, a compare element 3848, and a delay element 3890. The transmit interface 3800A2 and the receive interface 3800A1 reside on the same component, as in FIGS. 35A and 35B.

In a similar fashion to the PS elements of FIGS. 34 and 37, the PS element 3846 generates a set of patterns for test and characterization. The pattern set is a sequence of digital symbols, typically bits, which are driven by the transmit interface in a continuous, uninterrupted stream. In various embodiments, the pattern set is generated by various methods by the PS element 3846. The various methods are similar to the methods previously described with reference to FIGS. 35A and 35B, and are controlled by a set of sideband signals. The sideband signals may couple to circuitry elsewhere on the same component. Alternatively, the sideband signals may couple to circuitry external to the component. The sideband signals typically have a lower signaling bandwidth than the high-speed signal driven by the transmit interface in the alternative case. This permits the pattern set to be provided by a low-bandwidth test system.

The PS element 3846 includes PSS element 3860, which includes internal read/write memory/register circuitry for pattern storage. The PSS element 3860 permits a pattern set to be accumulated from any source. Accumulation of the pattern set may be necessary if the pattern creation process is slower than the pattern transmit and pattern receive processes. The amount of storage is typically dictated by the size of the pattern set desired. Storing the pattern set permits the pattern set to be transmitted in an uninterrupted burst.

Various embodiment of the PS element 3846 are similar to those described with reference to the PS elements in FIGS. 34 and 37. Because the MA element 3871 is available for pattern storage, the PSS element may be smaller than the PSS in components with no memory array element. The size of the PSS element 3860 is dictated by the amount of information that is written (or read) by the MA element 3871 in a single access cycle. In one embodiment, the MA element 3871 is a single port structure; that is, it may perform one access at a time. Each access requires one access cycle, and may either read or write a fixed amount of information in that access cycle.

This is illustrated in FIG. 38, in which the MA element 3871 receives either a read address ($A_R$) or write address ($A_W$), but not both simultaneously. In a similar fashion, the data port (D) of the MA element 3871 may either supply read data ($D_R$) or accepts write data ($D_W$), but not both simultaneously. Other embodiments include a memory array with more than a single port. The methods described herein are equally applicable to such a structure. For example, a two-port memory array capable of performing a read operation and a write operation simultaneously can replace any of the one port memories described herein. In some cases, a two port memory can replace two of the one port memories. However, memory arrays with more than a single port are more costly, and are typically limited to specialized applications.

Various implementations of the compare element 3848 are similar to those previously described with reference to the compare elements in FIGS. 34 and 37.

Figure 39:
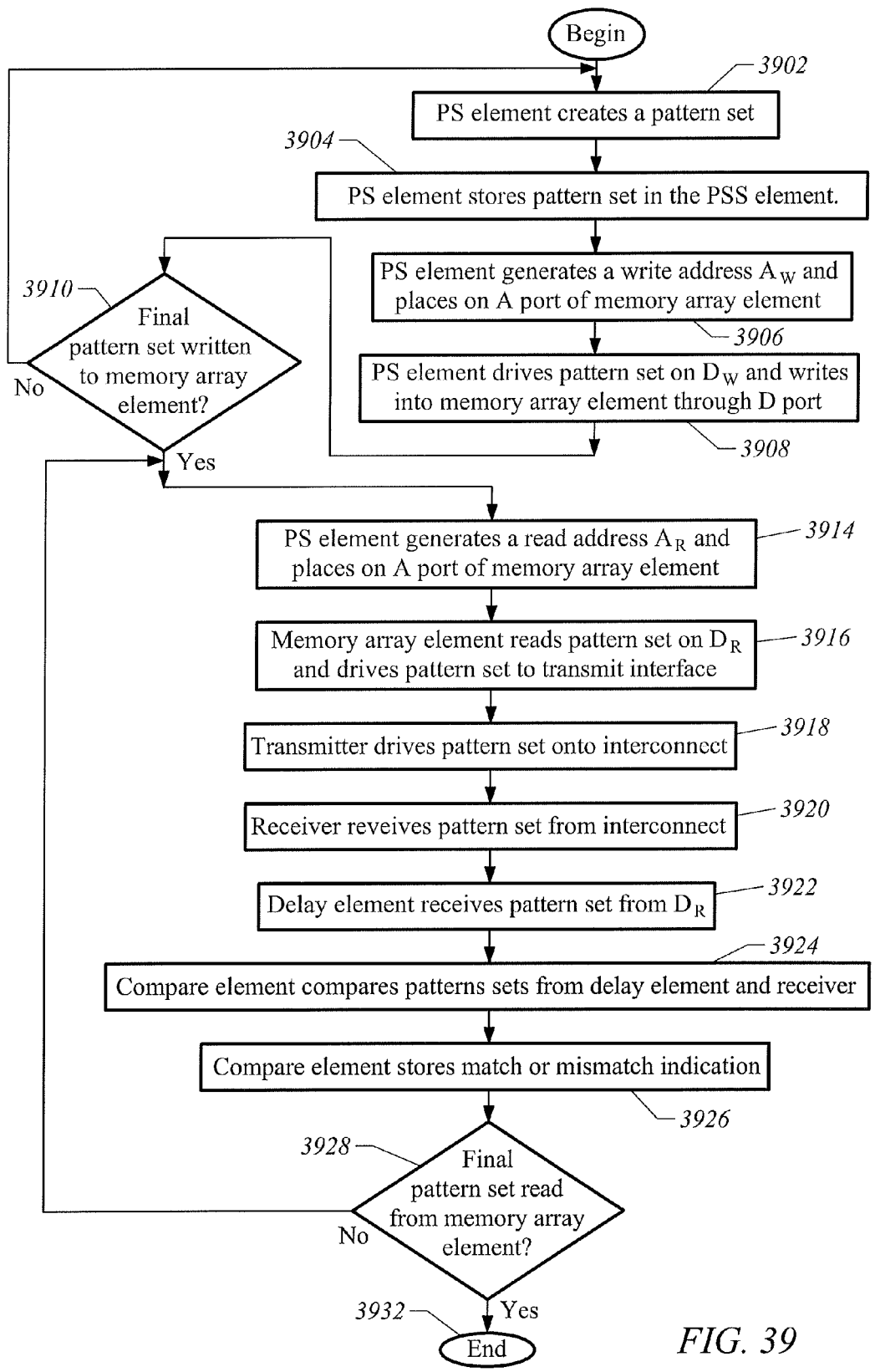
FIG. 39 is a flow diagram of an embodiment of a pattern generation, storage and comparison process.

FIG. 39 is a flow diagram of a pattern generation process according to the embodiment of FIG. 38. In one embodiment, a pattern set is the same size as the amount of information read or written by the MA element 3871 in a single access cycle. At logic block 3902, the PS element 3846 creates a pattern set. The PS element 3846 stores the pattern set in the PSS element 3860 at logic block 3904. At logic block 3906, the PS element 3846 drives the pattern set on $D_W$ and writes into the MA element 3871 through the D port. If the final pattern set is written to the MA element 3871, as shown at logic block 3910, the PS element generates a read address $A_R$ and places it on the A port of the MA element 3871 at logic block 3914. If the final pattern set has not yet been written to the MA element 3871, as shown at logic block 3910, then one or more logic blocks 3902-3910 are repeated.

At logic block 3916, the MA element 3871 reads a pattern set on $D_R$ and drives the pattern set to the transmit interface 3800A2. The transmitter 3852 drives the pattern set onto the interconnect at logic block 3918. The receiver 3850 receives the pattern set from the interconnect at logic block 3920, and the delay element 3890 receives the pattern set from $D_R$ at logic block 3922. At logic block 3924, the compare element 3848 compares the pattern sets from the delay element 3890 and the receiver 3850, and at logic block 3926 stores match or mismatch information. It is determined at logic block 3928 whether the final pattern set has been read from memory. If the final pattern set has been read from memory, the process stops at logic block 3932. If the final pattern set has not been read from memory, the one or more logic blocks 3914-3928 are repeated.

The match/mismatch indication is used during test and characterization to indicate whether the parameter settings of the transmit and receive interfaces 3800A2 and 3800A1 are acceptable. The match/mismatch indication in the compare element may be accumulated from one pattern set to the next. In this embodiment, the delay element 3890 is present because the pattern sets are being read from a single port memory array. This delay element 3890 matches the delay seen for the path that passes from the transmitter 3852 through the interconnect and into the receiver 3850.

Transmit and Receive Interfaces with Dedicated Memory Arrays

Figure 40:
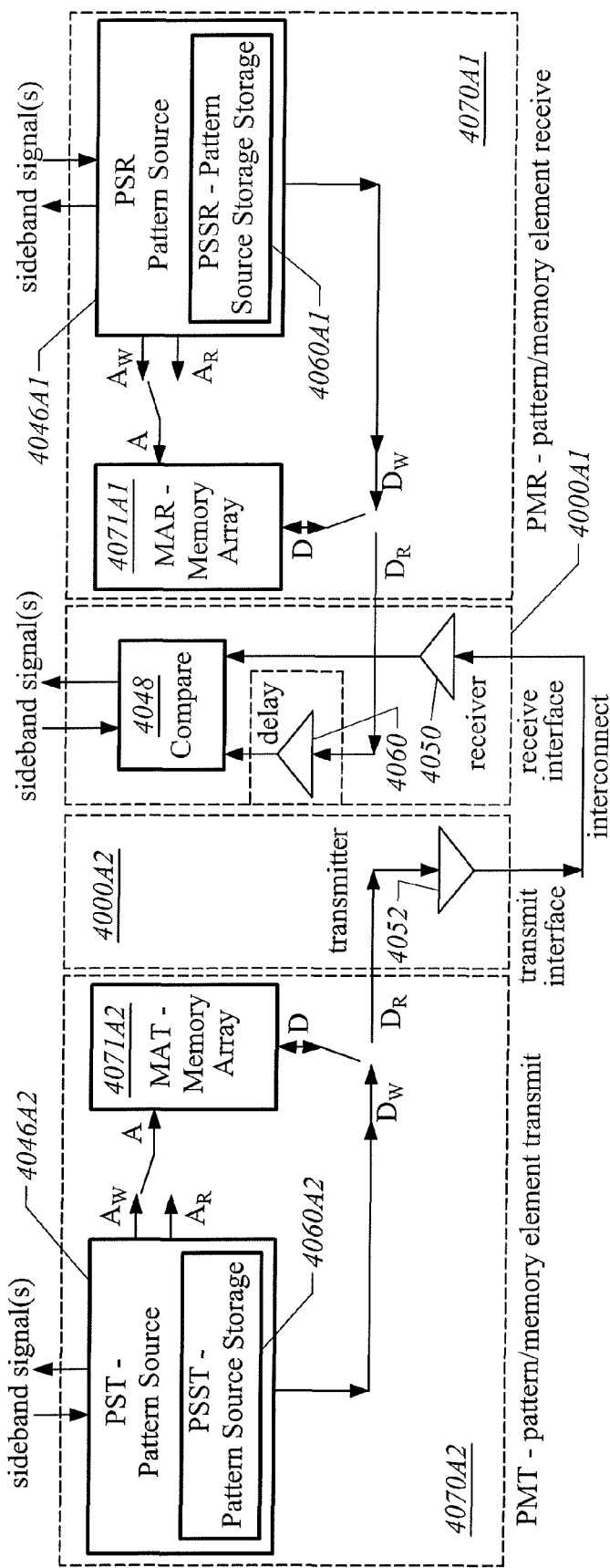
FIG. 40 is a block diagram of a transmit interface, a receive interface, and dedicated pattern generation and storage elements, according to one embodiment.

FIG. 40 is a block diagram of an embodiment of transmit and receive interfaces with dedicated memory arrays. A transmit interface 4000A2 includes a transmitter 4052, and is coupled to a dedicated transmit pattern/memory ("PMT") element 4070A2. The PMT 4070A2 includes a PST element 4046A2, a PSST 4060A2, and a transmit memory array ("MAT") 4071A2. The transmit interface 4000A2 communicates with a receive interface 4000A1 through an interconnect. The receive interface 4000A1 includes a receiver 4050, a compare element 4048, and an optional delay element 4060. The receive interface is coupled to a dedicated receive pattern/memory element ("PMR") 4070A1. The PMR 4070A1 includes a PSR element 4046A1, a PSSR 4060A1, and a receive memory array ("MAR") 4071A1. The dedicated pattern source and memory array elements allow the transmit interface 4000A2 and the receive interface 4000A1 to reside on the same component or on different components. For example, the transmit interface 4000A2 and the receive interface 4000A1 may be arranged as shown in any of the FIG. 35A-35B or 35C.

Figure 41A:
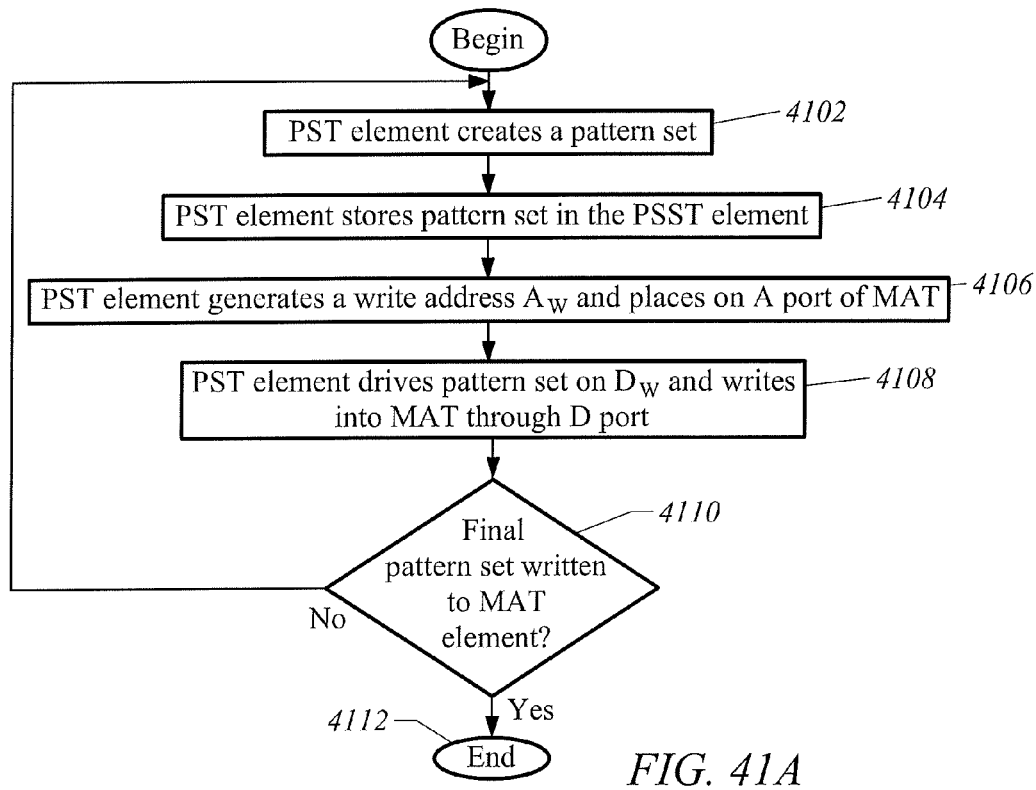
FIGS. 41A-C are flow diagrams of an embodiment of a pattern generation, storage and comparison process.
Figure 41B:
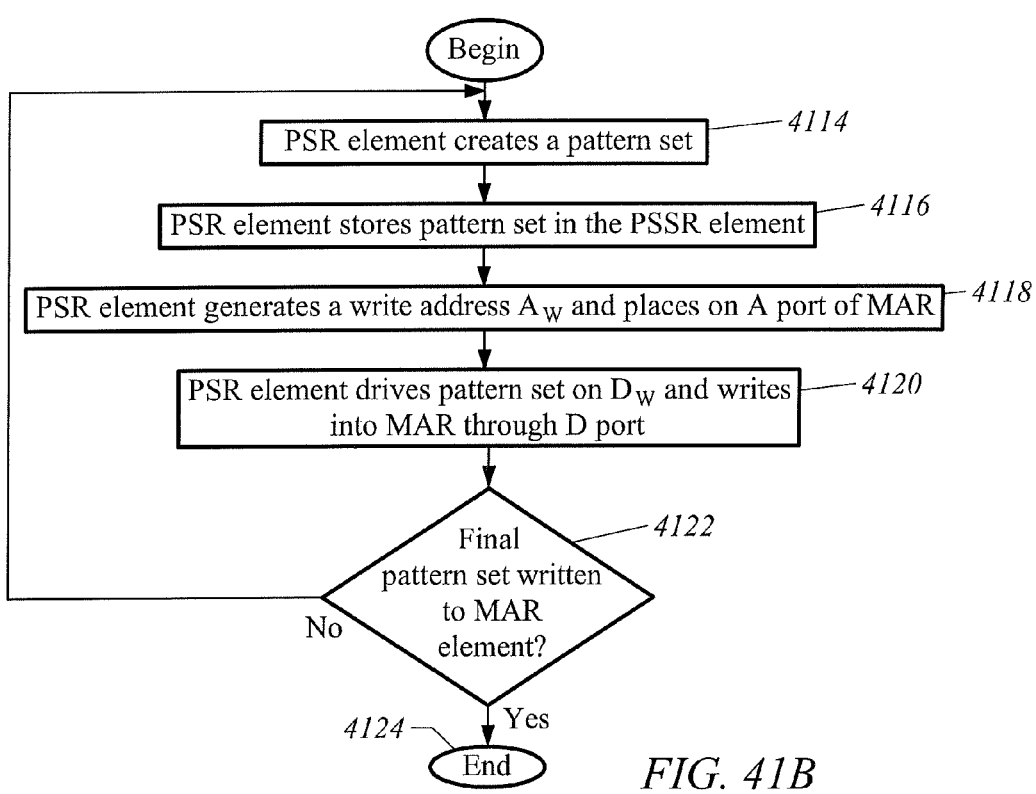
Figure 41C:
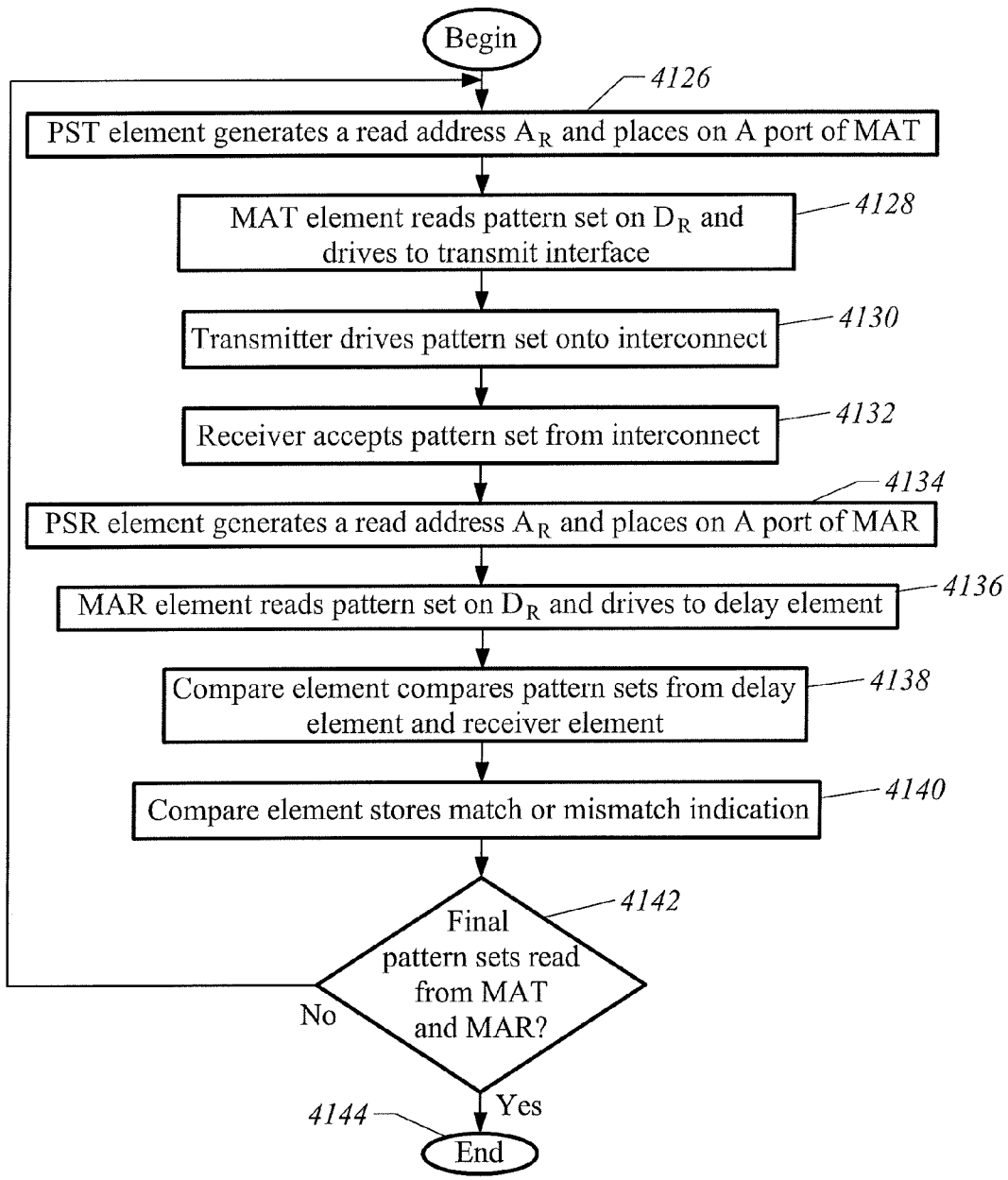

FIGS. 41A-C are flow diagrams of a pattern generation process according to the embodiment of FIG. 40. At logic block 4102, the PST element 4046A2 creates a pattern set as seen in FIG. 41A. At logic block 4104, a pattern set is stored in the PSST element 4060A2. At logic block 4106, the PST element 4046A2 generates a write address $A_W$ and places on A port of the MAT 4071A2. The PST element 4046A2 then drives the pattern set on $D_W$ and writes it into the MAT 4071A2 through the D port at logic block 4108. At logic block 4110, it is determined whether the final pattern set has been written to the MAT element 4071A2. If the final pattern set has not been written, the one or more logic blocks 4102-4108 are repeated. If the final pattern set has been written, the transmit side pattern generation and storage are done at logic block 4112.

The PSR element 4046A1 creates a pattern set at logic block 4114, and stored the pattern set in the PSSR element 4060A1 at logic block 4116 as shown in FIG. 41B. At logic block 4118, the PSR element 4046A1 generates a write address $A_W$ and places it on the A port of the MAR element 4071A1. At logic block 4120, the PSR element 4046A1 drives a pattern set on $D_W$ and writes it into the MAR element 4071A1 through the D port. At logic block 4122, it is determined whether the final pattern set has been written to the MAR element 4071A1. If the final pattern set has not been written to the MAR element 4071A1, one or more logic blocks 4114-4120 are repeated. If the final pattern set has been written to the MAR element 4071A1, the receive side pattern generation and storage are done at logic block 4124.

Pattern generation and storage for the transmit side, as described at logic block 4102-4110, and pattern generation and storage for the receive side, as described at logic block 4114-4120 may be in the order as described. Alternatively, however, pattern generation and storage for the transmit side and the receive side are done in any order. For example, the receive side process may be done before the transmit process and vice versa, the receive side process and the transmit side process can be performed simultaneously, actions in each of the respective processes may be interleaved, etc.

At logic block 4126 shown in FIG. 41C, the PST element 4046A2 generates a read address $A_R$ and places it on the A port of the MAT element 4071A2. The MAT element 4071A2 reads the pattern set on $D_R$ and drives it to the transmit interface 4000A2 at logic block 4128. At logic block 4130, the pattern set is driven onto interconnect by the transmitter 4052. The receiver 4050 accepts the pattern set from the interconnect at logic block 4132. The PSR element 4046A1 generates a read address $A_R$ and places it on the A port of the MAR element 4071A1 at logic block 4134. The MAR element 4071A1 reads the pattern set on $D_R$ and drives it to the delay element 4060 at logic block 4136. The compare element 4048 compared pattern sets from the delay element 4060 and the receiver 4050 at 4138. At logic block 4140, the compare element 4048 stores the match or mismatch indication from the compare. At logic block 4142, it is determined whether the final pattern set has been read form the MAT element 4071A2 and from the MAR element 4071A1. If the final pattern set has not been read from the MAT element 4071A2 and from the MAR element 4071A1, one or more logic blocks 4126-4142 are repeated. If the final pattern set has been read from the MAT element 4071A2 and from the MAR element 4071A1, the pattern generation and comparison process stops at logic block 4144.

The match/mismatch indication is used during test and characterization to indicate whether the parameter settings of the transmit and receive interfaces are acceptable. The match/mismatch indication in the compare element 4048 may be accumulated from one pattern set to the next. In this embodiment, the delay element 4060 is present. This delay element 4060 matches the delay seen for the path that passes from the transmitter 4052 through the interconnect and into the receiver 4050. The delay element 4060 is optional, however. If the delay element 4060 is not present, the timing of the PSR element 4046A1 and the MAR element 4071A1 is adjusted to create an offset relative to the PST element 4046A2 and the MAT element 4071A2. This offset matches the delay seen for the path that passes from the transmitter 4052 through the interconnect and into the receiver 4050, and has the same effect as the delay element.

Figure 42:
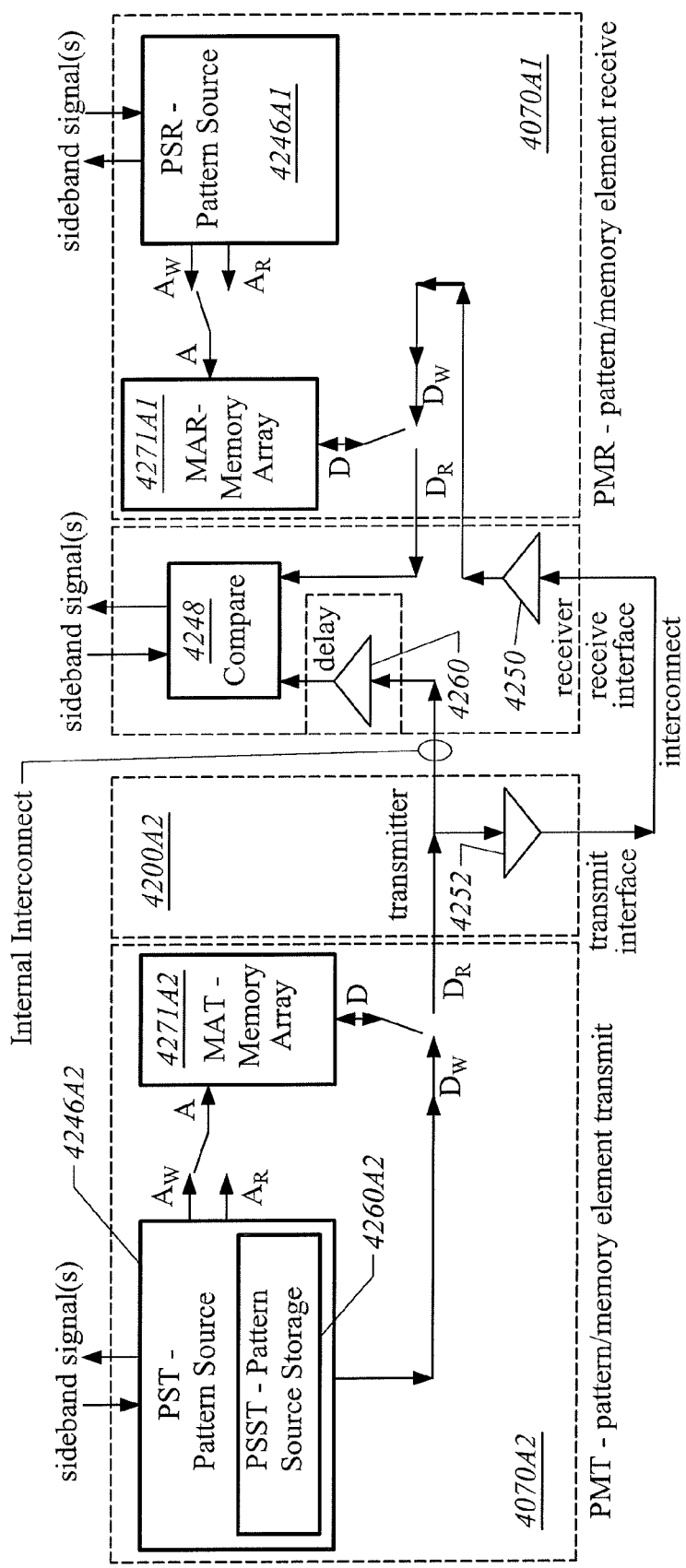
FIG. 42 is a block diagram of a transmit interface, a receive interface, and dedicated pattern generation and storage elements, according to one embodiment.

FIG. 42 is a block diagram of another embodiment of transmit and receive interfaces with dedicated memory arrays. Individual elements of FIG. 42 are analogous to similarly named and numbered elements of FIG. 40, and will not be described in detail. As will be further described, the embodiment of FIG. 42 is suitable for the processes of transmitting and receiving pattern sets that are similar to the processes previously described. In this embodiment, however, the MAR element is both read and written during the process, as contrast to the processes described with reference to FIGS. 38 and 40, in which the MAR and MAT elements are only written to when the patterns are initially loaded.

Figure 43A:
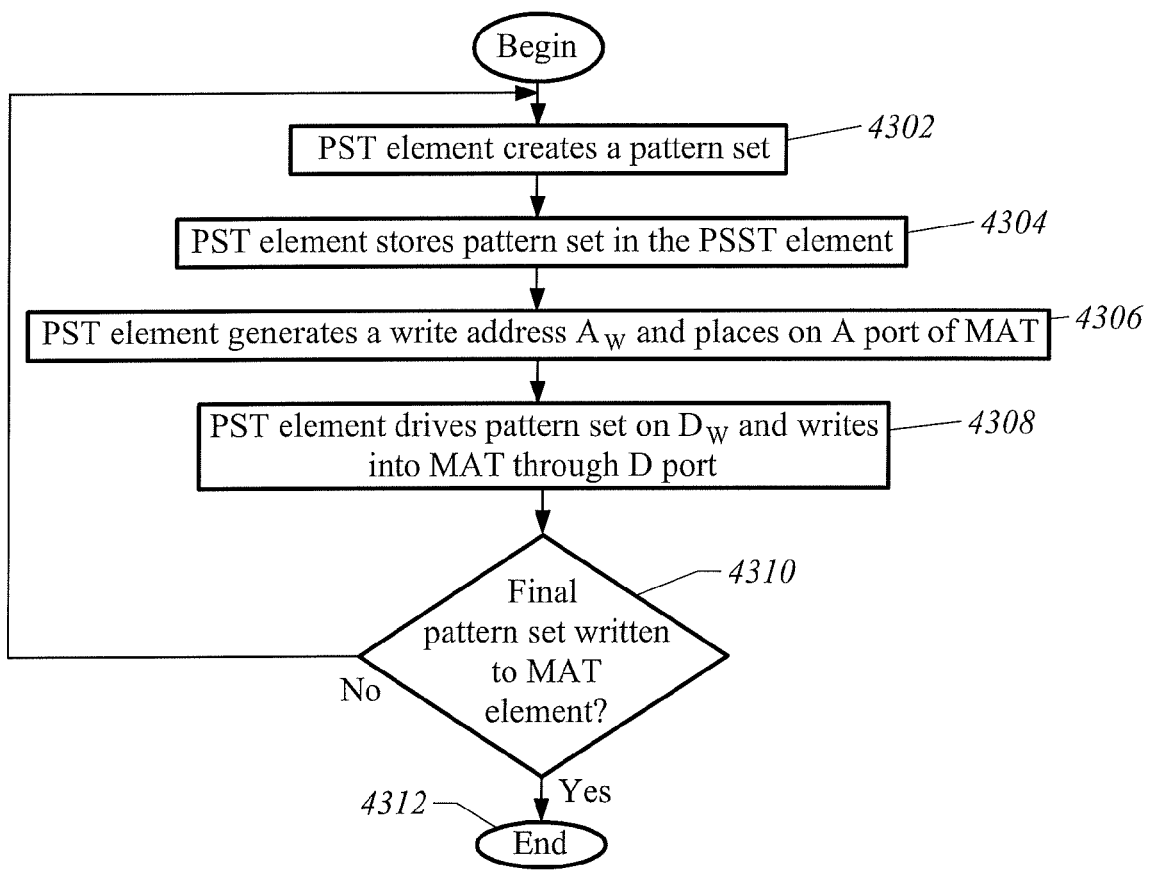
FIGS. 43A-C are flow diagrams of an embodiment of a pattern generation, storage and comparison process.
Figure 43B:
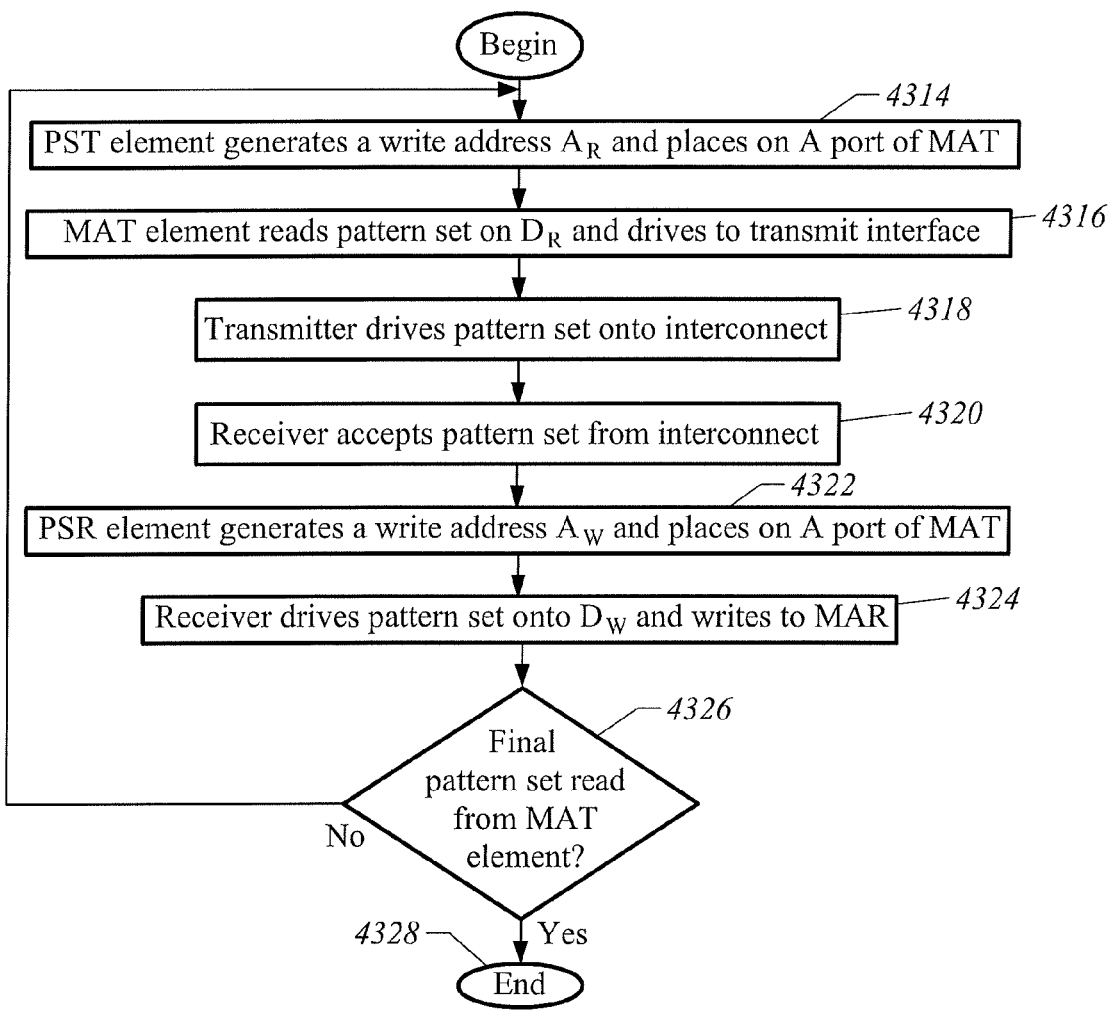
Figure 43C:
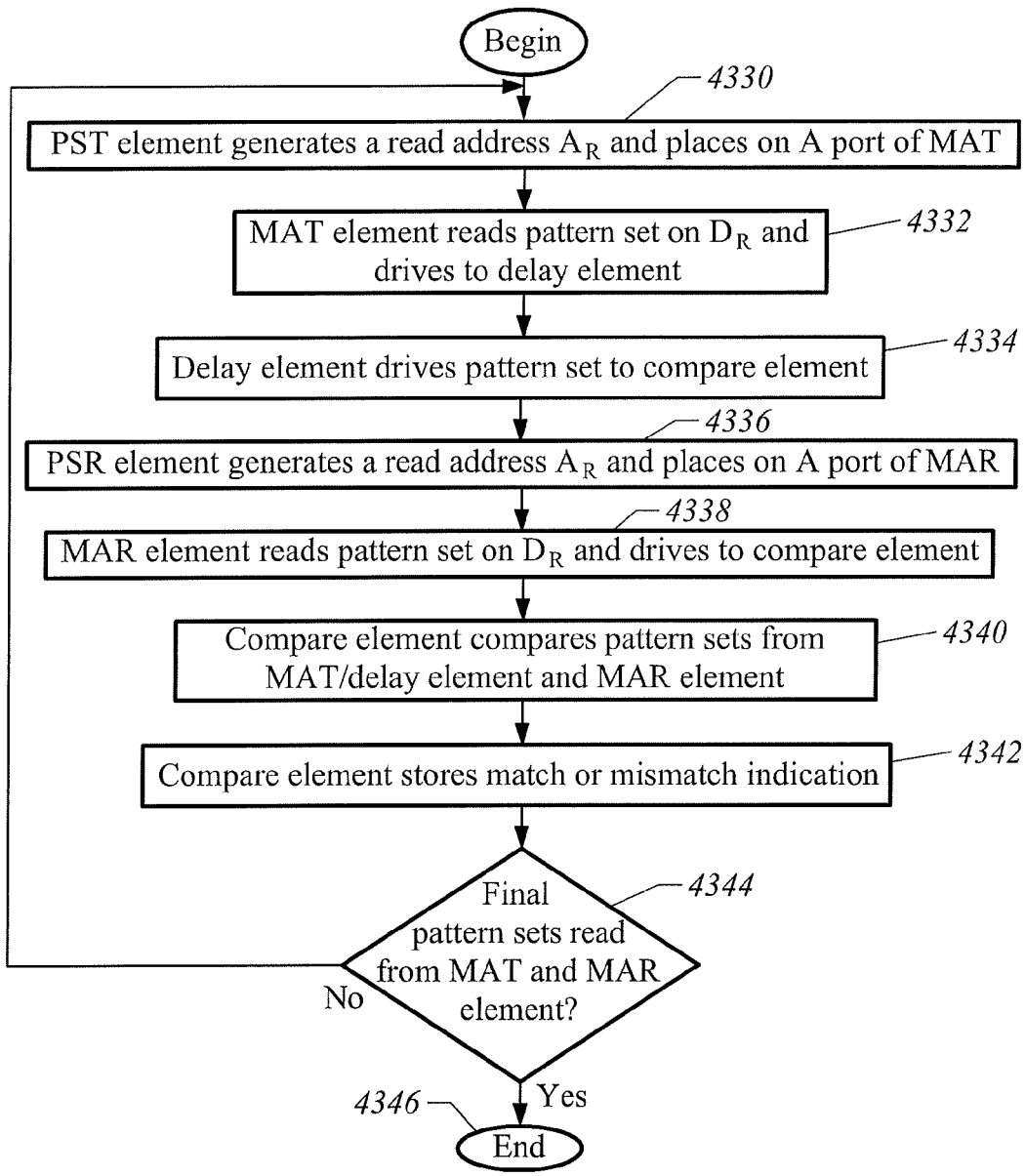

FIGS. 43A-C are flow diagrams of a pattern generation, storage, and comparison process, described with further reference to FIG. 42. FIGS. 43A-C illustrate an embodiment of a process that allows additional testing of memory arrays, as well as testing of transmit interfaces and receive interfaces. The PST element 4246A2 creates a pattern set at logic block 4302 and stores it in the PSST element 4260A2 at logic block 4304 as seen in FIG. 43A. The PST element 4246A2 generates a write address $A_W$ and places on A port of the MAT element 4271A2 at logic block 4306. At logic block 4308, the PST element drives the pattern set on $D_W$ and writes it into the MAT element 4271A2 through the D port. At logic block 4310, it is determined whether the final pattern set was written to the MAT element 4271A2. If the final pattern set was not written, one or more logic blocks 4302-4310 are repeated. If the final pattern set was written, writing to the MAT element 4071A2 is done at logic block 4312.

At logic block 4314 shown in FIG. 43B, the PST element 4246A2 generates a read address $A_R$ and places it on the A port of the MAT element 4271A2. The MAT element 4271A2 reads the pattern set on $D_R$ and drives it to the transmit interface 4200A2 at logic block 4316. At logic block 4318, the transmitter 4252 drives the pattern set onto the interconnect. The receiver 4250 accepts the pattern set from the interconnect at logic block 4320. At logic block 4322, the PSR element 4246A1 generates a write address $A_W$ and places it on the A port of the MAR element 4271A1. The receiver 4250 drives the pattern set onto $D_W$ and writes it to the MAR element 4271A1 at logic block 4324. At logic block 4326, it is determined whether the final pattern set was read from the MAT element 4271A2. If the final pattern set was not read, one or more logic blocks 4314-4326 are repeated. If the final pattern set was read, reading from the MAT element 4271A2 is done at logic block 4328.

At logic block 4330, the PST element 4246A2 generates a read address $A_R$ and places it on the A port of the MAT element 4271A2. The MAT element 4271A2 reads the pattern set on $D_R$ and drives it to the delay element 4260 at logic block 4332. At logic block 4334, the delay element 4260 drives the pattern set to the compare element 4248. The PSR element 4246A1 generates a read address $A_R$ and places it on the A port of the MAR element 4271A1 at logic block 4336. The MAR element 4271A1 reads the pattern set on $D_R$ and drives it to the compare element 4248 at logic block 4338. At logic block 4340, the compare element 4248 compares the patterns sets from the delay element 4260 (which came from the MAT element 4271A2) and the MAR element 4271A1. The compare element 4248 stores the match or mismatch indication at logic block 4342. At logic block 4344, it is determined whether the final pattern sets have been read from the MAT element 4271A2 and the MAR element 4271A1. If the final pattern sets have not been read, one or more logic blocks 4330-4344 are repeated. If the final pattern sets have been read, then the reading from the MAT element 4271A2 and the MAR element 4271A1, and comparing are done at logic block 4346.

The match/mismatch indication is used during test and characterization to indicate whether the parameter settings of the transmit and receive interfaces are acceptable. The match/mismatch indication in the compare element may be accumulated from one pattern set to the next.

The delay element 4260 is used in this embodiment. The delay element 4260 creates a delay that matches the delay seen for the path that passes from the transmitter 4252 through the interconnect and into the receiver 4250. The delay element is optional, however. In other embodiments that don't include a delay element, the timing of the PSR element 4246A1 and the MAR element 4271A1 are adjusted to be offset relative to the timing of the PST element 4246A2 and the MAT element 4271A2. The offset matches the delay seen for the path that passes from the transmitter 4252 through the interconnect and into the receiver 4250, and has the same effect as the delay element.

Figure 44:
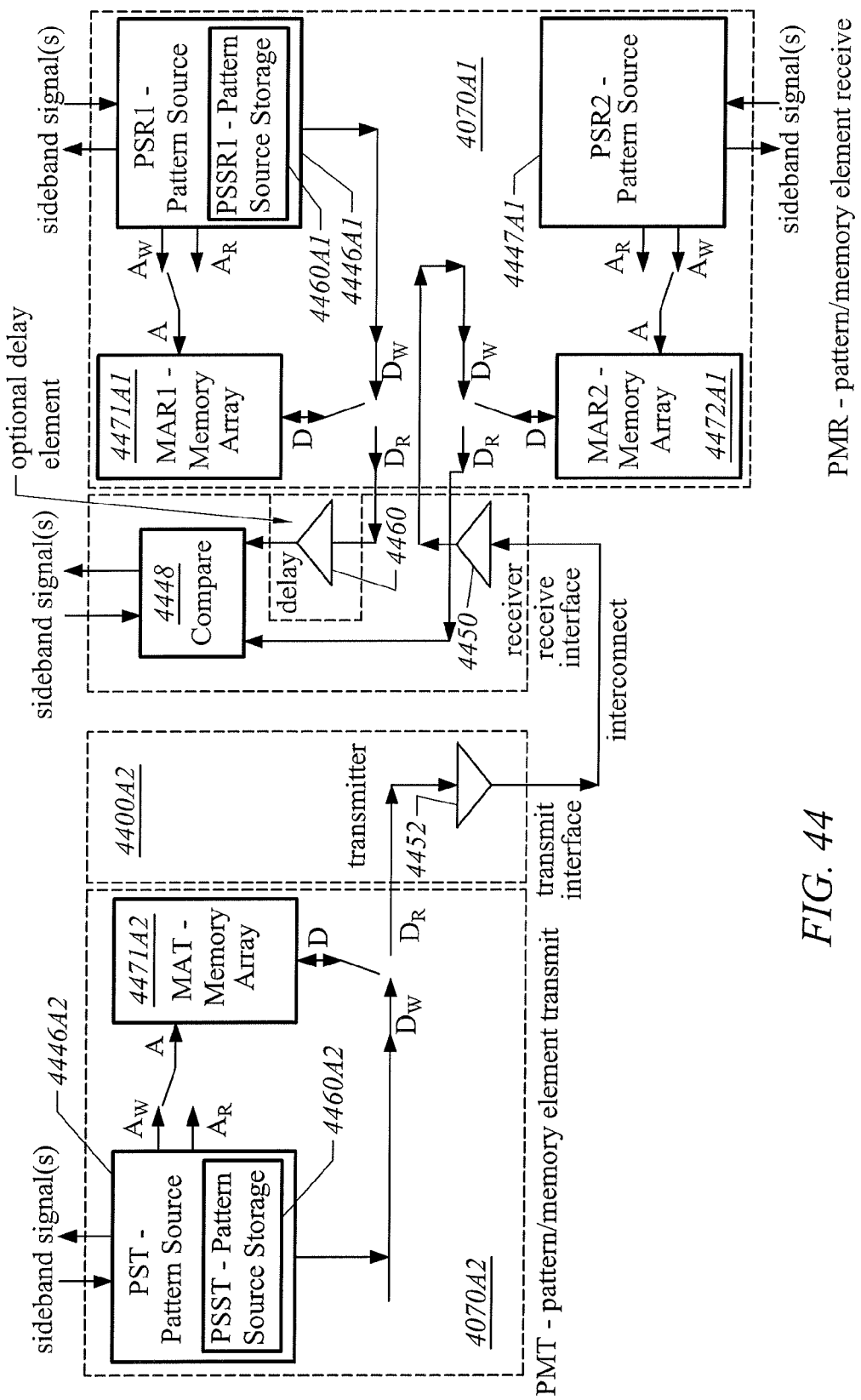
FIG. 44 is a block diagram of a transmit interface, a receive interface, and dedicated pattern generation and storage elements, according to one embodiment.

FIG. 44 is a block diagram of another embodiment of transmit and receive interfaces with dedicated memory arrays. Individual elements of FIG. 44 are analogous to similarly named and numbered elements of FIGS. 40 and 42, and will not be described in detail. The embodiment of FIG. 44 uses a similar process for transmitting and receiving pattern sets to those previously described. In the embodiment of FIG. 44, however, includes additional PS and MA elements not present in previously described embodiments. In the embodiment of FIG. 44, an additional MAR element is both read and written during the process. In contrast, the embodiments of FIGS. 40 and 42 are described as reading and writing MAR and MAT elements only when pattern sets are initially loaded.

FIGS. 45A-D are flow diagrams of a pattern generation, storage, and comparison process, described with further reference to FIG. 44. The process that will be described with reference to FIGS. 44 and 45A-D performs more testing of the memory array, as well as testing of the interfaces. At logic block 4502, the PST element 4446A2 generates a pattern set, and at logic block 4504, stores the pattern set in the PSST element 4460A2. The PST element 4446A2 generates a write address $A_W$ and places on the A port of the MAT element 4471A2 at logic block 4506. At logic block 4508, the PST element 4446A2 drives the pattern set on $D_W$ and writes it into the MAT element 4471A2 through D port. At logic block

4510, it is determined whether the final pattern set was written to the MAT element 4471A2. If the final pattern set was not written to the MAT element 4471A2, one or more logic blocks 4502-4510 are repeated. If the final pattern set was written, then writing to the MAT element 4471A2 is done at logic block 4514.

Figure 45A:
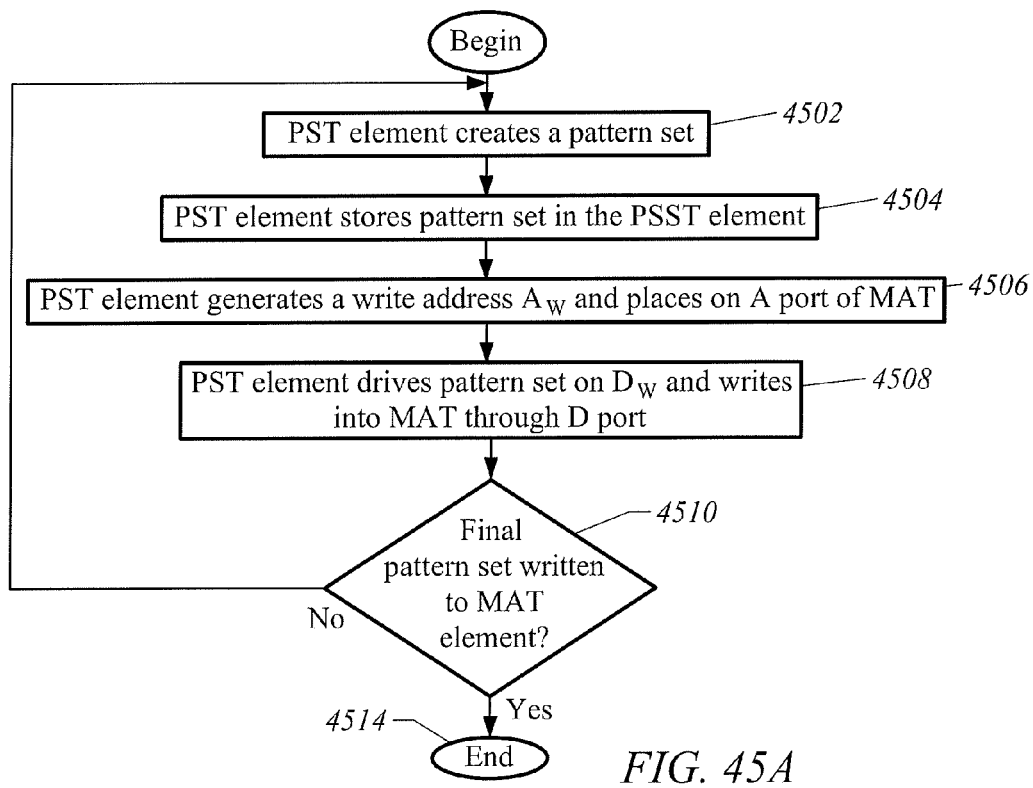
FIGS. 45A-D are flow diagrams of an embodiment of a pattern generation, storage and comparison process.
Figure 45B:
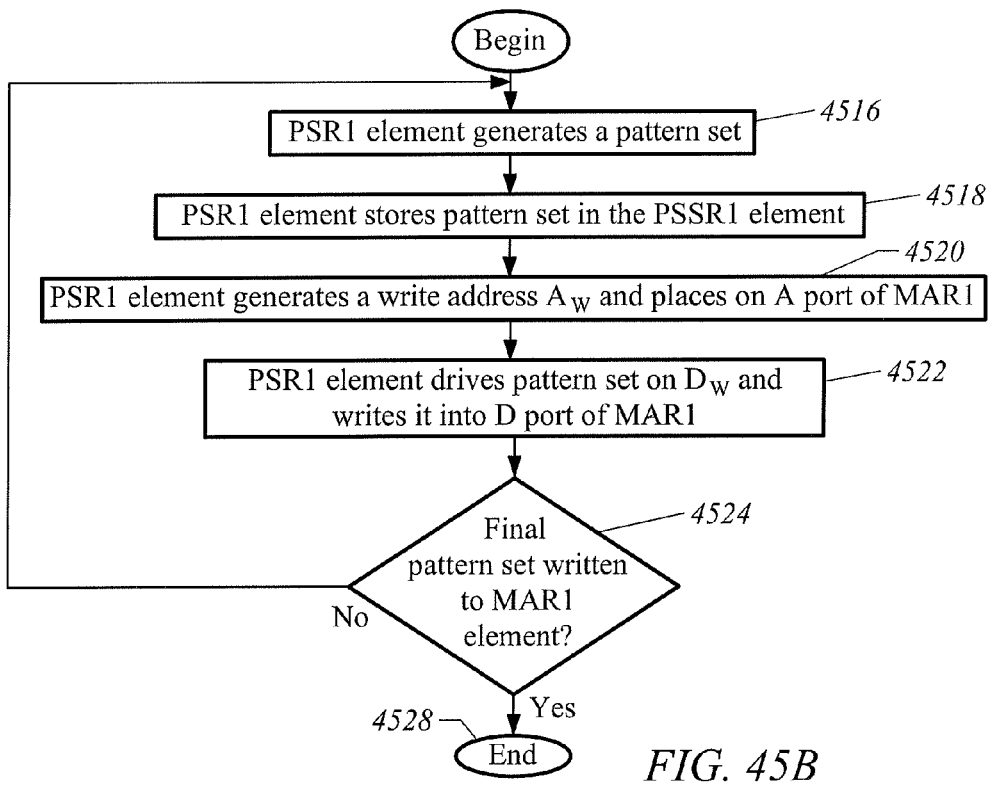

At logic block 4516 shown in FIG. 45B, the PSR1 element 4446A1 generates a pattern set, and at logic block 4518, stores it in the PSSR1 element 4460A1. The PSR1 element 4446A1 generates a write address $A_W$ and places on the A port of the MAR1 element 4471A1 at logic block 4520. At logic block 4522, the PSR1 element 4446A1 drives the pattern set on $D_W$ and writes it into D port of the MAR1 element 4471A1. At logic block 4524, it is determined whether the final pattern set was written to the MAR1 element 4471A1. If the final pattern set was not written to the MAR1 element 4471A1, one or more logic blocks 4514-4524 are repeated. If the final pattern set was written, then writing to the MAR1 element 4471A1 is done at logic block 4528.

Pattern generation and storage for the transmit side, as described at logic blocks 4502-4510, and pattern generation and storage for the receive side, as described at logic blocks 4514-4524 may be in the order as described. Alternatively, however, the actions specified are done in any order. For example, the receive side process may be done before the transmit process and vice versa, the receive side process and the transmit side process can be performed simultaneously, actions in each of the respective processes may be interleaved, etc.

Figure 45C:
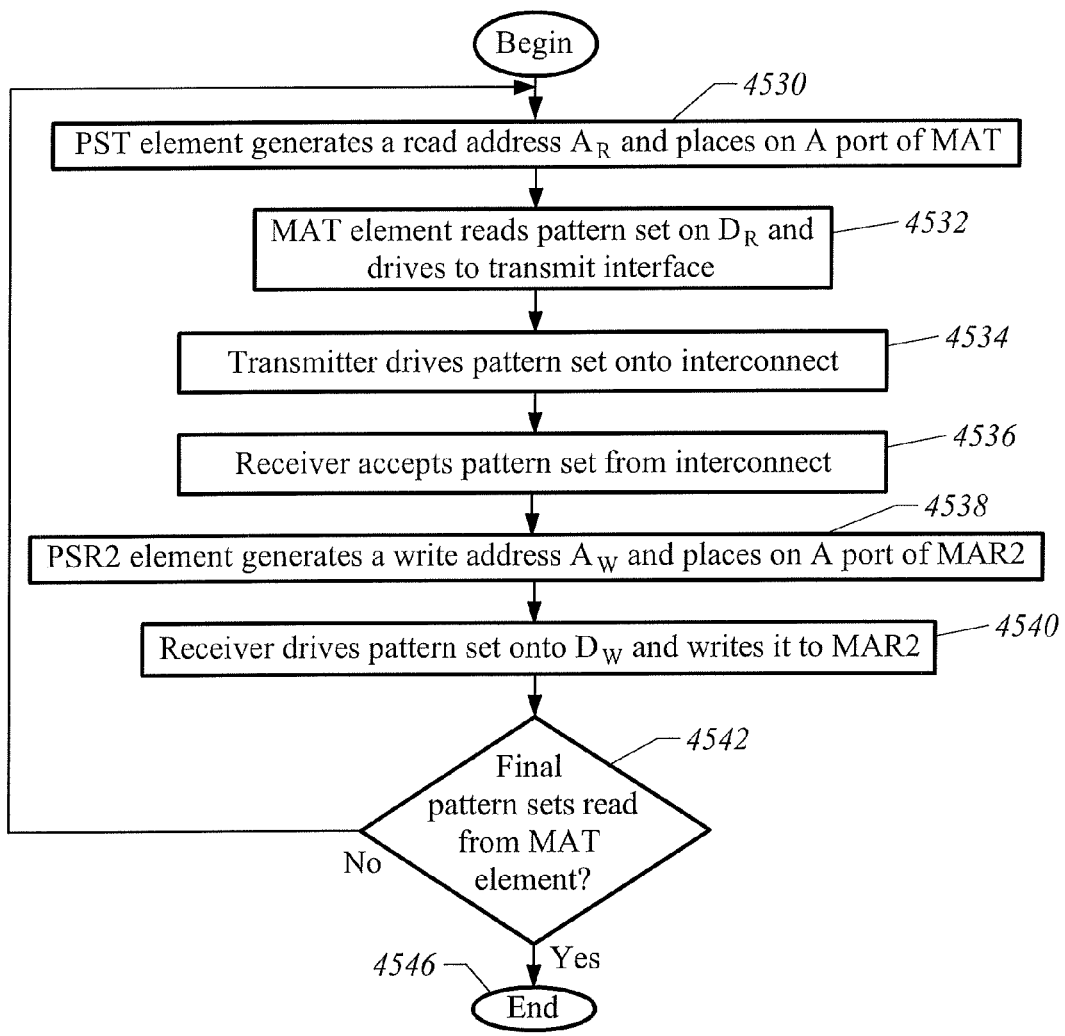

At logic block 4530 shown in FIG. 45C, the PST element 4446A2 generates a read address $A_R$ and places it on the A port of the MAT element 4471A2. The MAT element 4471A2 reads the pattern set on $D_R$ and drives it to transmit interface 4400A2 at logic block 4532. The transmitter 4452 drives the pattern set onto the interconnect at logic block 4534, and at logic block 4536, the receiver 4450 accepts the pattern set from the interconnect. The PSR2 element 4447A1 generates a write address $A_W$ and places on A port of MAR2 element 4472A1 at logic block 4538. At logic block 4540, the receiver 4450 drives the pattern set onto $D_W$ and writes it to the MAR2 4472A1. At logic block 4542, it is determined whether the final pattern set was read from MAT element 4471A2. If the final pattern set was not read from MAT element 4471A2, one or more logic blocks 4530-4542 are repeated. If the final pattern set was read, then reading from the MAT element 4471A2 is done at logic block 4546.

Figure 45D:
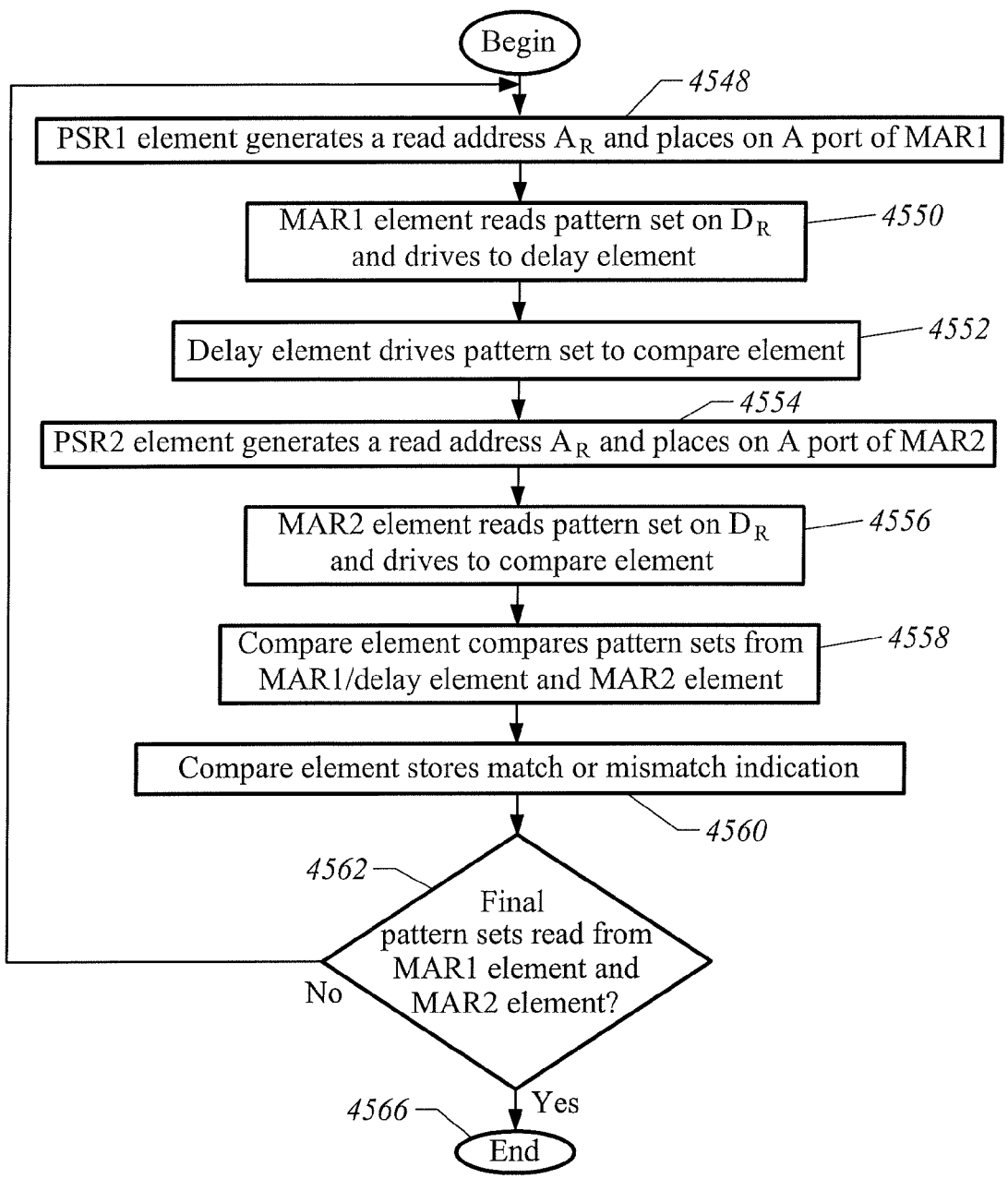

At logic block 4548 shown in FIG. 45D, the PSR1 element 4446A1 generates a read address $A_R$ and places it on the A port of the MAR1 4471A1. The MAR1 element 4471A1 reads the pattern set on $D_R$ and drives it to the delay element 4460 at logic block 4550. At logic block 4552, the delay element 4460 drives the pattern set to the compare element 4448. At logic block 4554, the PSR2 element 4447A1 generates a read address $A_R$ and places it on the A port of the MAR2 element 4472A1. The MAR2 element 4472A1 reads the pattern set on the $D_R$ and drives to the compare element 4448 at logic block 4556. The compare element 4448 compares pattern sets from the delay element 4460 (which come from the MAR1 element 4471A1) and MAR2 element 4472A1 at logic block 4558. At logic block 4560, the compare element stores a match or mismatch indication. At logic block 4562, it is determined whether the final pattern set was read from the MAR1 element 4471A1 and the MAR2 element 4472A1. If the final pattern set was not read, one or more logic blocks 4548-4562 are repeated. If the final pattern set was read, then reading from the MAR1 element 4471A1 and the MAR2 element 4472A1 is done at logic block 4566.

The match/mismatch indication is used during test and characterization to indicate whether the parameter settings of the transmit and receive interfaces are acceptable. The match/mismatch indication in the compare element may be accumulated from one pattern set to the next. The delay element 4460 is used in the embodiment described. The delay element 4460 creates a delay the matches the delay seen for the path that passes from the transmitter 4452 through the interconnect and into the receiver 4450. The delay element 4460 is optional, however. If the delay element 4460 were left out, the timing of the PSR1 element 4446A1 and the MAR1 element 4471A1 is adjusted to be offset relative to the PSR2 element 4447A1 and the MAR2 element 4472A1. The offset matches the delay seen for the path that passes from the transmitter 4452 through the interconnect and into the receiver 4450, and has the same effect as the delay element 4460.

Figure 46:
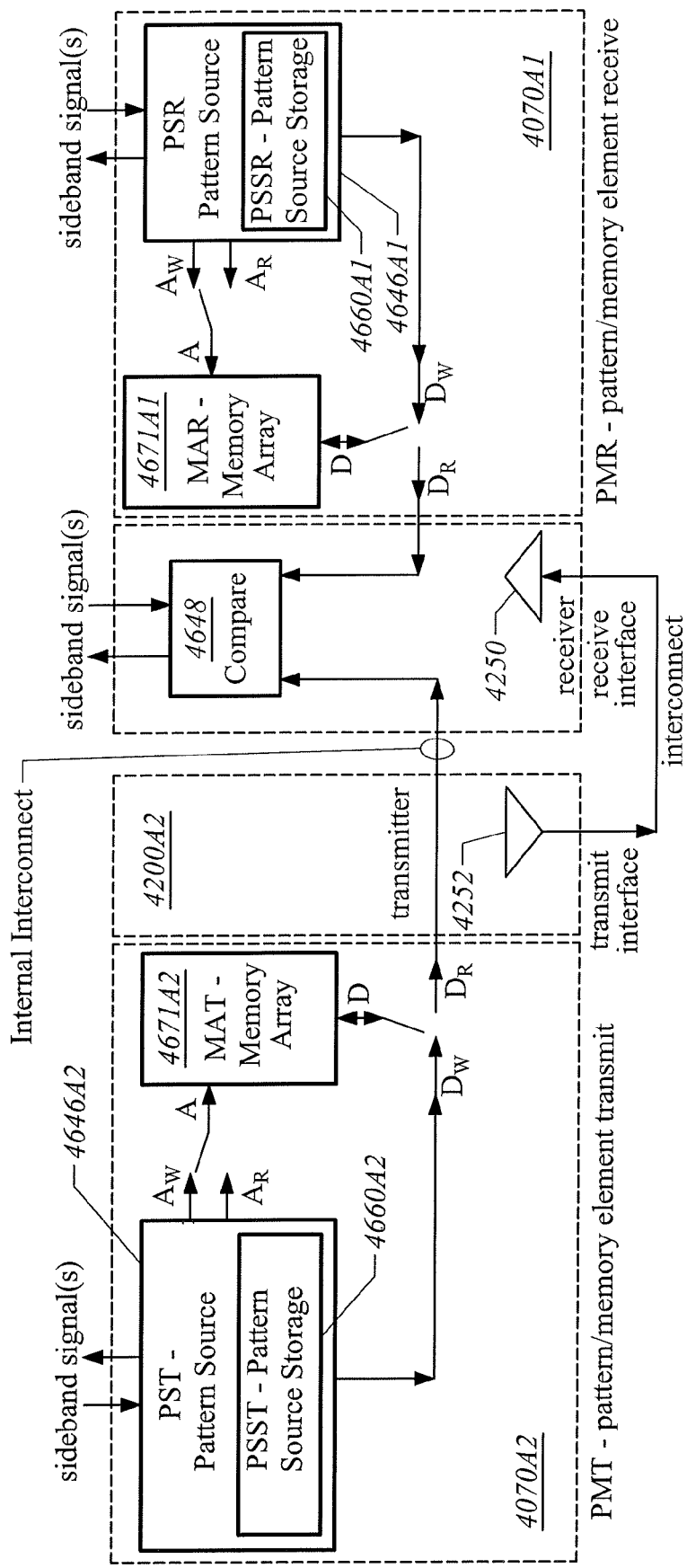
FIG. 46 is a block diagram of a transmit interface, a receive interface, and dedicated pattern generation and storage elements, according to one embodiment.
Figure 47A:
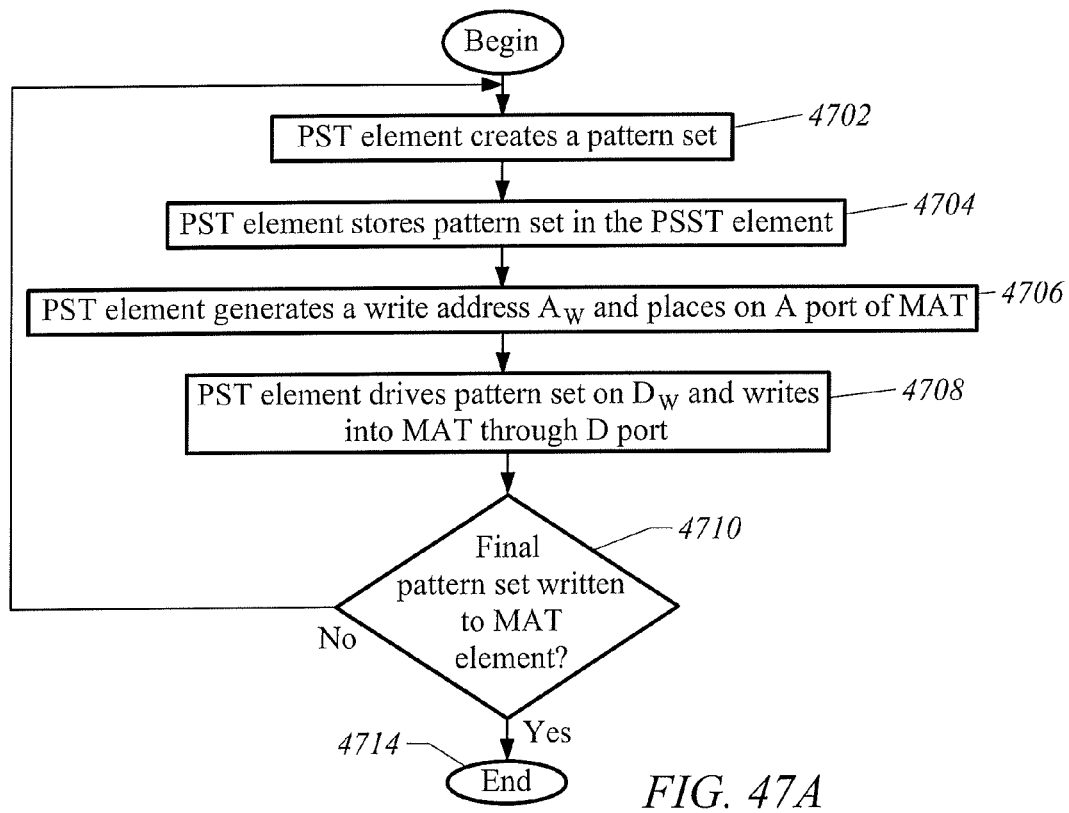
FIGS. 47A-C are flow diagrams of an embodiment of a pattern generation, storage and comparison process.
Figure 47B:
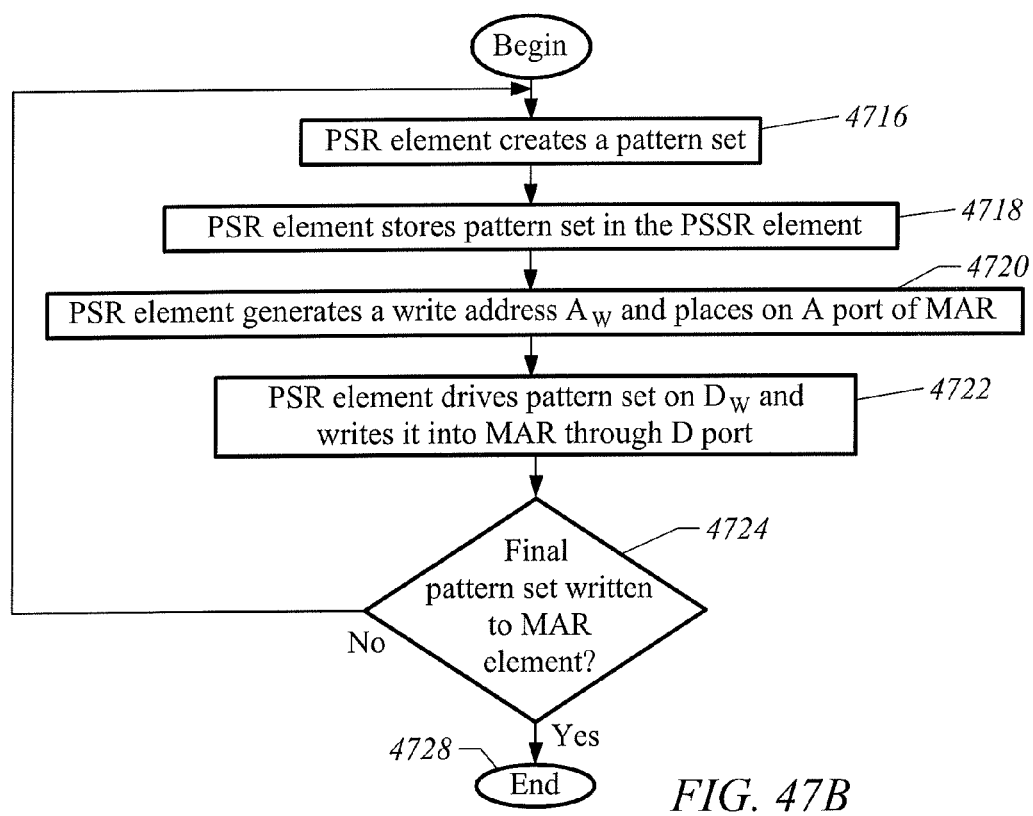
Figure 47C:
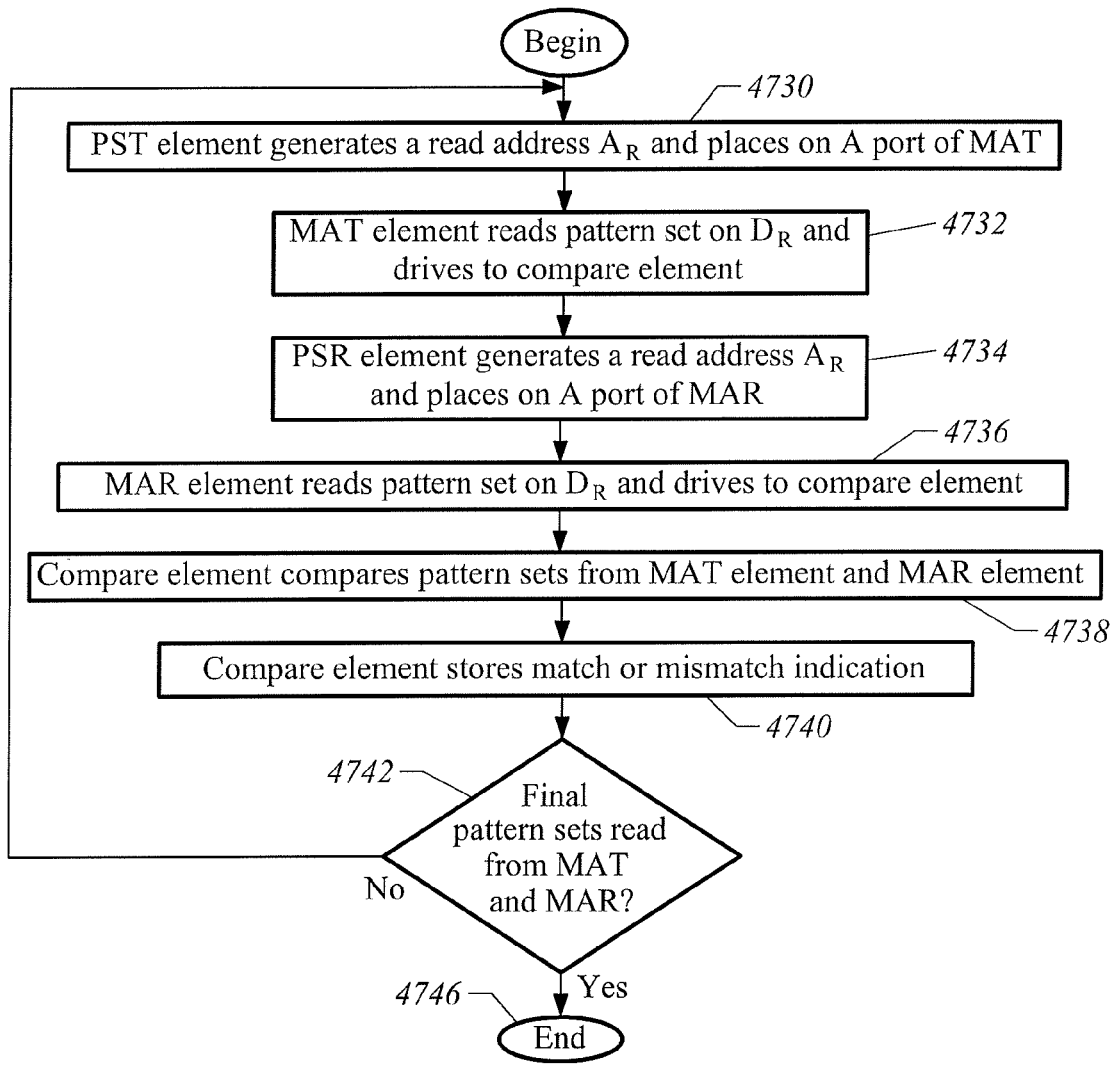

FIG. 46 is a block diagram of another embodiment of transmit and receive interfaces with dedicated memory arrays. Individual elements of FIG. 46 are analogous to similarly named and numbered elements of FIGS. 40, 42, and 44 and will not be described in detail. The embodiment of FIG. 46 uses a similar process for transmitting and receiving pattern sets to those previously described. FIGS. 47A-C are flow diagrams of a pattern generation, storage, and comparison process, described with further reference to FIG. 46. In the embodiment of FIGS. 46 and 47A-C, the transmit and receive interfaces are not tested, in contrast to the previous embodiments described. This embodiment demonstrates how the pattern generation circuitry that is used for testing the transmit and receive interfaces is used to test the memory arrays. This is useful, for example, when more patterns are needed for testing the memory arrays than are needed for testing the transmit and receive interfaces. By making the tests more specialized, the overall test time may be reduced.

Referring to FIGS. 46 and 47A-C, at logic block 4702, PST element 4646A2 creates a pattern set, and at logic block 4704, stores it in the PSST element 4660A2. At logic block 4706, the PST element 4646A2 generates a write address $A_W$ and places it on the A port of the MAT element 4671A2. At logic block 4708, the PST element 4646A2 drives a pattern set on $D_W$ and writes it to the D port of the MAT element 4671A2. At logic block 4710, it is determined whether the final pattern set was written to the MAT element 4671A2. If the final pattern set was not written, one or more logic blocks 4702-4710 are repeated. If the final pattern set was written, then writing to the MAT element 4671A2 is done at logic block 4714.

At logic block 4716 seen in FIG. 47B, the PSSR element 4646A1 creates a pattern set, and at logic block 4718, stores it in the PSSR element 4660A1. The PSR element 4660A1 generates a write address $A_W$ and places it on A the port of the MAR element 4671A1 at logic block 4720. At logic block 4722, the PSR element 4646A1 drives a pattern set on $D_W$ and writes it into the D port of the MAR element 4671A1. At logic block 4724, it is determined whether the final pattern set was written to the MAR element 4671A1. If the final pattern set was not written, one or more logic blocks 4714-4724 are repeated. If the final pattern set was written, then writing to the MAR element 4671A1 is done at logic block 4728.

Pattern generation and storage for the transmit side, as described at logic blocks 4702-4710, and pattern generation and storage for the receive side, as described at logic blocks 4714-4724, may be in the order as described. Alternatively, however, the actions specified are done in any order. For example, the receive side process may be done before the transmit process and vice versa, the receive side process and the transmit side process can be performed simultaneously, actions in each of the respective processes may be interleaved, etc.

At logic block 4730 shown in FIG. 47C, the PST element 4646A2 generates a read address $A_R$ and places it on the A port of the MAT element 4671A2. The MAT element 4671A2 reads the pattern set on $D_R$ and drives it to the compare element 4648 at logic block 4732. At logic block 4734, the PSR element 4646A1 generates a read address $A_R$ and places it on the A port of the MAR element 4671A1. The MAR element 4671A1 reads the pattern set on $D_R$ and drives it to the compare element 4648 at logic block 4736. At logic block 4738, the compare element 4648 compares pattern sets from the MAT element 4671A2 and the MAR element 4671A1. The compare element 4648 stores a match or mismatch indication at logic block 4740. At logic block 4742, it is determined whether the final pattern sets were read from the MAT element 4671A2 and the MAR element 4671A2. If the final pattern sets were not read, one or more logic blocks 4728-4742 are repeated. If the final pattern sets were read, then reading from the MAT element 4671A2 and the MAR element 4671A1 is done at logic block 4746.

The match/mismatch indication is used during test and characterization to indicate whether the patterns have been written to and read from the memory arrays correctly. The match/mismatch indication in the compare element may be accumulated from one pattern set to the next. Various embodiments of a component interface that eliminates the requirement of a high-speed test system have been described. The interface embodiments described may reside on one or multiple components. In various embodiments, a component may test itself. Components may also test each other using test circuitry in their respective interfaces. Respective interfaces may be coupled through an interconnect for the specific purpose of testing one another. Alternatively, interfaces that are couple to each other within a system for normal system operation, such as a memory component and a memory controller component, can test each other within the system through their usual interconnect. The embodiments described allow uniform, high-speed testing at the wafer stage, the component stage, and the system stage without an expensive high-speed testing system. The embodiments described are consistent with the use of various signaling methods and protocols, for example, single-ended signaling, differential signaling, voltage-mode operation, current-mode operation, and more. Other variations of the embodiments described are also possible, and are within the scope of the invention.

The invention claimed is:

1. A semiconductor component having at least two operational modes, a normal mode of operation and a test mode of operation in which the semiconductor component is configurable to perform test functions, the semiconductor component comprising:
   a transmitter;
   a receiver; and
   a test circuit, wherein in the test mode of operation at least one of the transmitter or receiver is configured to test at least one of a receiver or transmitter of another semiconductor component,
   wherein the semiconductor component and another semiconductor component are in an electronic system,
   wherein the semiconductor component comprises a memory controller interface on a memory controller component, and the another semiconductor component comprises a memory interface on a memory component,
   wherein the memory component and the memory controller component are coupled via an interconnect in the test mode of operation and in the normal mode of operation.

2. The semiconductor component of claim 1, wherein the semiconductor component is configured to operate at a frequency of at least 1 Gigahertz.

3. The semiconductor component of claim 1, wherein in the test mode of operation, the transmitter and the receiver are on different interfaces of a same semiconductor component.

4. The semiconductor component of claim 1, wherein the test circuit includes a pattern generator and a pattern compare circuit.

5. A semiconductor component having at least two operational modes, a normal mode of operation and a test mode of operation in which the semiconductor component is configurable to perform test functions, the semiconductor component comprising:
   a transmitter;
   a receiver; and
   a test circuit, wherein in the test mode of operation at least one of the transmitter or receiver is configured to test at least one of a receiver or transmitter of another semiconductor component;
   wherein the semiconductor component and another semiconductor component are in an electronic system,
   wherein the test circuit and the transmitter and receiver of the semiconductor component are on the same semiconductor wafer, and wherein the receiver or transmitter of the another semiconductor component is on a different semiconductor wafer.

6. A semiconductor component having at least two operational modes, a normal mode of operation and a test mode of operation in which the semiconductor component is configurable to perform test functions, the semiconductor component comprising:
   a transmitter;
   a receiver; and
   a test circuit, wherein in the test mode of operation at least one of the transmitter or receiver is configured to test at least one of a receiver or transmitter of another semiconductor component,
   wherein the semiconductor component and another semiconductor component are in an electronic system,
   wherein the system further includes a self test mode of operation wherein the transmitter is coupled to the receiver and the test circuit performs a test on at least one of the transmitter or receiver in the semiconductor component.

7. The semiconductor component of claim 6, wherein the transmitter is coupled to the receiver via an internal signal path of the semiconductor component.

8. A semiconductor component having at least two operational modes, a normal mode of operation and a test mode of operation in which the semiconductor component is configurable to perform test functions, the semiconductor component comprising:
   a transmitter;
   a receiver; and
   a test circuit, wherein in the test mode of operation at least one of the transmitter or receiver is configured to test at least one of a receiver or transmitter of another semiconductor component,
   wherein the semiconductor component and another semiconductor component are in an electronic system,
   wherein the transmitter of the semiconductor component is coupled to the receiver of the another semiconductor component via an external signal path.

9. A semiconductor component having at least two operational modes, a normal mode of operation and a test mode of operation in which the semiconductor component is configurable to perform test functions, the semiconductor component comprising:
  a transmitter;
  a receiver; and
  a test circuit, wherein in the test mode of operation at least one of the transmitter or receiver is configured to test at least one of a receiver or transmitter of another semiconductor component,
  wherein the semiconductor component and another semiconductor component are in an electronic system,
  wherein in the normal mode of operation:
    the transmitter transmits data to the another semiconductor component;
    the receiver receives data from the another semiconductor component; and
  wherein in the test mode of operation:
    the test circuit and at least one of the transmitter or receiver is configured to test at least one of the transmitter or receiver of the another semiconductor component.

10. The semiconductor component of claim 9, wherein the system further includes a self test mode, wherein the transmitter is coupled to the receiver by an internal signal path and the test circuit performs a test on at least one of the transmitter or receiver in the self test mode of operation.

11. The semiconductor component of claim 9, wherein in the test mode of operation, the transmitter in the semiconductor component is coupled to the receiver in the another component by an external signal path and the test circuit performs a test on the receiver, and wherein the external signal path is coupled to the semiconductor component and the another semiconductor component.

12. A method for testing at least one semiconductor component having a transmitter and receiver in an electronic system, using a semiconductor component having a transmitter, a receiver and a test circuit, the method comprising:
  in a normal mode operation,
    transmitting data, by the transmitter of the semiconductor component, to the receiver of the at least one semiconductor component;
    receiving data, by the receiver of the semiconductor component, from the transmitter of the at least one semiconductor component; and
  in a test mode of operation,
    using the test circuit and at least one of the transmitter or receiver of the semiconductor component to test at least one of the other of the transmitter or receiver of the at least one semiconductor component.

13. The method of claim 12, where in the test mode of operation further includes a self test mode of operation comprising:
  using the test circuit and at least one of the transmitter or receiver of the semiconductor component to test at least one of the transmitter or receiver of the semiconductor component.

14. The method of claim 12, wherein the test circuit and the transmitter and receiver of the semiconductor component are on the same semiconductor wafer and the receiver and transmitter of the at least one semiconductor component are on a different semiconductor wafer.

15. The method of claim 12, wherein the transmitter and the receiver of the at least one semiconductor component are on different interfaces of a same semiconductor component.

16. The method of claim 12, wherein the transmitter and the receiver of the at least one semiconductor component are on different semiconductor components.

17. The method of claim 12, where in the test mode of operation further includes a self test mode of operation comprising:
  coupling the transmitter to the receiver of the semiconductor component via an internal signal path in the self test mode of operation; and
  using the test circuit to perform a test on at least one of the transmitter or receiver in the self test mode of operation.

18. The method of claim 17, wherein using the test circuit comprises:
  coupling the test circuit and at least one of the receiver or transmitter of the semiconductor component via an external signal path to test the receiver or transmitter of the at least one semiconductor component.

19. The method of claim 12, wherein the external signal path is coupled to the semiconductor component and the at least one semiconductor component, and wherein the external signal path is also used to transfer data between the semiconductor component and the at least one semiconductor component in the normal mode of operation.

20. An electrical system comprising:
  a semiconductor component having a transmitter and receiver, the semiconductor having a normal mode of operation and test mode of operation; and
  means for testing at least one of a transmitter or receiver in another circuit component in the electrical system using one of the transmitter or receiver in the test mode of operation,
  wherein the test mode of operation further includes a self test mode of operation, the electrical system further comprising:
  means for testing at least one of the transmitter or receiver in the semiconductor component in the self test mode of operation.

* * * * *